US011195953B2

(12) United States Patent
Uchimura

(10) Patent No.: US 11,195,953 B2
(45) Date of Patent: Dec. 7, 2021

(54) SEMICONDUCTOR DEVICE AND METHOD FOR MANUFACTURING THE SAME

(71) Applicant: RENESAS ELECTRONICS CORPORATION, Tokyo (JP)

(72) Inventor: Katsuhiro Uchimura, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 148 days.

(21) Appl. No.: 16/572,116

(22) Filed: Sep. 16, 2019

(65) Prior Publication Data

US 2020/0111902 A1 Apr. 9, 2020

(30) Foreign Application Priority Data

Oct. 4, 2018 (JP) .............................. JP2018-189130

(51) Int. Cl.
| H01L 29/78 | (2006.01) |
| H01L 27/1157 | (2017.01) |
| H01L 27/092 | (2006.01) |
| H01L 29/66 | (2006.01) |
| H01L 29/792 | (2006.01) |

(52) U.S. Cl.
CPC ........ *H01L 29/785* (2013.01); *H01L 27/0924* (2013.01); *H01L 27/1157* (2013.01); *H01L 29/6681* (2013.01); *H01L 29/66833* (2013.01); *H01L 29/792* (2013.01)

(58) Field of Classification Search
CPC ............... H01L 29/785; H01L 27/0924; H01L 21/76229; H01L 21/823481
See application file for complete search history.

(56) References Cited

U.S. PATENT DOCUMENTS

| 8,361,894 B1* | 1/2013 | Hargrove | H01L 21/845 438/526 |
| 8,441,074 B2* | 5/2013 | Rachmady | H01L 29/785 257/365 |
| 8,461,008 B2* | 6/2013 | Cho | H01L 21/76224 438/296 |
| 8,476,137 B1* | 7/2013 | LiCausi | H01L 21/845 438/270 |
| 8,835,268 B2* | 9/2014 | Sudo | H01L 21/823431 438/300 |

(Continued)

FOREIGN PATENT DOCUMENTS

JP 2017-045860 A 3/2017

*Primary Examiner* — Victoria K. Hall
(74) *Attorney, Agent, or Firm* — McDermott Will & Emery LLP

(57) ABSTRACT

In a memory cell forming region including a dummy cell region, a plurality of fins which are parts of a semiconductor substrate, protrude from an upper surface of an element isolation portion and are formed adjacent to each other. A distance between a fin closest to a dummy fin among the plurality of fins and the dummy fin is shorter than a distance between two fins adjacent to each other. As a result, a position of an upper surface of the element isolation portion formed between two fins adjacent to each other and a position of an upper surface of the element isolation portion STI formed between the fin closest to the dummy fin and the dummy fin is lower than a position of an upper surface of the element isolation portion STI formed in a shunt region.

11 Claims, 44 Drawing Sheets

(56) References Cited

U.S. PATENT DOCUMENTS

| | | | |
|---|---|---|---|
| 8,866,206 B2* | 10/2014 | Sudo | H01L 29/785 257/295 |
| 9,035,425 B2* | 5/2015 | Tsao | H01L 29/7851 257/536 |
| 9,142,537 B2* | 9/2015 | Sudo | H01L 29/6681 |
| 9,184,087 B2* | 11/2015 | Chiang | H01L 29/0649 |
| 9,293,459 B1* | 3/2016 | Cheng | H01L 21/76224 |
| 9,312,363 B2* | 4/2016 | Liu | H01L 29/20 |
| 9,324,790 B2* | 4/2016 | Akarvardar | H01L 27/0886 |
| 9,418,994 B1* | 8/2016 | Chao | H01L 21/3081 |
| 9,455,198 B1* | 9/2016 | Yu | H01L 21/823431 |
| 9,530,654 B2* | 12/2016 | Licausi | H01L 29/66795 |
| 9,559,011 B2* | 1/2017 | Chiang | H01L 27/1211 |
| 9,564,486 B2* | 2/2017 | Akarvardar | H01L 29/785 |
| 9,660,028 B1* | 5/2017 | Cheng | H01L 21/30604 |
| 9,818,648 B2* | 11/2017 | Chao | H01L 21/823456 |
| 9,842,761 B2* | 12/2017 | Chiang | H01L 21/266 |
| 9,905,467 B2* | 2/2018 | Li | H01L 21/31116 |
| 10,002,765 B2* | 6/2018 | Huang | H01L 21/76224 |
| 10,043,814 B2 | 8/2018 | Yamashita | |
| 10,062,786 B2* | 8/2018 | Kim | H01L 21/823431 |
| 10,083,873 B1* | 9/2018 | Zhang | H01L 27/0886 |
| 10,109,531 B1* | 10/2018 | Hsu | H01L 21/76229 |
| 10,134,626 B2* | 11/2018 | Chiang | H01L 21/2636 |
| 10,276,720 B2* | 4/2019 | Chen | H01L 21/823431 |
| 10,312,149 B1* | 6/2019 | Chao | H01L 29/7848 |
| 10,312,150 B1* | 6/2019 | Al-Amoody | H01L 21/823437 |
| 10,340,193 B2* | 7/2019 | Yeh | H01L 21/3065 |
| 10,529,801 B2* | 1/2020 | Sun | H01L 21/823481 |
| 10,622,245 B2* | 4/2020 | Hsieh | H01L 29/7853 |
| 10,832,965 B2* | 11/2020 | Xu | H01L 29/161 |
| 10,964,782 B2* | 3/2021 | Sun | H01L 21/76224 |
| 10,998,235 B2* | 5/2021 | Li | H01L 27/0886 |
| 2004/0113174 A1* | 6/2004 | Chidambarrao | H01L 21/823878 257/200 |
| 2007/0272971 A1* | 11/2007 | Lee | H01L 27/11568 257/321 |
| 2007/0278595 A1* | 12/2007 | Wu | H01L 29/66795 257/384 |
| 2008/0265338 A1* | 10/2008 | Yu | H01L 29/7851 257/397 |
| 2009/0321834 A1* | 12/2009 | Rachmady | H01L 21/76232 257/365 |
| 2010/0163971 A1* | 7/2010 | Hung | H01L 29/1083 257/327 |
| 2010/0276756 A1* | 11/2010 | Rachmady | H01L 21/76232 257/365 |
| 2011/0147848 A1* | 6/2011 | Kuhn | H01L 21/823431 257/368 |
| 2012/0032267 A1* | 2/2012 | Cheng | H01L 21/76237 257/368 |
| 2013/0037871 A1* | 2/2013 | Sudo | H01L 21/762 257/295 |
| 2013/0045580 A1* | 2/2013 | Cho | H01L 21/76224 438/296 |
| 2013/0273710 A1* | 10/2013 | Rachmady | H01L 21/76 438/400 |
| 2014/0110786 A1* | 4/2014 | Kim | H01L 29/4236 257/365 |
| 2014/0239404 A1* | 8/2014 | Huang | H01L 27/0924 257/369 |
| 2014/0284723 A1* | 9/2014 | Lee | H01L 21/823821 257/369 |
| 2014/0306317 A1* | 10/2014 | Licausi | H01L 21/823431 257/506 |
| 2014/0327074 A1* | 11/2014 | Tsao | H01L 29/7816 257/337 |
| 2014/0346612 A1* | 11/2014 | Adam | H01L 29/6653 257/397 |
| 2014/0374829 A1* | 12/2014 | Sudo | H01L 21/02334 257/347 |
| 2015/0137308 A1* | 5/2015 | Akarvardar | H01L 21/76229 257/506 |
| 2015/0145068 A1* | 5/2015 | Chen | H01L 21/823431 257/401 |
| 2015/0187634 A1* | 7/2015 | Chiang | H01L 29/66795 257/401 |
| 2015/0206759 A1* | 7/2015 | Tsao | H01L 29/0657 257/506 |
| 2015/0263113 A1* | 9/2015 | Kim | H01L 27/10823 257/296 |
| 2015/0303116 A1* | 10/2015 | Chiang | H01L 27/0924 438/283 |
| 2015/0311201 A1* | 10/2015 | Ju | H01L 21/31111 257/401 |
| 2015/0340272 A1* | 11/2015 | Chen | H01L 29/0653 257/401 |
| 2015/0372080 A1* | 12/2015 | Akarvardar | H01L 27/0886 257/369 |
| 2015/0380316 A1* | 12/2015 | Yu | H01L 21/30604 257/506 |
| 2016/0043003 A1* | 2/2016 | Chiang | H01L 21/823481 438/400 |
| 2016/0071932 A1* | 3/2016 | Sung | H01L 21/76224 257/369 |
| 2016/0111420 A1* | 4/2016 | Zhang | H01L 21/31116 257/392 |
| 2016/0141205 A1* | 5/2016 | Chiang | H01L 21/28017 438/424 |
| 2016/0211138 A1* | 7/2016 | Huang | H01L 21/30604 |
| 2016/0315082 A1* | 10/2016 | Huang | H01L 29/66795 |
| 2016/0315146 A1* | 10/2016 | Jung | H01L 27/0886 |
| 2016/0365453 A1* | 12/2016 | Kim | H01L 21/823431 |
| 2017/0069539 A1* | 3/2017 | Li | H01L 21/823431 |
| 2017/0092643 A1* | 3/2017 | Tseng | H01L 21/3081 |
| 2017/0140980 A1* | 5/2017 | Chiang | H01L 21/2636 |
| 2017/0148797 A1* | 5/2017 | Kim | H01L 27/1104 |
| 2017/0213823 A1* | 7/2017 | Cha | H01L 29/0649 |
| 2017/0221890 A1* | 8/2017 | Wang | H01L 21/823418 |
| 2017/0256555 A1* | 9/2017 | Hamaguchi | H01L 27/11521 |
| 2017/0294356 A1* | 10/2017 | Yeh | H01L 21/31144 |
| 2017/0317084 A1* | 11/2017 | Cantoro | H01L 27/0924 |
| 2018/0033626 A1* | 2/2018 | Liao | H01L 29/66803 |
| 2018/0033740 A1* | 2/2018 | Kuan | H01L 29/7851 |
| 2018/0102278 A1* | 4/2018 | Chiang | H01L 21/2636 |
| 2018/0151414 A1* | 5/2018 | Wu | H01L 29/785 |
| 2018/0190652 A1* | 7/2018 | Ching | H01L 29/785 |
| 2018/0337101 A1* | 11/2018 | Zhou | H01L 21/76224 |
| 2019/0088551 A1* | 3/2019 | Kim | H01L 21/823431 |
| 2019/0096993 A1* | 3/2019 | Sun | H01L 21/823431 |
| 2019/0097056 A1* | 3/2019 | Kuo | H01L 27/1211 |
| 2019/0103304 A1* | 4/2019 | Lin | H01L 21/823821 |
| 2019/0139771 A1* | 5/2019 | Kang | H01L 29/7854 |
| 2019/0148520 A1* | 5/2019 | Chang | H01L 29/7848 257/192 |
| 2019/0378752 A1* | 12/2019 | Hsieh | H01L 29/7853 |
| 2019/0393303 A1* | 12/2019 | Choi | H01L 21/02222 |
| 2020/0006557 A1* | 1/2020 | Ko | H01L 29/0847 |
| 2020/0020540 A1* | 1/2020 | Cheng | H01L 21/0337 |
| 2020/0066600 A1* | 2/2020 | Ok | H01L 21/823821 |
| 2020/0083220 A1* | 3/2020 | Park | H01L 21/823437 |
| 2020/0135574 A1* | 4/2020 | Yang | H01L 21/76224 |
| 2020/0194313 A1* | 6/2020 | Liu | H01L 21/31053 |
| 2020/0411681 A1* | 12/2020 | Su | H01L 21/762 |
| 2021/0057286 A1* | 2/2021 | Geng | H01L 21/823431 |

* cited by examiner

FIG. 07

| APPLIED VOLTAGE OPERATION | Vd | Vcg | Vmg | Vs | Vb |
|---|---|---|---|---|---|
| WRITE | Vcc | 0.5V | 10V | 5V | 0V |
| ERASE | 0V | 0V | -5V | 5V | 0V |
| READ | Vcc | Vcc | 0V | 0V | 0V |

Vcc = 1.5V

SEMICONDUCTOR DEVICE AND METHOD FOR MANUFACTURING THE SAME

CROSS-REFERENCE TO RELATED APPLICATIONS

The disclosure of Japanese Patent Application No. 2018-189130 filed on Oct. 4, 2018 including the specification, drawings and abstract is incorporated herein by reference in its entirety.

BACKGROUND

The present invention relates to a semiconductor device and method for manufacturing the same, and more particularly, the present invention relates to a technique useful for a semiconductor device including a fin-type transistor.

A fin-structured transistor is known as a field effect transistor capable of increasing an operation speed, reducing a leakage current and power consumption, and miniaturizing a semiconductor element. The fin-structured transistor (Fin-FET: Fin Field Effect Transistor) is, for example, a semiconductor device having a semiconductor layer protruding above a semiconductor substrate as a channel region and having gate electrode formed so as to straddle the semiconductor layer.

Flash memory or EEPROM (Electrically Erasable and Programmable Read Only Memory) is widely used as a nonvolatile memory cell which can be electrically programmed and erased. These nonvolatile memory cells have a trapping insulating film surrounded by an oxide film under the gate electrode of the MISFET (Metal Insulator Semiconductor Field Effect Transistor), and the charge storage state of the trapping insulating film are used as storage information, and the storage information is read out as a threshold of the transistor. The trapping insulating film refers to an insulating film capable of storing charges, and as an example, a silicon nitride film or the like can be given. By shifting the threshold of the MISFET by injecting charges into the trapping insulating film or discharging charges from the trapping insulating film, this MISFET can be used as a nonvolatile memory cell. The nonvolatile memory cell using the silicon nitride film as described above is also referred to as a MONOS (Metal Oxide Nitride Oxide Semiconductor) type transistor. In addition, a split-gate type memory cell in which a MONOS transistor is used as a memory transistor and a control transistor is further added is widely used.

Japanese unexamined Patent Application publication No. 2017/45860 discloses a technique for forming a split-gate type memory cell including a MONOS type transistor in a fin structure.

SUMMARY

In the case of forming a fin-structured transistor, a plurality of fins are formed in a semiconductor chip, and an element isolation portion formed of an insulating film such as a silicon oxide film is formed between the fins adjacent to each other. One of the factors determining the channel width of the fin-structured transistor is the height of the upper portion of the fin protruding from the upper surface of the element isolation portion. Therefore, if there is a variation in the position of the upper surface of the element isolation portion in the semiconductor chip, the drain current of the transistor formed in each of the fins of the semiconductor chip varies, and the reliability of the semiconductor device having the fin-structured transistors decreases.

Other objects and novel features will be apparent from the description of the specification and the accompanying drawings.

The typical ones of the embodiments disclosed in the present application will be briefly described as follows.

A semiconductor device according to the embodiments includes an element isolation portion formed on an upper surface of a semiconductor substrate, and a plurality of fins which are a part of the semiconductor substrate, protrude from the upper surface of the element isolation portion, extend in a first direction in plan view, and are formed so as to be adjacent to each other in a second direction intersecting with the first direction. Here, the plurality of fins includes a first fin, a second fin adjacent to the first fin, a third fin adjacent to the second fin, and a fourth fin adjacent to the third fin, and a distance between the first fin and the second fin is shorter than a distance between the third fin and the fourth fin, and is longer than a distance between the second fin and the third fin. A position of the upper surface of the element isolation portion formed between the first fin and the second fin and a position of the upper surface of the element isolation portion formed between the second fin and the third fin are lower than a position of the upper surface of the element isolation portion formed between the third fin and the fourth fin.

According to the embodiments, the reliability of the semiconductor device can be improved.

BRIEF DESCRIPTION OF THE DRAWINGS

FIG. 7 is a table showing an example of a condition for applying a voltage to each portion of the selected memory cell at the time of "write", "erase" and "read".

DETAILED DESCRIPTION

Figure 1:
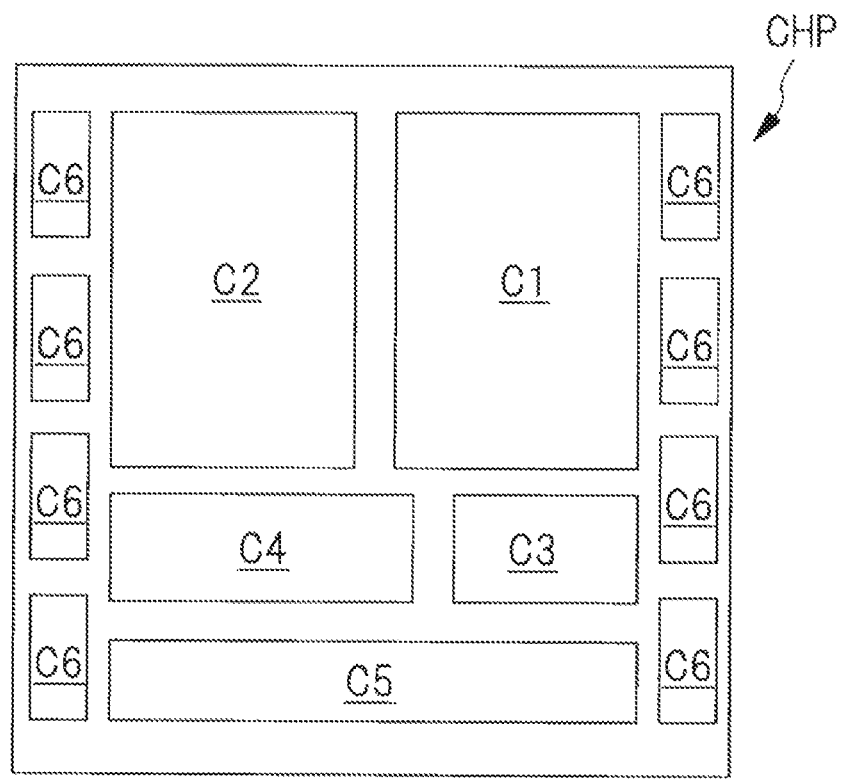
FIG. 1 is a schematic diagram showing a layout configuration of a semiconductor chip, which is a semiconductor device according to first embodiment.

In the following embodiments, when required for convenience, the description will be divided into a plurality of sections or embodiments, but except when specifically stated, these sections are not independent of each other, and one is related to the modification, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail based on the drawings. In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In the drawings used in the embodiments, hatching may be omitted in order to make the drawings easier to see.

First Embodiment

Referring to the drawings, a semiconductor device having a nonvolatile memory cell according to a present embodiment will be described. First, a layout configuration of the semiconductor device in which a system including the nonvolatile memory cell is formed will be described. FIG. 1 is a schematic diagram showing the layout configuration of a semiconductor chip CHP, which is a semiconductor device according to the present embodiment. In FIG. 1, the semiconductor chip CHP is provided with a plurality of circuit blocks used for different applications. Specifically, the semiconductor chip CHP includes a flash memory circuit block C1, an EEPROM circuit block C2, a CPU (Central Processing Unit) circuit block C3, a RAM (Random Access Memory) circuit block C4, an analogue circuit block C5, and I/O (Input/Output) circuit blocks C6.

The flash memory circuit block C1 and the EEPROM circuit block C2 include, as semiconductor elements, nonvolatile memory cells in which stored data can be electrically rewritten, and are regions in which, for example, MONOS transistors are formed. The flash memory circuit block C1 and the EEPROM circuit block C2 are used in different applications.

For example, the data used in the CPU circuit block C3 described below is not required to have a high reading speed, but is required to have a rewrite durability because of a high rewrite frequency. Thus, the nonvolatile memory cells of the flash memory circuit block C1 are used for storing data. Further, the program for operating the CPU circuit block C3 is required to have a high reading speed although the rewrite frequency is low. The nonvolatile memory cells of the EEPROM circuit blocks C2 are used for storing such programs.

The CPU circuit block C3 has logic circuits that drive at voltages as high as 1.5 V, and as a semiconductor device is a region in which a low-voltage, fast-acting low withstand voltage MISFET is formed.

The RAM circuit block C4 has a SRAM (Static RAM) and is a region in which low withstand voltage MISFETs having substantially the same structures as those of the CPU circuit block C2 are formed as semiconductor elements.

Analog circuit block C5 includes analog circuits and is a region in which high withstand voltage MISFETs which are more resistant to voltage than low withstand voltage MISFETs and are driven at 6 V voltages, capacitive elements, resistive elements and bipolar transistors are formed as semiconductor elements.

The I/O circuit blocks C6 have input/output circuits, and are regions in which high withstand voltage MISFETs substantially the same as those of the analogue circuit block C5 are formed as semiconductor elements.

Structure of Semiconductor Device

Figure 2:
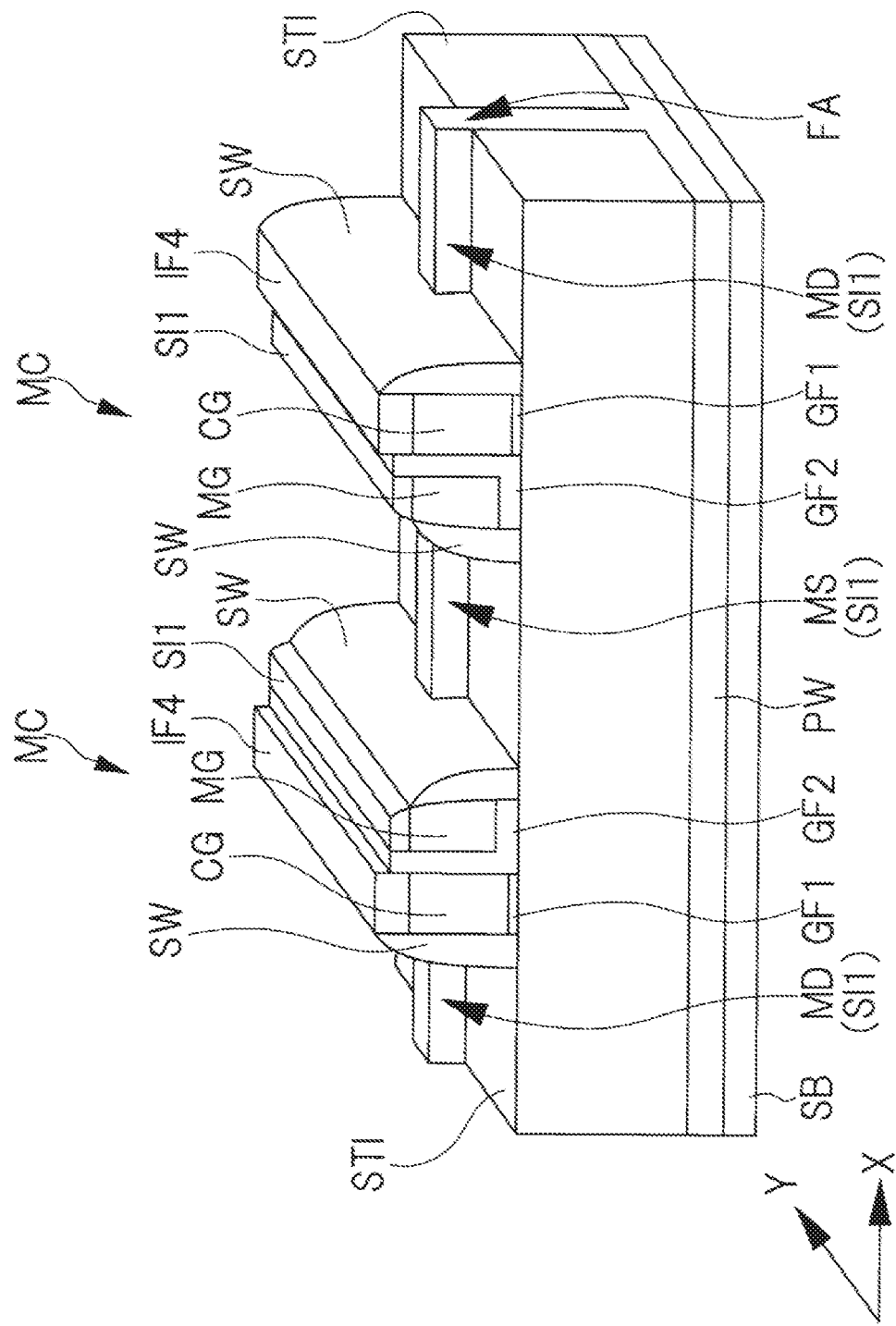
FIG. 2 is a perspective view showing the semiconductor device according to the first embodiment.
Figure 3:
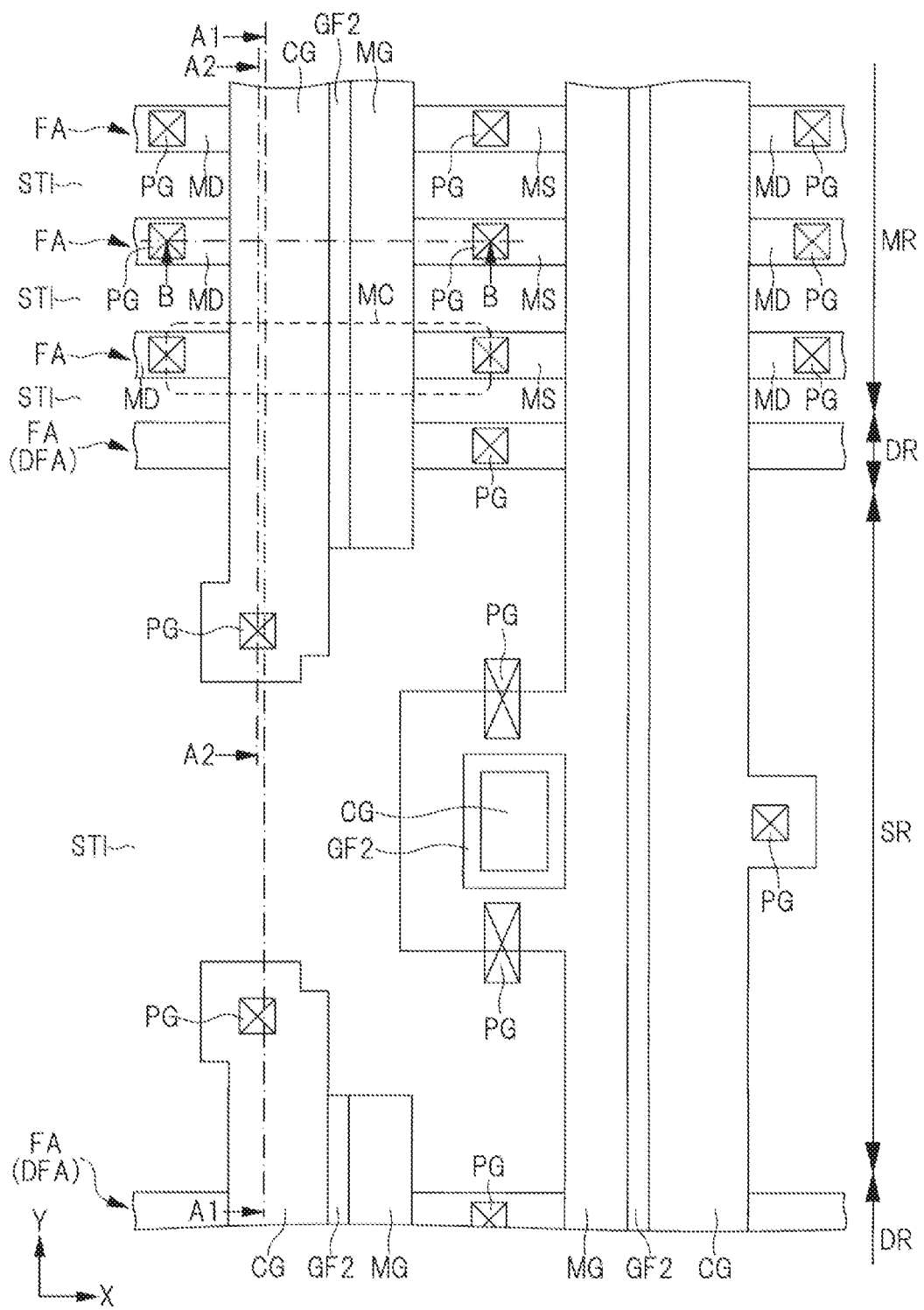
FIG. 3 is a plan view showing the semiconductor device according to the first embodiment.
Figure 4:
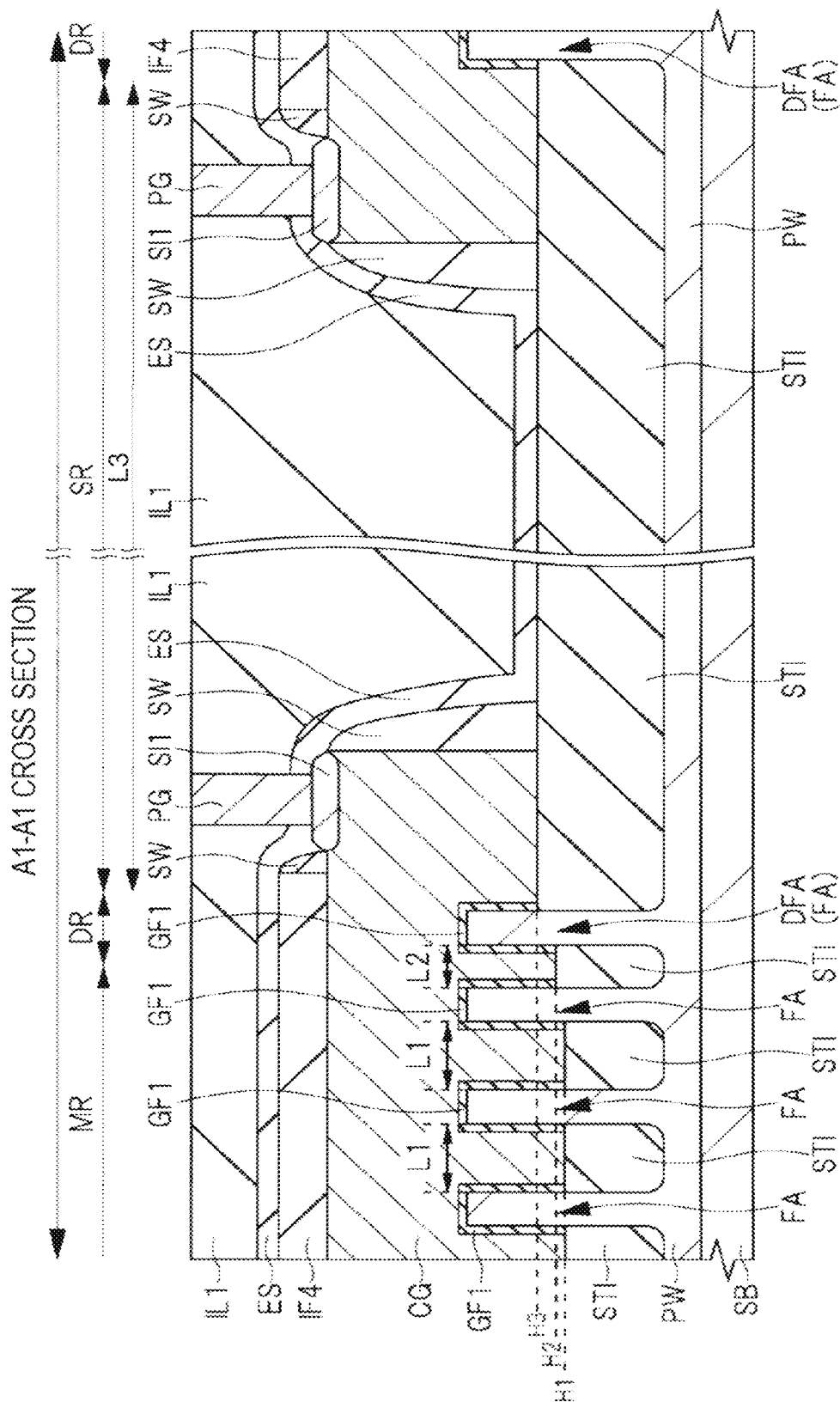
FIG. 4 is a cross-sectional view showing the semiconductor device according to the first embodiment.
Figure 5:
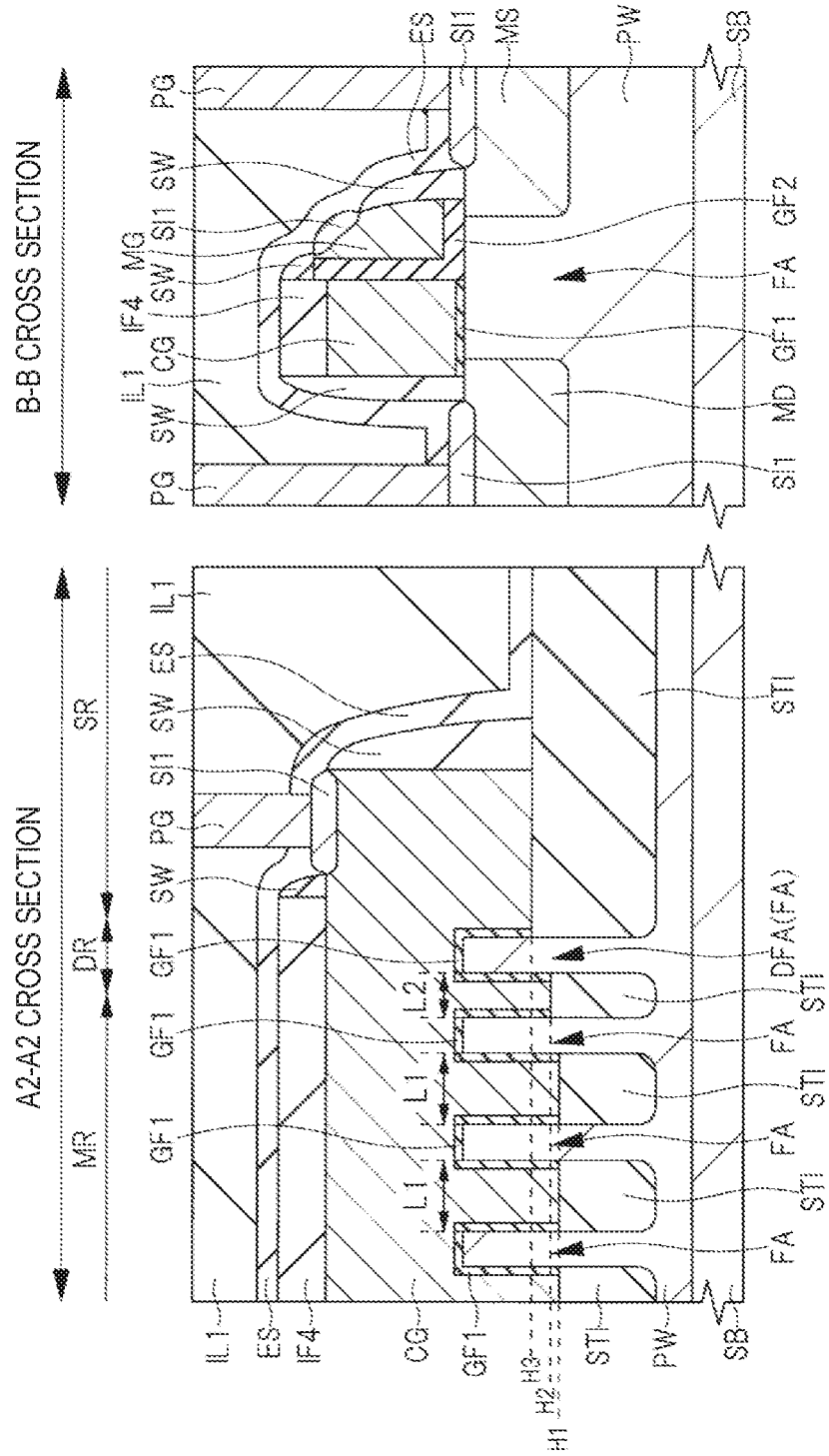
FIG. 5 is a cross-sectional view showing the semiconductor device according to the first embodiment.

Hereinafter, a structure of semiconductor device according to the present embodiment will be described with reference to FIGS. 2 to 5. FIG. 2 is a perspective view of a memory cell MC, which is a nonvolatile memory cell used in the flash memory circuit block C1 and the EEPROM circuit block C2. FIG. 3 shows a plan view of the memory cell MC. FIG. 3 shows a memory cell forming region MR in which a memory cell MC is formed, a shunt region SR for supplying a potential to a gate electrode included in the memory cell MC, and a dummy cell region DR located between the memory cell forming region MR and the shunt region SR. FIG. 4 shows a cross-sectional view corresponding to the A1-A1 line of FIG. 3. FIG. 5 shows a cross-sectional view corresponding to the A2-A2 line and the B-B line of FIG. 3.

The dummy cell region DR is a part of the memory cell forming region MR and is a region at the outermost end of the memory cell forming region MR. In present embodiment, for convenience, the memory cell forming region MR and the dummy cell region DR are distinguished from each other. Therefore, the dummy cell region DR is a boundary region located between the memory cell forming region MR and the shunt region SR.

Although the dummy cell region DR is formed with substantially the same elements as the memory cell MC, such elements are dummy elements that do not actually contribute to the circuit operation in the flash memory circuit block C1 and the EEPROM circuit block C2. Therefore, the structure of the memory cell MC formed on the fin FA of the memory cell forming region MR will be mainly described below, but the description of the dummy element formed on the dummy fin DFA of the dummy cell region DR will be omitted.

The shunt region SR is a region for supplying potentials to control gate electrodes CG and memory gate electrodes MG, and is a region between two dummy fins DFA. In the drawing, a distance between two dummy fins DFA is shown as distance L3.

As shown in FIGS. 2 to 5, in the memory cell forming region MR, a plurality of fins FA extending in a X direction are arranged at equal intervals in a Y direction. The plurality of fins FA also include dummy fins DFA in the dummy cell region DR. The X direction and the Y direction are directions along the main surface of the semiconductor substrate SB, and are directions in plan view. The X direction is orthogonal to the Y direction. That is, the X direction is the long side direction of the fin FA, and the Y direction is the short side direction of the fin FA. The fins FA are a part of the semiconductor substrate SB, and are protruding portions selectively protruding from the upper surface of the semiconductor substrate SB.

An element isolation portion STI is formed on the semiconductor substrate SB between the fins FA adjacent to each other. A position of the upper surface of the element isolation portion STI is lower than a position of the upper surface of the fin FA. In other words, a part of the fin FA protrudes from the element isolation portion STI. In present embodiment, the fin FA located at a position higher than the upper surface of the element isolation portion STI may be referred to as an upper portion of the fin FA, and the fin FA located at a position lower than the upper surface of the element isolation portion STI may be referred to as a lower portion of the fin FA.

In addition, in the respective regions, the upper surface of the element isolation portion STI is not constant flat and may vary, and for example, between two fins FA, the upper surface of the element isolation portion STI may become slightly higher as the fins FA are approached. In present embodiment, "the position of the upper surface of the element isolation portion STI" is defined as follows in order to clarify the explanation of the position of the upper surface of the element isolation portion STI including the variation.

In present embodiment, "the position of the upper surface of the element isolation portion STI" is the lowest portion of the upper surface of the element isolation portion STI formed between the two fins FA. In the shunt region SR, "the position of the upper surface of the element isolation portion STI" is set to the lowest position among the upper surface of the element isolation portion STI located directly below the control gate electrode CG or the upper surface of the element isolation portion STI where the control gate electrode CG is to be formed. In the shunt region SR, "the position of the upper surface of the element isolation portion STI" may be the lowest portion of the upper surface of the element isolation portion STI located directly below the memory gate electrode MG or the upper surface of the element isolation portion STI where the memory gate electrode MG is to be formed.

The upper portion of the fin FA is mainly an active region for forming the memory cell MC. That is, in the semiconductor substrate SB, a region partitioned by the element isolation portion STI is an active region.

In the cross-sectional view in the Y direction, the fin FA does not necessarily have to be a rectangular parallelepiped, and the corners of the rectangle may be rounded. The side surface of the fin FA may be perpendicular to the main surface of the semiconductor substrate SB, or may have inclined angles close to perpendicular. That is, the upper portion of the fin FA is shaped to have a top portion which is the highest position of the fin FA, and a side portion which is positioned intermediate the top portion of the fin FA and the upper surface of the element isolation portion STI. In the present embodiment explanation, when expressed as the upper surface of the fin FA, it means the surface around the top portion, and when expressed as the side surface of the fin FA, it means the surface around the side portion.

A plurality of control gate electrodes CG and a plurality of memory gate electrodes MG are arranged on the upper surfaces and the side surfaces of the plurality of fins FA. The plurality of control gate electrodes CG and the plurality of memory gate electrodes MG extend in the Y direction via gate dielectric films GF1 and gate dielectric films GF2, respectively, so as to straddle the upper portions of the plurality of fins FA and also to be positioned on the element isolation portions STI in the shunt region SR.

In the X direction, an n-type diffusion region (impurity region) MD, which is a drain region, is formed in the fin FA on the side of the control gate electrode CG, and an n-type diffusion region (impurity region) MS, which is a source region, is formed in the fin FA on the side of the memory gate electrode MG. The diffusion region MD and the diffusion region MS are formed so as to sandwich a portion of the fin FA covered with the control gate electrode CG and the memory gate electrode MG in the X direction. That is, in the X direction, one control gate electrode CG and one memory gate electrode MG are located between the diffusion region MS and the diffusion region MD.

The diffusion region MD is formed between two control gate electrodes CG adjacent to each other in the X direction, and the diffusion region MS is formed between two memory gate electrodes MG adjacent to each other in the X direction. As described above, the two memory cells MC adjacent in the X direction share the diffusion region MD or the diffusion region MS. Two memory cells MC sharing the diffusion region MD have line symmetry in the X direction with the diffusion region MD as an axis, and two memory cells MC sharing the diffusion region MS have line symmetry in the X direction with the diffusion region MS as an axis.

An interlayer insulating film IL1 is formed on each of the memory cells MC, and plugs PG are formed in the interlayer insulating film IL1. In the memory cell forming region MR, the diffusion region MD and the diffusion region MS are electrically connected to the bit line and the source line, respectively, via the plugs PG. In the shunt region SR, the control gate electrode CG and the memory gate electrode MG are electrically connected to the wirings which supply the respective potentials via the plugs PG.

Hereinafter, the cross-sectional structure of the semiconductor device of the present embodiment will be described in detail with reference to FIGS. 4 and 5.

A well region PW, which is a p-type impurity region, is formed in the semiconductor substrate SB including the fins FA. Here, the entire fin FA includes the well region PW.

A control gate electrode CG is formed on the upper surface of the fin FA via the gate dielectric film GF1 and a memory gate electrode MG is formed on the upper surface of the fin FA via the gate dielectric film GF2 in the upper portion of the fin FA protruding from the element isolation portion STI. In the X direction, the gate dielectric film GF2 is interposed between the control gate electrode CG and the memory gate electrode MG, and the control gate electrode CG and the memory gate electrode MG are electrically separated by the gate dielectric film GF2. The gate dielectric film GF2 is continuously formed so as to cover one side surface and the bottom surface of the memory gate electrode MG.

The gate dielectric film GF1 is an insulating film such as a silicon oxide film. The gate dielectric film GF2 has a charge storage layer capable of storing charges. The charge storage layer is a trapping insulating film, for example, a silicon nitride film. Specifically, the gate dielectric film GF2 is a stacked film formed of a first silicon oxide film, a charge storage layer formed on the first silicon oxide film, and a second silicon oxide film formed on the charge storage layer. The control gate electrode CG and the memory gate electrode MG are conductor films such as an n-type polycrystalline silicon film, for example.

As shown in the A1-A1 cross-section and the A2-A2 cross-section, the upper portion of each of the fins FA is covered with the control gate electrode CG via the gate dielectric film GF1, and constitute the channel region of the control transistor. Though not shown, the upper portion of each of the fins FA adjacent to the control gate electrode CG in the X direction is covered with the memory gate electrode MG via the gate dielectric film GF2, and constitute the channel regions of the memory transistor.

The side surface of the memory gate electrode MG on the source region side of the memory cell MC and the side surface of the control gate electrode CG on the drain region side of the memory cell MC are covered with sidewall spacers SW. The sidewall spacer SW is formed of, for example, a single-layer insulating film formed of a silicon nitride film or a stacked insulating film in which a silicon nitride film is formed on a silicon oxide film.

An n-type diffusion region MD as a drain region is formed in the fin FA on the control gate electrode CG side, and an n-type diffusion region MS as a source region is formed in the fin FA on the memory gate electrode MG side. In the dummy fin DFA, the diffusion region MD and the diffusion region MS may not be formed.

Silicide layers SI1 are formed on the diffusion region MD and the diffusion region MS in order to reduce the contact resistance with plugs PG. The silicide layers SI1 are made of, for example, nickel silicide (NiSi), nickel platinum silicide (NiPtSi), or cobalt silicide ($CoSi_2$).

The silicide layers SI1 are also formed on the memory gate electrodes MG. An insulating film IF4 such as a silicon nitride film is formed on the control gate electrode CG, but a part of the insulating film IF4 is removed in the shunt region SR to expose a part of the control gate electrode CG. The silicide layers SI1 are formed on the exposed control gate electrodes CG.

An etching stopper film ES formed of an insulating film such as a silicon nitride film is formed so as to cover the memory cells MC formed on the fins FA and the element isolation portions STI. An interlayer insulating film IL1 formed of, for example, a silicon oxide film is formed on the etching stopper film ES.

Contact holes are formed in the interlayer insulating film IL1 and the etching stopper film ES, and plugs PG are formed in the contact holes. The plug PG is formed of, for example, a barrier metal film formed of a titanium film, a titanium nitride film, or a stacked film thereof, and a conductor film such as a tungsten film.

As shown in FIGS. 3 to 5, the plug PG connected to the bit line is formed on the fin FA in the memory cell forming region MR, but is not formed on the dummy fin DFA in the dummy cell region DR. In some cases, the plug PG electrically connected to the source line is formed on the dummy fin DFA, but it is not essential to connect the dummy fin DFA to the source line, and such a plug PG may not be formed. Therefore, a dummy element having substantially the same structure as the memory cell MC is formed on the dummy fin DFA, but this dummy element does not function as the memory cell MC.

In the dummy cell region DR and the memory cell forming region MR, although the plugs PG are not formed on the control gate electrodes CG and the memory gate electrodes MG, the plugs PG are formed on the control gate electrodes CG and the memory gate electrodes MG in the shunt region SR.

In the memory cell forming region MR, the gate length of each of the control gate electrodes CG and the memory gate electrodes MG is shortened with the miniaturization of the memory cell MC. Therefore, when the plugs PG are formed on the control gate electrodes CG and the memory gate electrodes MG in the memory cell forming region MR, misalignment of the plugs PG tends to occur, and therefore, for example, the memory gate electrode MG and the fin FA may be short-circuited. Therefore, the plugs PG connected to the control gate electrodes CG and the memory gate electrodes MG are preferable formed in a region where the memory cell MC is not formed.

That is, the shunt region SR is mainly a power supply region for the control gate electrode CG and the memory gate electrode MG, and the shunt region SR is a region where the fins FA protruding from the upper surface of the element isolation portion STI are not formed. Therefore, in the shunt region SR, the control gate electrodes CG and the memory gate electrodes MG are formed on the element isolation portion STI.

Operation of Nonvolatile Memory

Next, an operation example of the nonvolatile memory will be described with reference to FIGS. 6 and 7.

Figure 6:
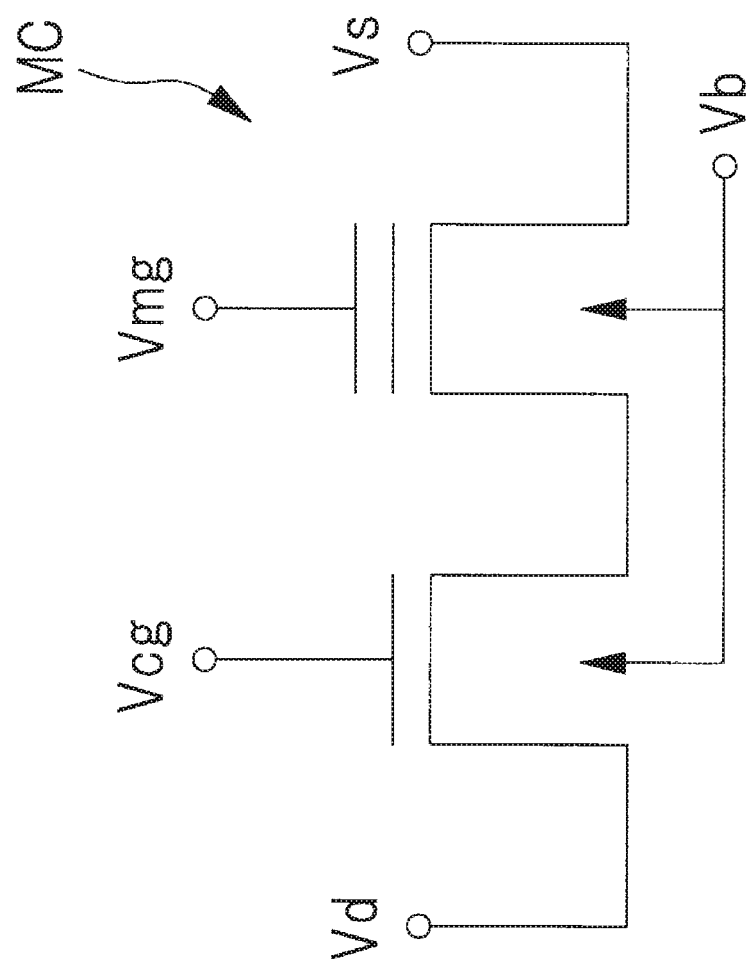
FIG. 6 is an equivalent circuit diagram of a memory cell.

FIG. 6 is an equivalent circuit diagram of the memory cell MC of the nonvolatile memory. FIG. 7 is a table showing an example of a condition for applying a voltage to each portion of the selected memory cell MC at the time of "write", "erase" and "read". In the table of FIG. 7, a voltage Vmg to be applied to the memory gate electrode MG, a voltage Vs to be applied to the diffusion region MS as the source region, a voltage Vcg to be applied to the control gate electrode CG, a voltage Vd to be applied to the diffusion region MD as the drain region, and a voltage Vb to be applied to the well region PW shown in FIG. 6 are described, respectively, during "write", "erase", and "read" operations.

Note that what is shown in the table of FIG. 7 is a suitable example of a voltage application condition, and is not limited to this, and various changes can be made as necessary. In the present embodiment, the injection of electrons into the charge storage layer in the gate dielectric film GF2 under the memory gate electrodes MG is defined as "write", and the injection of holes into the charge storage layer is defined as "erase".

As the write method, a source side injection (SSI: Source Side Injection) method can be used. For example, voltages as shown in the column of "write" in FIG. 7 are applied to the respective portions of the selected memory cell MC to be written, and electrons are injected into the charge storage layer of the selected memory cell MC to perform write.

At this time, hot electrons are generated in the portion (channel region) of the fin FA covered with the memory gate electrode MG and the control gate electrode CG, and hot electrons are injected into the charge storage layer under the memory gate electrode MG. The injected hot electrons are trapped by the trapping levels in the charge storage layer, and as a result, the threshold voltage of the memory transistor having the memory gate electrode MG rise. That is, the memory transistor is in the write state.

As an erase method, a band-to-band tunneling (BTBT: Band-To-Band Tunneling) method can be used. That is, holes generated by the BTBT are injected into the charge storage layer to perform erase. For example, voltages as shown in the column of "erase" in FIG. 7 are applied to the respective portions of the selected memory cell MC to be erased, holes are generated by BTBT phenomena, and holes are injected into the charge storage layer of the selected memory cell MC by electric field acceleration, thereby lowering the threshold voltage of the memory transistor. That is, the memory transistor is in the erase state.

At the time of read, for example, voltages as shown in the column of "read" in FIG. 7 are applied to each portion of the selected memory cell MC to be read. By setting the voltage Vmg applied to the memory gate electrode MG at the time of read to a value between the threshold voltage of the memory transistor in the write state and the threshold voltage of the memory transistor in the erase state, it is possible to discriminate between the write state and the erase state.

Main Feature of Semiconductor Device

The main features of the semiconductor device of the present embodiment are described below.

As shown in FIGS. 4 and 5, in the present embodiment, the distance L2 between the fin FA closest to the dummy fin DFA and the dummy fin DFA among the plurality of fins FA is smaller than the distance L1 between the plurality of fins FA adjacent to each other in the memory cell forming region MR. The distance L3 between two dummy fins DFA adjacent to each other is larger than the distance L1 and the distance L2.

As a result, the position of the upper surface of the element isolation portion STI in the memory cell forming region MR is lower than the position of the upper surface of the element isolation portion STI in the shunt region SR. Specifically, the position of the upper surface of the element isolation portion STI formed between the plurality of fins FA adjacent to each other and the position of the upper surface of the element isolation portion STI formed between the fin FA and the dummy fin DFA closest to the dummy fin DFA are lower than the position of the upper surface of the element isolation portion STI formed in the shunt region SR, that is, the position of the upper surface of the element isolation portion STI formed between the two dummy fins DFA.

When the position of the upper surface of the element isolation portion STI formed between the plurality of fins FA adjacent to each other is H1, the position of the upper surface of the element isolation portion STI formed between the fin FA and the dummy fin DFA is H2, and the position of the upper surface of the element isolation portion STI formed between the two dummy fins DFA is H3, the absolute value of (H2−H1) is smaller than the absolute value of (H3−H2). In other words, the absolute value of (H2−H1) is preferably less than ½ of the absolute value of (H3−H1), and more preferably less than ¼ of the absolute value of (H3−H1). It is most preferable that the absolute value of (H2−H1) is zero.

For example, when the distance L1 is about 90 nm, the distance L2 is about 50 nm, and the height of the upper portion of the fin FA (the height at which the fin FA protrudes from the upper surface of the element isolation portion STI) is about 50 nm, the value of (H3−H1) is about 20 nm.

As described above, since the position of the upper surface of the element isolation portion STI is sufficiently low on both sides of the fin FA adjacent to the dummy fin DFA, the channel width of the memory cell MC formed on the fin FA adjacent to the dummy fin DFA is substantially equal to, for example, the channel width of the memory cell MC formed in the center portion of the memory cell forming region MR. Therefore, it is possible to suppress a problem in which the drain current of each memory cell MC varies in the entire memory cell forming region MR.

Figure 44:
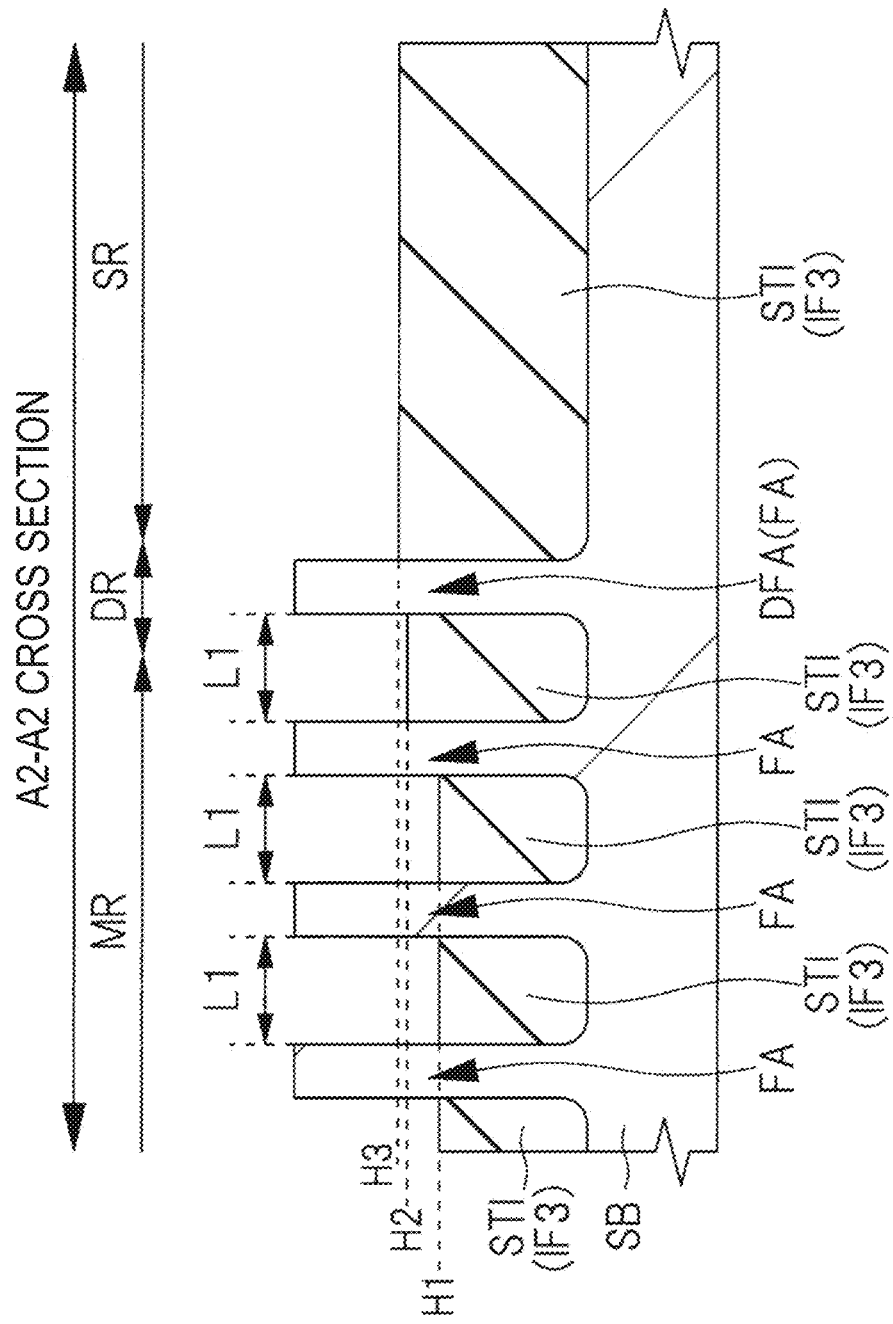
FIG. 44 is a cross-sectional view for explaining the manufacturing step of a semiconductor device according to a studied example.

The inventor of the present application has found that the upper surface of the element isolation portion STI between the fin FA and the dummy fin DFA is increased during the manufacturing step. FIG. 44 shows a cross-sectional view of the studied example studied by the inventor during the manufacturing step of the semiconductor device. As will be described later, FIG. 44 is a manufacturing step corresponding to FIG. 17 of the present embodiment.

As shown in FIG. 44, in the studied example, the distance L1 between the fins FA including the dummy fin DFA are equal. According to the study by the inventor of the present application, in the region where the fins FA are not formed as in the shunt region SR, the area of the element isolation portion STI is large, and therefore, the progress of the dry etching tends to be slower than in the region where the area of the element isolation portion STI is small as between the fins FA. In other words, in the element isolation portion STI between the fins FA adjacent to each other, the dry etching progresses quickly, and the retraction amount of the element isolation portion STI is large.

However, it has been found that the progress of the dry etching tends to be slow not only in a region having a large area but also in a region adjacent to a region having a large area. Therefore, as shown in FIG. 44, between the dummy fin DFA and the fin FA adjacent to the dummy fin DFA, the progress of the dry etching is slow, and the retraction amount of the element isolation portion STI is small. That is, the height of the position H2 tends to be higher, and the absolute value of (H2−H1) may be larger than the absolute value of (H3−H2). Therefore, in the memory cell MC formed on the fin FA adjacent to the dummy fin DFA, there is a problem that the channel width is narrow and the drain current decreases.

On the other hand, in the present embodiment, as described above, the distance L2 between the fin FA and the dummy fin DFA is made smaller than the distance L1 between the other fins FA. Therefore, the progress of etching can be made the fastest between the fin FA and the dummy fin DFA. As a result, the position H2 of the upper surface of the element isolation portion STI formed between the fin FA and the dummy fin DFA is substantially the same as the position H1 of the upper surface of the element isolation portion STI formed between the other fins FA. Therefore, in the memory cell MC formed on the fin FA adjacent to the dummy fin DFA, the drain current can be suppressed from decreasing, and variations in the drain current of the entire memory cell MC can be suppressed, thereby improving the reliability of the semiconductor device.

Such main features of the present application will also be described in detail in the corresponding manufacturing step among the manufacturing steps described below.

As described above, in the dummy cell region DR, the memory cell MC formed on the dummy fin DFA is treated as a dummy element. This is because the position of the upper surface of the element isolation portion STI formed on the side surface of the dummy fin DFA on the shunt region SR side is higher, so that the channel width of the element formed on the dummy fin DFA is smaller.

Method for Manufacturing Semiconductor Device

Hereinafter, a method for manufacturing a semiconductor device according to the present embodiment will be described with reference to FIGS. 8 to 27. First, in FIGS. 8 to 17, only the A2-A2 cross section is shown, and the manufacturing step of the fins FA will be described. Thereafter, in FIGS. 18 to 27, the manufacturing step of the A2-A2 cross section and the B-B cross section will be described.

Figure 8:
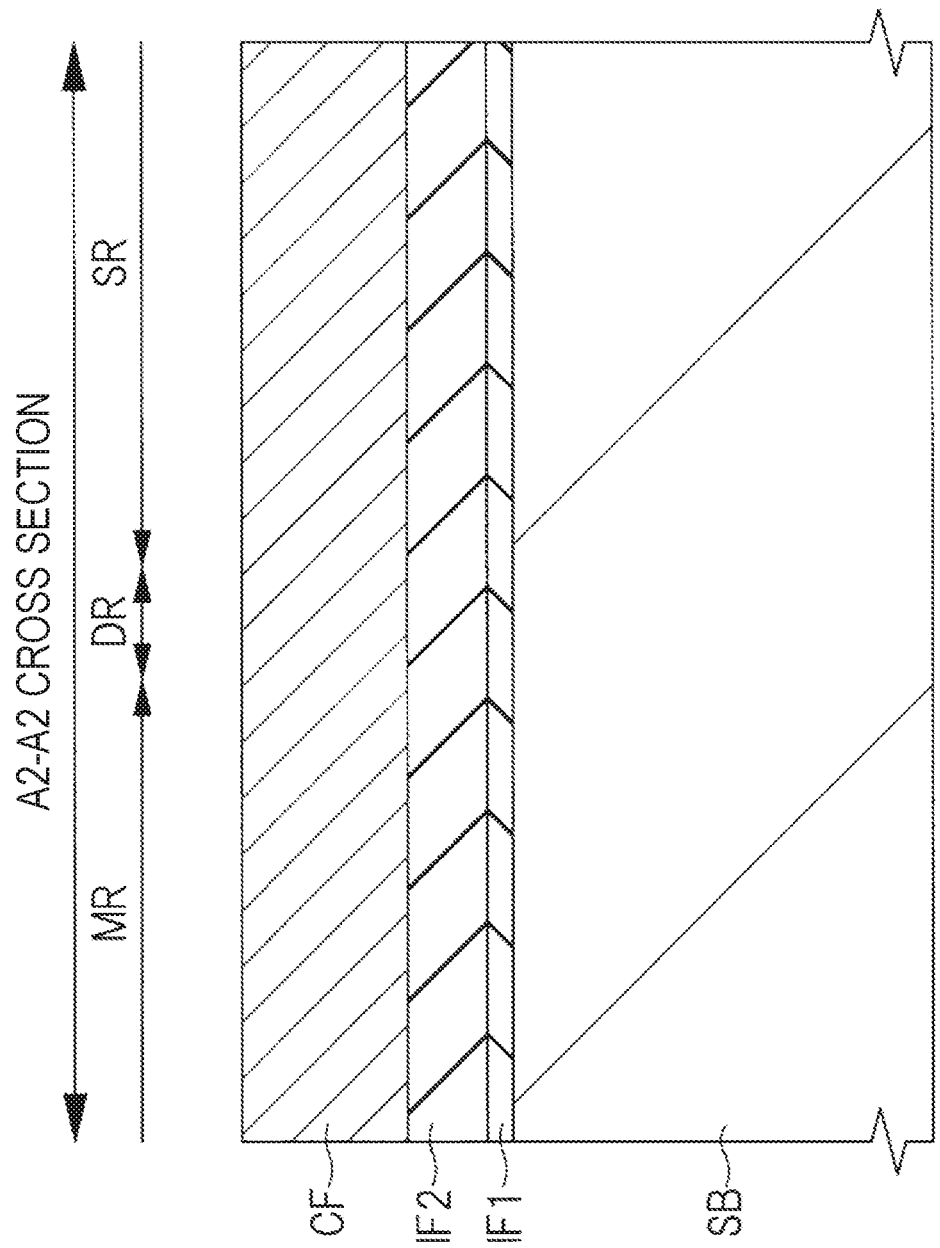
FIG. 8 is a cross-sectional view for explaining the manufacturing step of the semiconductor device according to the first embodiment.

First, as shown in FIG. 8, a semiconductor substrate SB is prepared, and an insulating film IF1, an insulating film IF2, and a conductor film CF are sequentially formed on a main surface of the semiconductor substrate SB. The semiconductor substrate SB is made of, for example, p-type monocrystalline silicon having a resistivity of about 1 Ωcm to 10 Ωcm. The insulating film IF1 is formed of, for example, a silicon oxide film, and can be formed by, for example, thermal oxidation method or CVD (Chemical Vapor Deposition) method. The thickness of the insulating film IF1 is about 2 nm to 10 nm. The insulating film IF2 is formed of, for example, a silicon nitride film, and is formed by, for example, CVD method. The thickness of the insulating film IF2 is about 20 nm to 100 nm. The conductor film CF is formed of, for example, a silicon film, and is formed by, for example, CVD method. The thickness of the conductor film CF is, for example, 20 nm to 200 nm.

Figure 9:
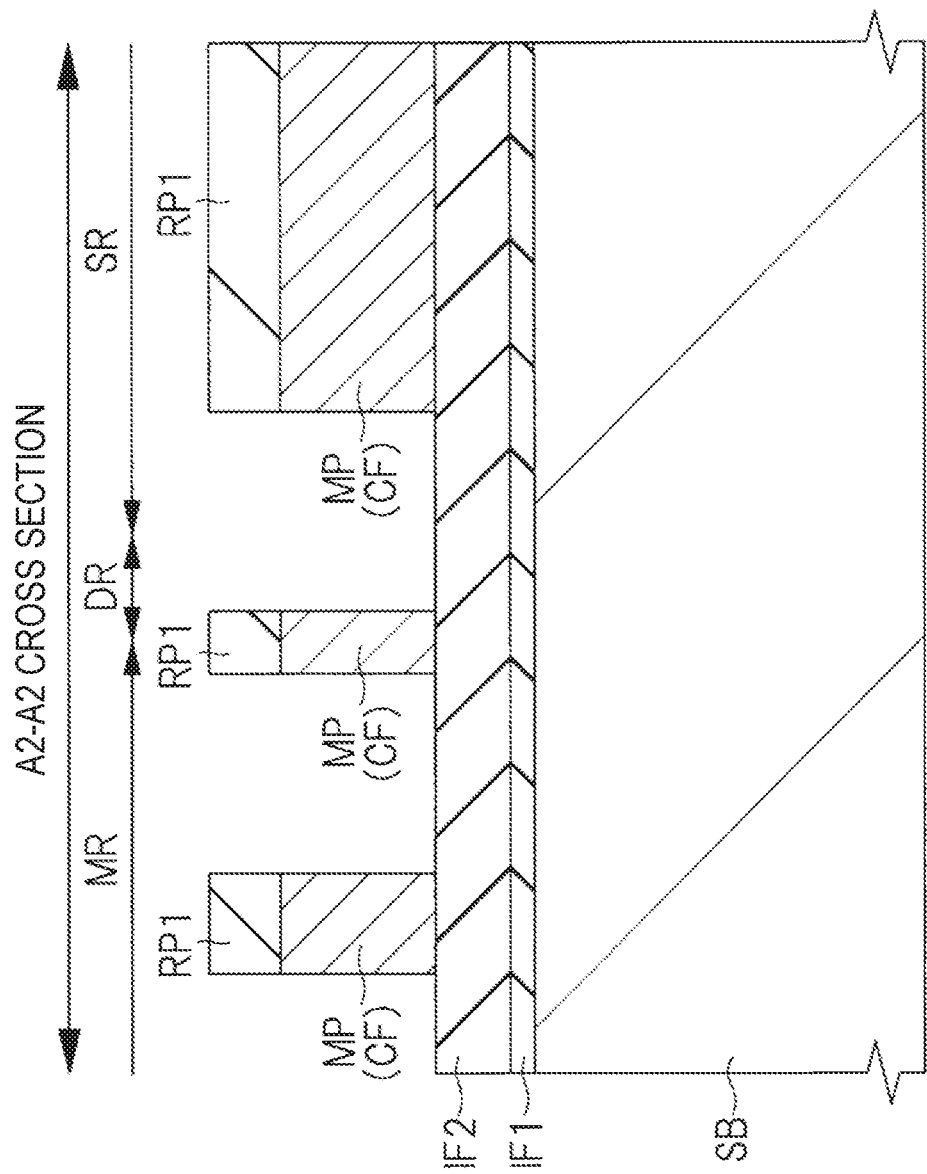
FIG. 9 is a cross-sectional view for explaining the manufacturing step of the semiconductor device following FIG. 8.

FIG. 9 shows a step of forming mask patterns MP.

First, resist patterns RP1 are formed on the conductor film CF so as to selectively cover a part of the conductor film CF. Next, anisotropic etching is performed using the resist patterns RP1 as a mask, whereby the conductor film CF is processed to form a plurality of mask patterns MP. Here, the length of the mask pattern MP close to the dummy cell region DR is made shorter than the length of the other mask patterns MP. Thereafter, the resist patterns RP1 are removed by asking or the like.

Figure 10:
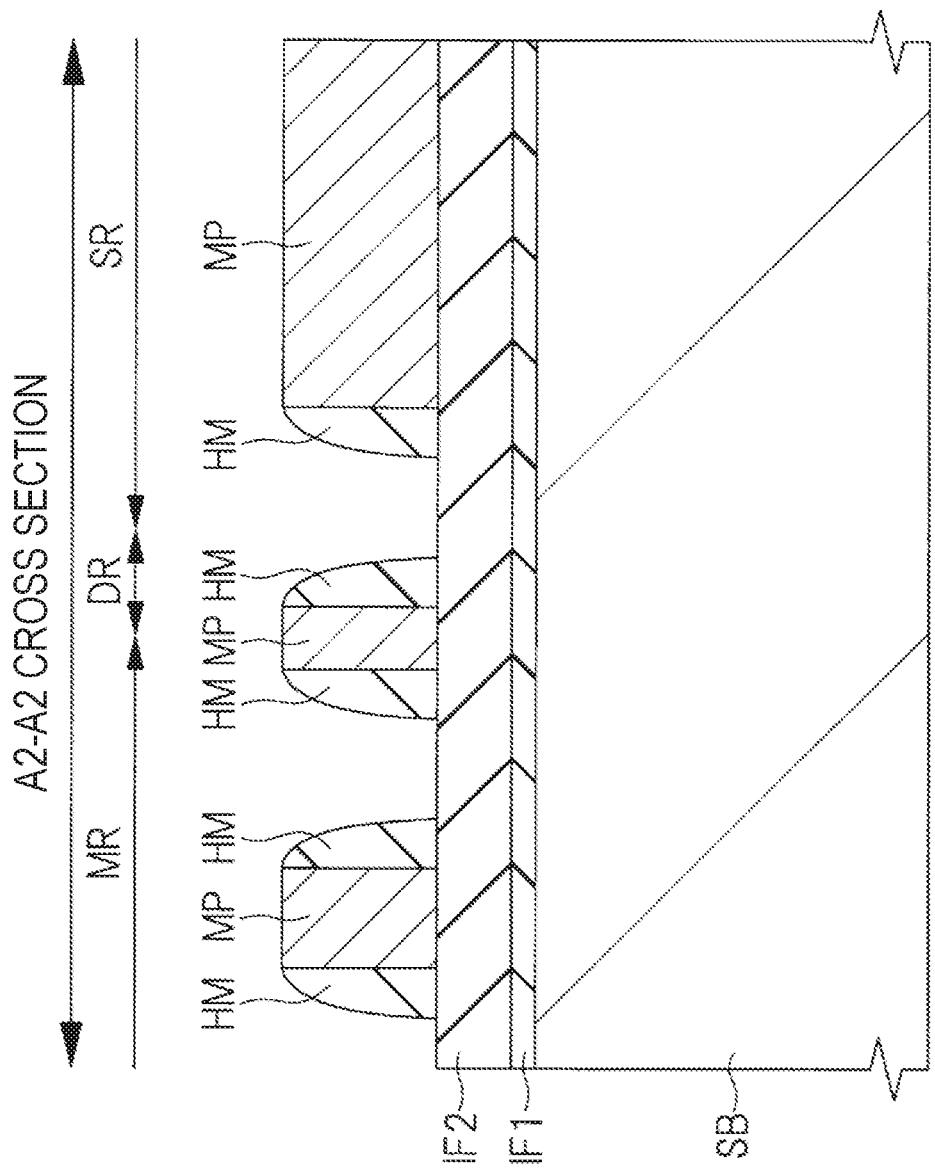
FIG. 10 is a cross-sectional view for explaining the manufacturing step of the semiconductor device following FIG. 9.

FIG. 10 shows a step of forming hard masks HM.

First, a hard mask material such as a silicon oxide film is formed by, for example, CVD method so as to cover a plurality of mask patterns MP. The material of the hard mask material differs from the material of the mask patterns MP (conductor film CF) and the material of the semiconductor substrate SB. The thickness of the hard mask material is about 10 nm to 40 nm. Next, anisotropic etching is performed on the hard mask material to form a plurality of hard masks HM on the side surfaces of the plurality of mask patterns MP. The plurality of hard masks HM do not completely fill the spaces between the mask patterns MP adjacent to each other, and the insulating film IF2 is exposed from the plurality of hard masks HM.

A hard mask HM for forming a dummy fin DFA later is formed on one side surface of the mask pattern MP having a short length, and a hard mask HM for forming a fin FA closest to the dummy fin DFA later is formed on the other side surface of the mask pattern MP having a short length.

Figure 11:
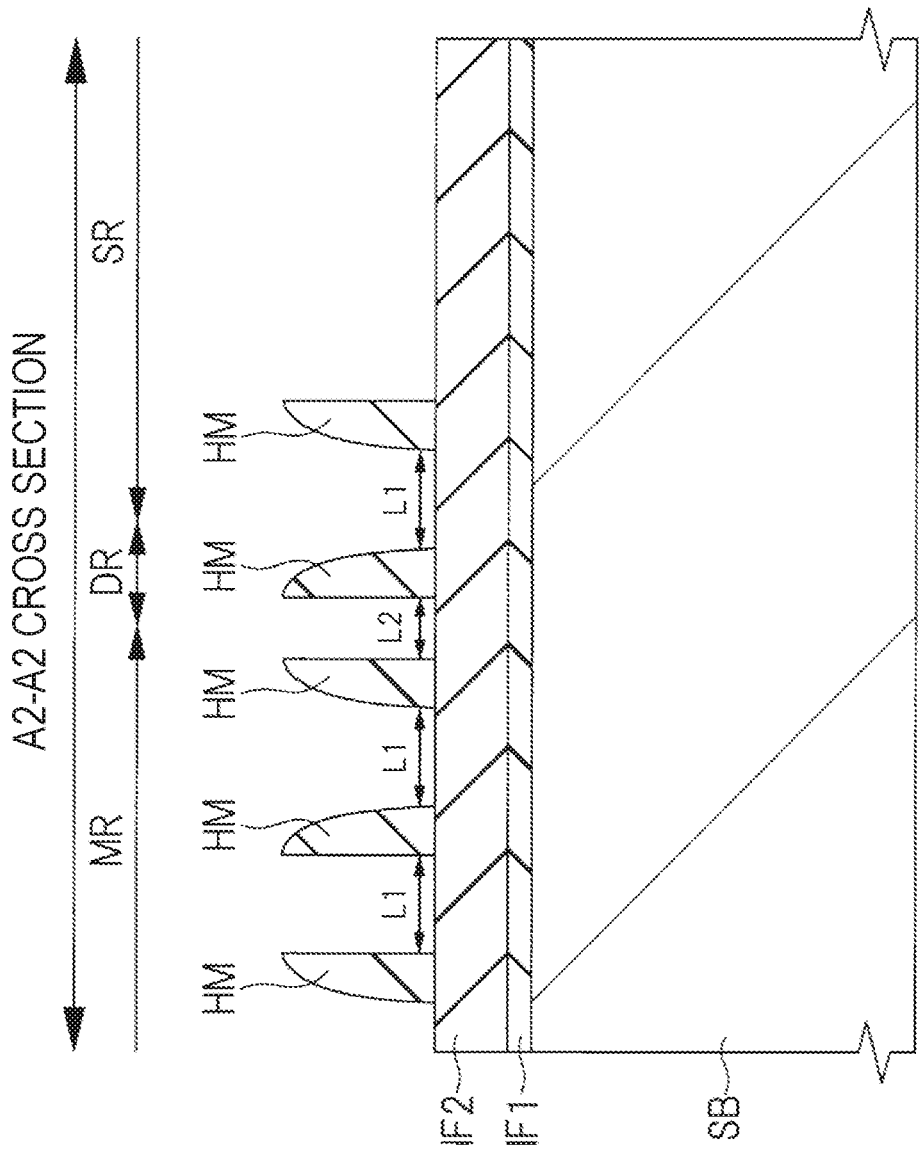
FIG. 11 is a cross-sectional view for explaining the manufacturing step of the semiconductor device following FIG. 10.

FIG. 11 shows a step of removing the mask patterns MP.

The plurality of mask patterns MP are removed by wet etching. As a result, the plurality of hard masks HM are left on the insulating film IF2. In this state, the distance between the hard masks is L1. The distance L2 between the hard mask HM for forming the dummy fin DFA later and the hard mask HM for forming the fin FA closest to the dummy fin DFA later is shorter than the distance L1.

Figure 12:
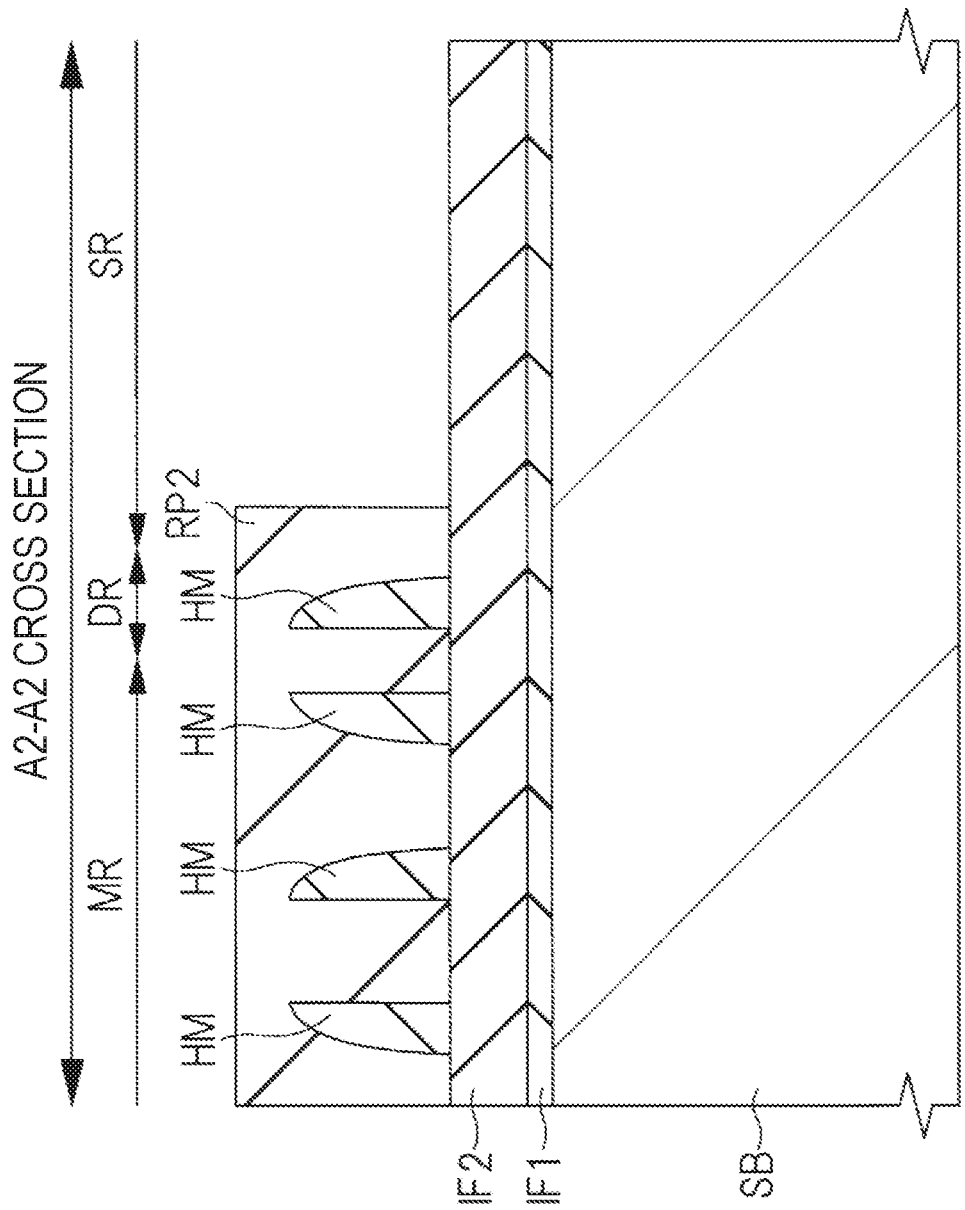
FIG. 12 is a cross-sectional view for explaining the manufacturing step of the semiconductor device following FIG. 11.

FIG. 12 shows a step of removing a part of the hard masks HM among the plurality of hard masks HM.

First, a resist pattern RP2 covering the hard masks HM formed in the memory cell forming region MR and the dummy cell region DR and opening the hard mask HM formed in the shunt region SR is formed. Next, the hard mask HM of the shunt region SR is removed by performing anisotropic etching using the resist pattern RP2 as a mask. Though not shown in the drawing, in the memory cell forming region MR as well, there are portions that are not covered with the resist pattern RP2, and the hard masks HM formed in the portions are also removed. For example, in the state of FIG. 10, although the hard mask HM is also formed at the end portion of the mask pattern MP in the depth direction (X direction) of the drawing, such hard mask HM is also removed in the step of FIG. 12. Thereafter, the resist pattern RP2 is removed by asking or the like.

Figure 13:
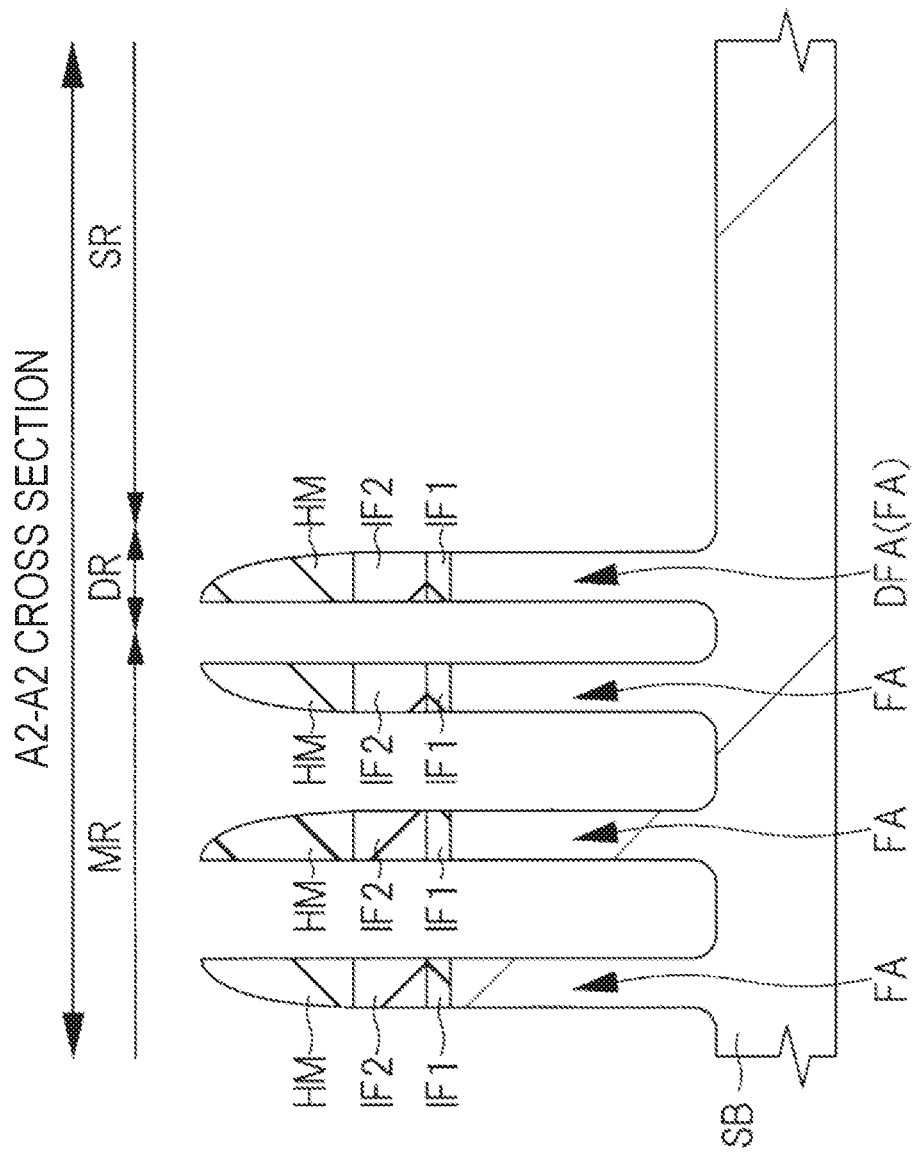
FIG. 13 is a cross-sectional view for explaining the manufacturing step of the semiconductor device following FIG. 12.

FIG. 13 shows a step of forming fins FA and dummy fins DFA.

By performing anisotropic etching using the hard masks HM as a mask, the insulating film IF2 and the insulating film IF1 which are not covered with the hard masks HM are sequentially removed, and a part of the upper surface of the semiconductor substrate SB is made to etch. A plurality of fins FA which are parts of the semiconductor substrate SB and protrude from the upper surface of the etched semiconductor substrate SB are formed. The plurality of fins FA also include dummy fins DFA in the dummy cell region DR.

Here, since the semiconductor substrate SB exposed from the hard masks HM is etched by 100 nm to 250 nm, the height from the upper surface of the etched semiconductor substrate SB to the upper surface of the fin FA is 100 nm to 250 nm.

Figure 14:
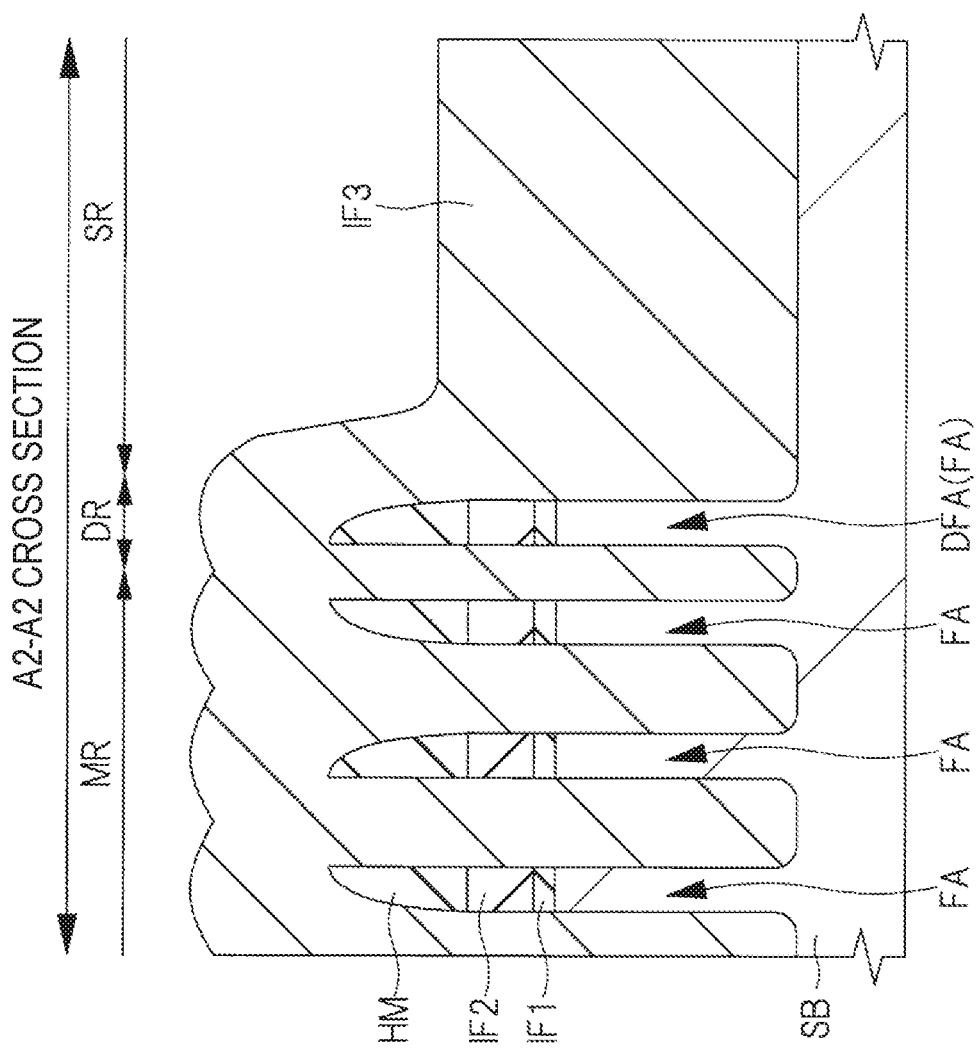
FIG. 14 is a cross-sectional view for explaining the manufacturing step of the semiconductor device following FIG. 13.

FIG. 14 shows a step of forming an insulating film IF3.

First, an insulating film IF3 such as $O_3$-TEOS is formed as a silicon oxide film on the semiconductor substrate SB by, for example, CVD method so as to embed the space between the fins FA and to cover the hard masks HM formed on the upper surfaces of the fins FA.

Next, the insulating film IF3 is subjected to densifying annealing (heat treatment for annealing) to cure the film quality of the insulating film IF3. The densifying annealing is performed in an inert gas atmosphere such as nitrogen, for example, and is performed at a temperature of 900° C. to 1100° C. Here, the position of the upper surface of the insulating film IF3 in the memory cell forming region MR is higher than the position of the upper surface of the insulating film IF3 in the shunt region SR. Therefore, in the memory cell forming region MR, although the insulating film IF3 on the upper surface of the fin FA is cured, the heat is not sufficiently transferred to the insulating film IF3 between the fins FA, and the insulating film IF3 between the fins FA includes a portion where the insulating film IF3 is not sufficiently cured. Therefore, the film quality of each insulating film IF3 differs between the memory cell forming region MR and the shunt region SR. That is, the insulating film IF3 in the memory cell forming region MR is softer than the insulating film IF3 in the shunt region SR, and is easily etched by dry etching.

Figure 15:
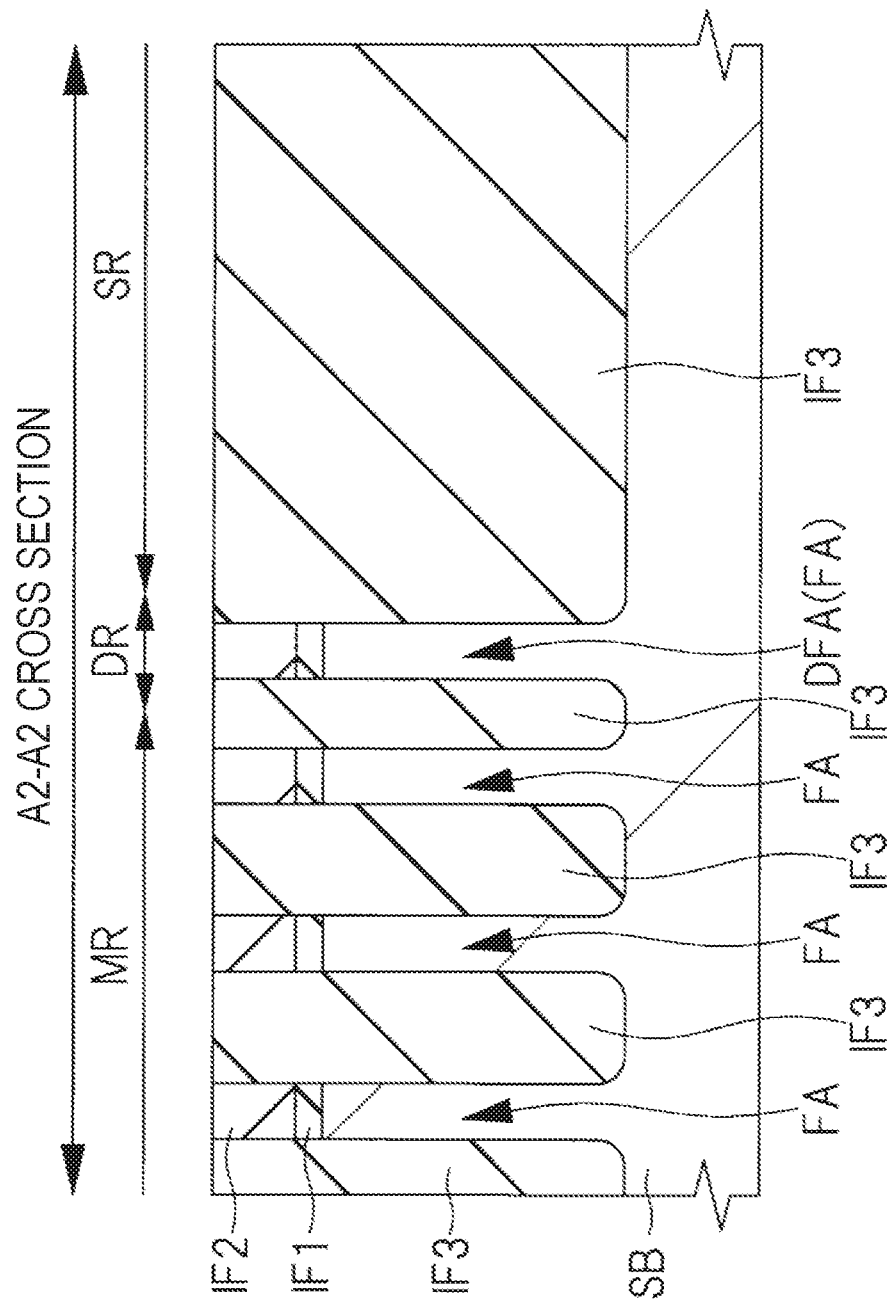
FIG. 15 is a cross-sectional view for explaining the manufacturing step of the semiconductor device following FIG. 14.

FIG. 15 shows a step of polishing the insulating film IF3 and the hard masks HM.

The upper surface of the insulating film IF3 is planarized by polishing process by CMP method. At this time, the insulating film IF2 serves as a stopper film for the polishing process, and not only the upper surface of the insulating film IF3 but also the hard masks HM are polished and the hard masks HM is removed.

Figure 16:
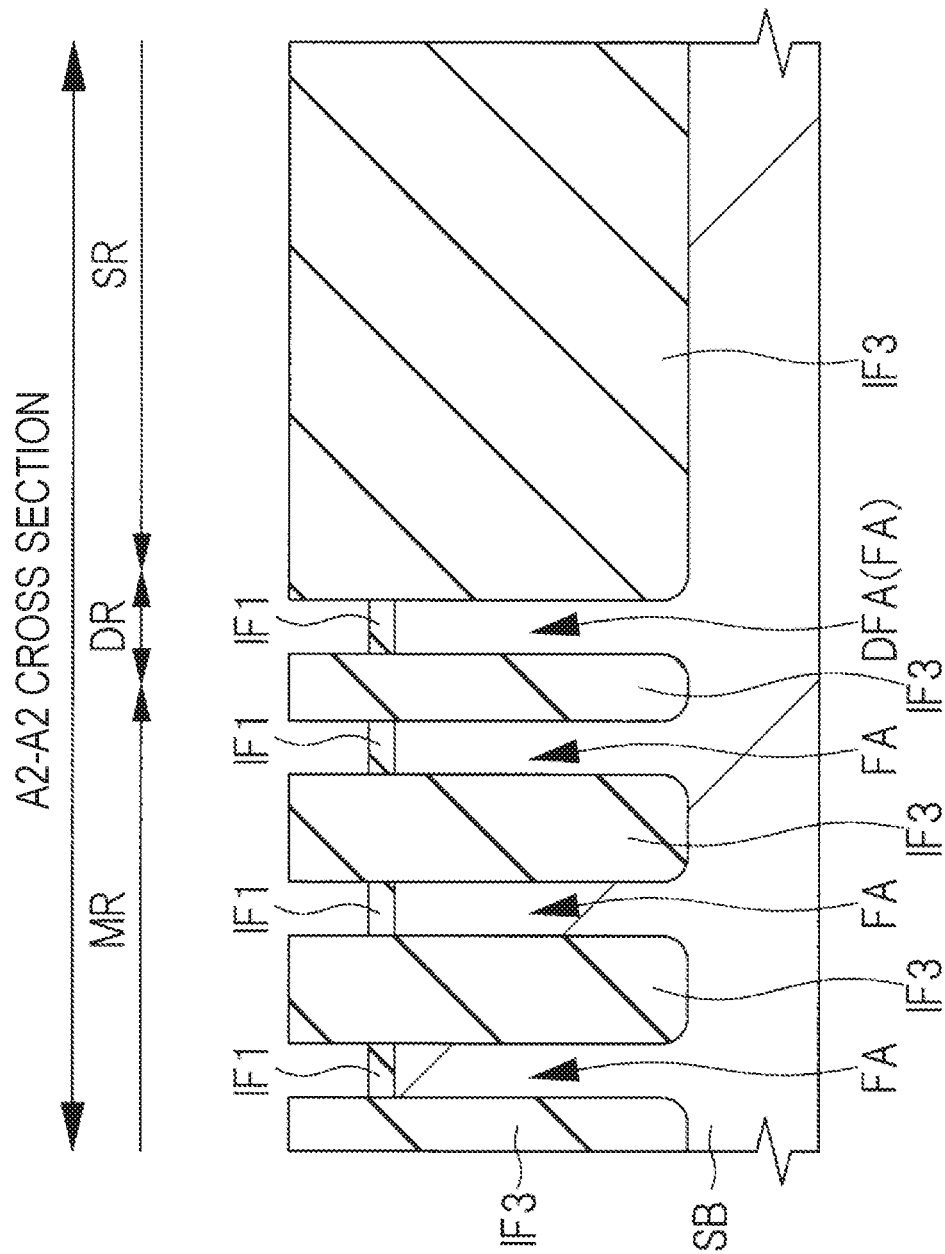
FIG. 16 is a cross-sectional view for explaining the manufacturing step of the semiconductor device following FIG. 15.

FIG. 16 shows a step of removing the insulating film IF2.

The insulating film IF2 is removed by wet etching. Thereafter, the densifying annealing as described with reference to FIG. 14 may be performed again. Although the insulating film IF3 in the memory cell forming region MR and the insulating film IF3 in the shunt region SR are cured in the same manner in the densifying annealing here, since the insulating film IF3 in the memory cell forming region MR is softened in the step of FIG. 14, the insulating film IF3 in the memory cell forming region MR is softer than the insulating film IF3 in the shunt region SR even after the step of FIG. 16.

Figure 17:
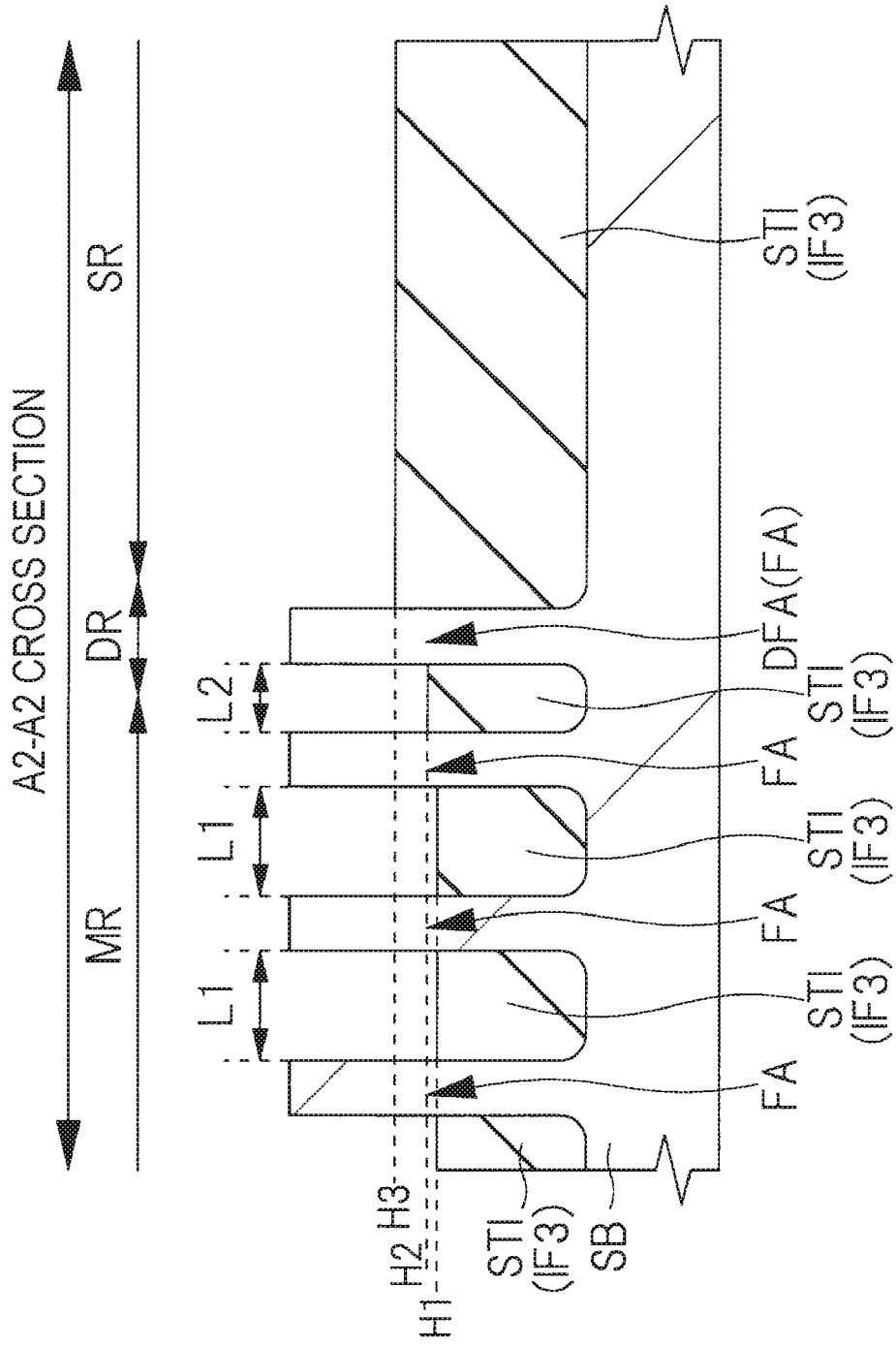
FIG. 17 is a cross-sectional view for explaining the manufacturing step of the semiconductor device following FIG. 16.

FIG. 17 shows a step of forming the element isolation portions STI.

The insulating film IF3 is etched by anisotropic etching such as dry etching so that the position of the upper surface of the insulating film IF3 is lower than the position of the upper surface of each of the plurality of fins FA. As a result, the upper portions of the plurality of fins FA protrude from the upper surface of the retracted insulating film IF3, and the insulating film IF3 embedded between the plurality of fins FA serves as the element isolation portions STI. The insulating films IF1 formed on the upper surfaces of the fins FA are also removed by the anisotropic etching.

As described above, in the region where the fins FA are not formed as in the shunt region SR, since the area of the insulating film IF3 is large, the dry etching tends to proceed slower than in the region where the area of the insulating film IF3 is small as between the fins FA. That is, in the dry etching, the progress of the dry etching tends to be different depending on the interval between the plurality of adjacent fins FA. In a region adjacent to a region having a large area, such as between the dummy fin DFA and the fin FA, the progress of the dry etching tends to slow down due to the influence of the dry etching of the region having a large area.

In addition, the insulating film IF3 in the memory cell forming region MR has a softer film quality than the insulating film IF3 in the shunt region SR by the above densifying annealing. Therefore, the progress of the dry etching tends to be accelerated in the memory cell formation region MR, and the progress of the dry etching tends to be slowed in the shunt region SR. In the region adjacent to the shunt region SR, such as between the dummy fin DFA and the fin FA, heat is easily transferred by the densifying annealing because of the lower upper surface of the insulating film IF3 in the shunt region SR, so that the insulating film IF3 between the dummy fin DFA and the fin FA has a harder film quality than the insulating film IF3 between the other fins FA, and the dry etching tends to proceed slower.

Therefore, in the studied example shown in FIG. 44, between the dummy fin DFA and the fin FA, the progress of the dry etching is slowed down, and the etched amount of the insulating film IF3 is small. That is, the height of the position H2 tends to be higher, and the absolute value of (H2−H1) tends to be larger than the absolute value of (H3−H2). Therefore, in the memory cell MC formed on the fin FA adjacent to the dummy fin DFA, the channel width is narrow and the drain current decreases.

In the present embodiment, the distance L2 between the fin FA closest to the dummy fin DFA among the plurality of fins FA and the dummy fin DFA is shorter than the distance L1 between two fins FA adjacent to each other. Therefore, even if the film quality of the insulating film IF3 between the dummy fin DFA and the fin FA is hard, the progress of the etching can be accelerated between the fin FA and the dummy fin DFA. As a result, the position H2 of the upper surface of the insulating film IF3 (element isolation portion STI) formed between the fin FA and the dummy fin DFA is substantially the same as the position H1 of the upper surface of the insulating film IF3 (element isolation portion STI) formed between the other fins FA. In the present embodiment, the absolute value of (H2−H1) is preferably less than ½ of the absolute value of (H3−H1), and more preferably less than ¼ of the absolute value of (H3−H1). It is most preferable that the absolute value of (H2−H1) is zero.

As a result, in the memory cell MC formed on the fin FA adjacent to the dummy fin DFA, the drain current can be suppressed from decreasing, and variations in the drain current of the entire memory cell MC can be suppressed, thereby improving the reliability of the semiconductor device.

Figure 18:
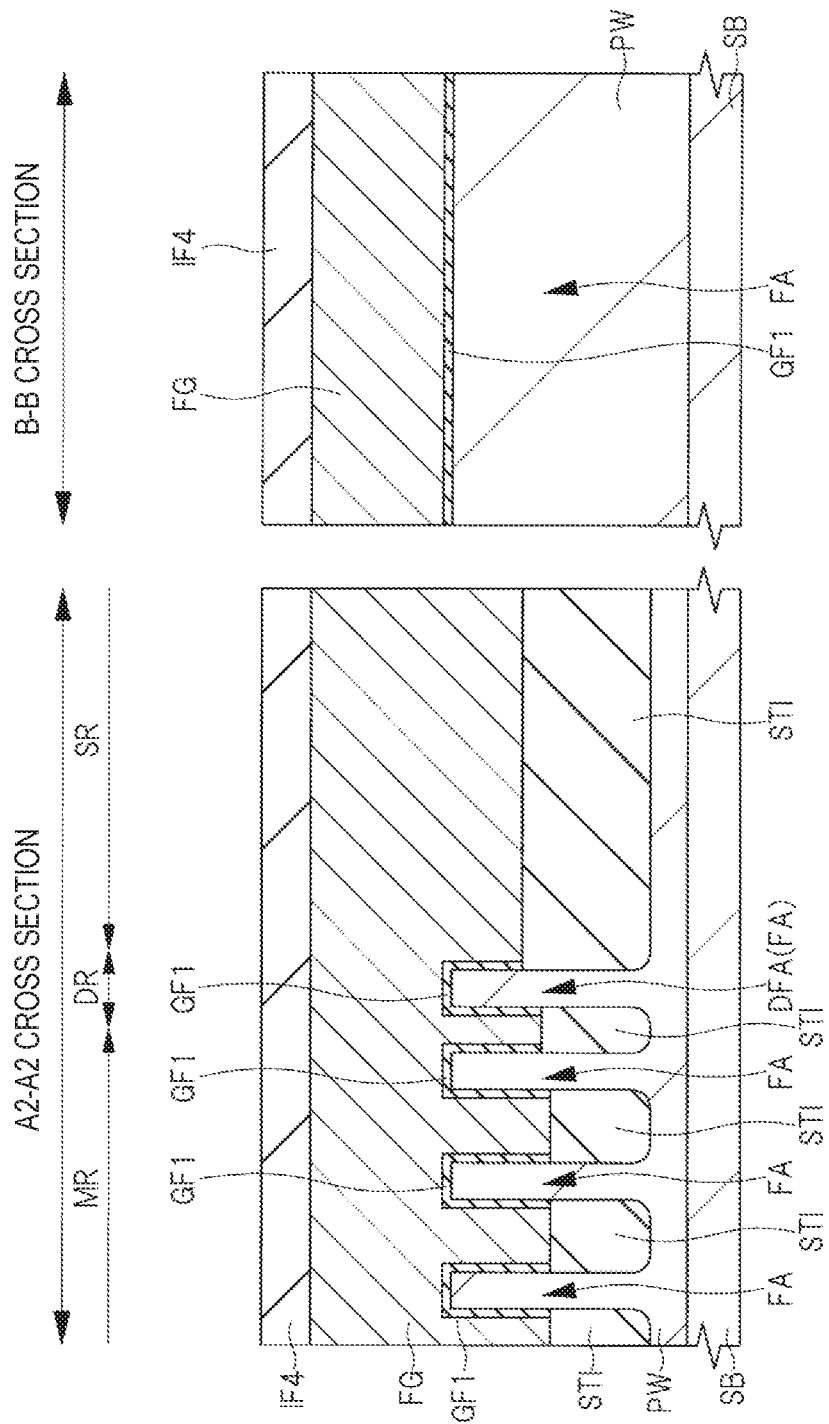
FIG. 18 is a cross-sectional view for explaining the manufacturing step of the semiconductor device following FIG. 17.

The manufacturing step following FIG. 17 will be described with reference to FIGS. 18 to 27. FIG. 18 shows steps of forming a well region PW, gate dielectric films GF1, a conductor film FG, and an insulating film IF4.

First, a p-type well region PW is formed in the semiconductor substrate SB including the fins FA by introducing impurities into the main surface of the semiconductor substrate SB by photolithography and ion implantation. The impurities for forming the well region PW are, for example, boron (B) or boron difluoride ($BF_2$). The well region PW is formed to extend over the entire fins FA and a portion of the semiconductor substrate SB.

Next, a gate dielectric film GF1 formed of, for example, a silicon oxide film is formed on the upper surface and the side surfaces of the fin FA by, for example, thermal oxidation. The thickness of the gate dielectric film GF1 is about 2 nm to 4 nm. Next, a conductor film FG formed of, for example, an n-type polycrystalline silicon film is deposited by, for example, CVD method so as to cover the upper surface and the side surfaces of the fin FA via the gate dielectric film GF1. The thickness of the conductor film FG is about 100 nm to 200 nm. Next, the upper surface of the conductor film FG is planarized by, for example, CMP method. When the polishing step is completed, the upper surface and the side surfaces of the fin FA in the A-A cross-section are covered with the conductor film FG via the gate dielectric film GF1. Next, an insulating film IF4 formed of, for example, a silicon nitride film is formed on the conductor film FG by, for example, CVD method. The thickness of the insulating film IF4 is about 50 nm to 100 nm.

Figure 19:
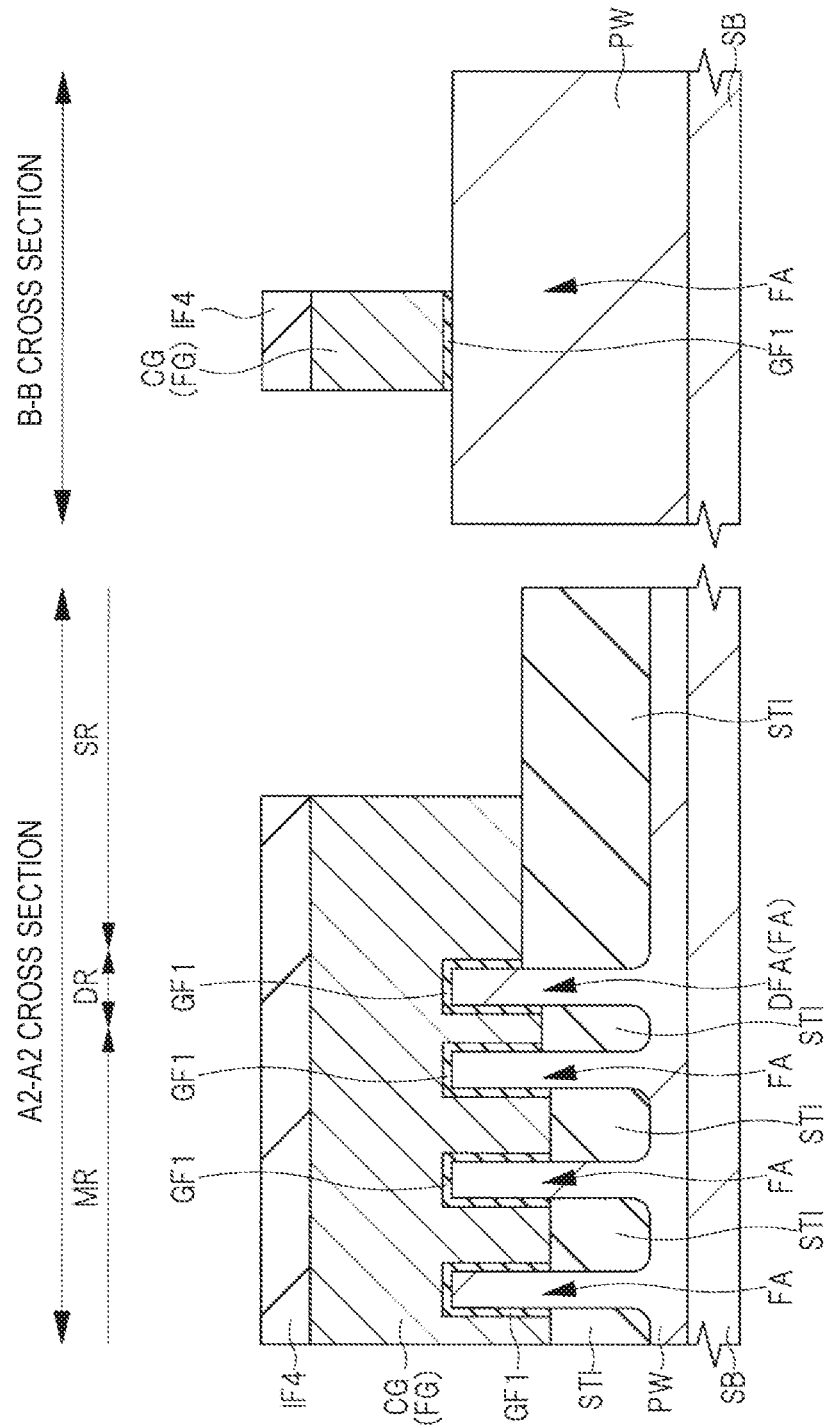
FIG. 19 is a cross-sectional view for explaining the manufacturing step of the semiconductor device following FIG. 18.

FIG. 19 shows a step of forming control gate electrodes CG.

First, the insulating film IF4 is selectively patterned by photolithography and anisotropic etching. Next, anisotropic etching is performed on the conductor film FG using the patterned insulating film IF4 as a mask to form control gate electrodes CG. That is, the conductor film FG is patterned to form the control gate electrodes CG. Next, the gate dielectric film GF1 exposed from the control gate electrode CG is removed, and the gate dielectric film GF1 is left under the control gate electrode CG. The control gate electrode CG extends in the Y direction so as to straddle the plurality of fins FA.

Figure 20:
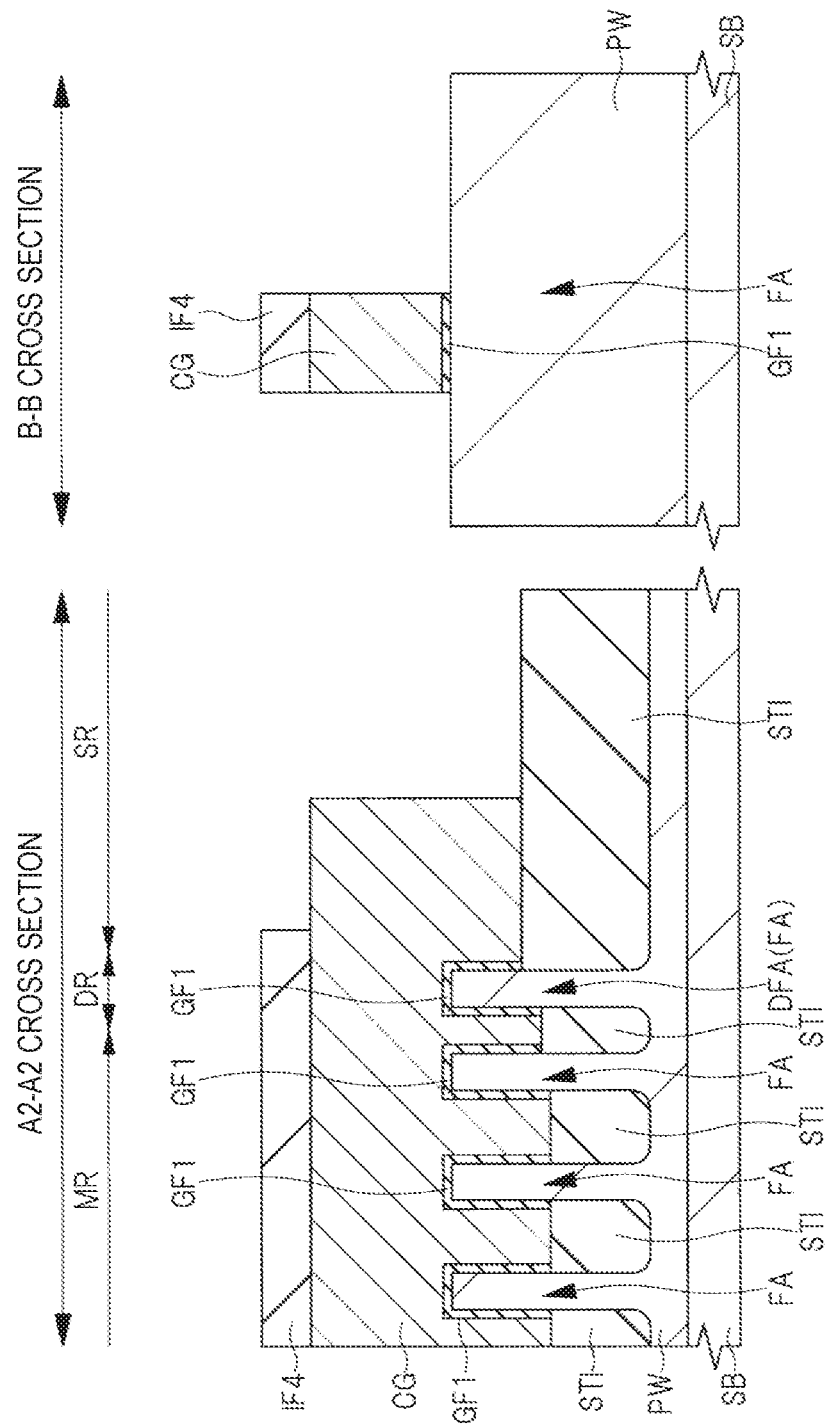
FIG. 20 is a cross-sectional view for explaining the manufacturing step of the semiconductor device following FIG. 19.

FIG. 20 shows a step of removing a part of the insulating film IF4.

A part of the insulating film IF4 is selectively removed by photolithography and anisotropic etching. A silicide layer SI1 is formed on the control gate electrode CG exposed from the insulating film IF4 in a later step.

Figure 21:
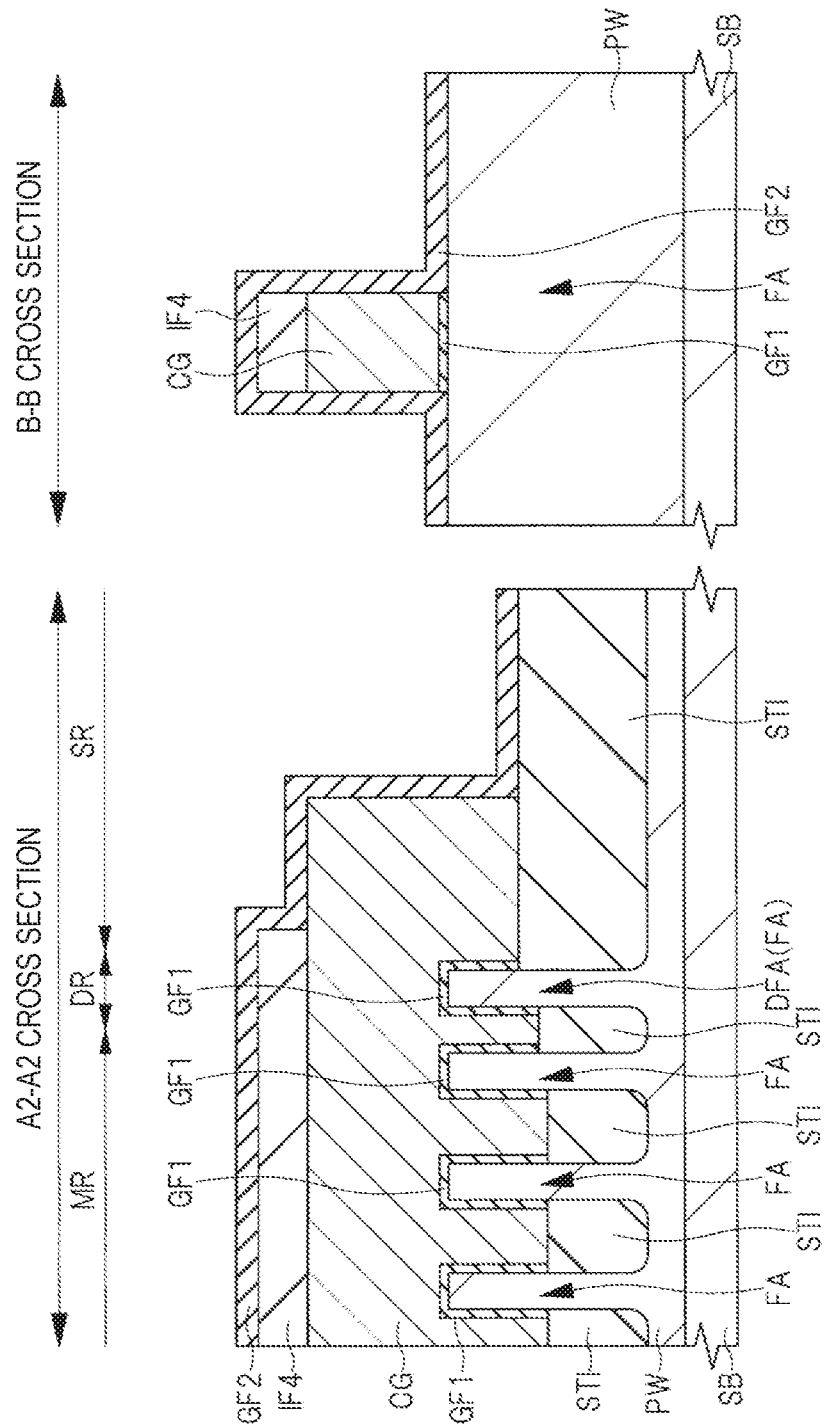
FIG. 21 is a cross-sectional view for explaining the manufacturing step of the semiconductor device following FIG. 20.

FIG. 21 shows a step of forming gate dielectric films GF2.

First, a first silicon oxide film, for example, is formed on the fins FA by, for example, thermal oxidation method or CVD method so as to cover the control gate electrodes CG and the insulating films IF4. The thickness of the first silicon oxide film is about 4 nm to 6 nm. Next, a charge storage layer is formed on the silicon oxide film by, for example, CVD method or ALD (Atomic Layer Deposition) method. The charge storage layer is an insulating layer having trapping levels capable of holding charges, and is, for example, a silicon nitride layer, and has a thickness of about 6 nm to 10 nm. Next, a second silicon oxide film is formed on the charge storage layer by, for example, CVD method or ALD method. The thickness of the second silicon oxide film is about 6 nm to 8 nm. A stacked film including the first silicon oxide film, the charge storage layer, and the second silicon oxide film serves as the gate dielectric film GF2.

Although not shown in the drawing, the gate dielectric film GF2 is formed on the upper surface and the side surfaces of each of the plurality of fins FA and on the upper surface of the element isolation portion STI between the plurality of fins FA in the Y direction.

Figure 22:
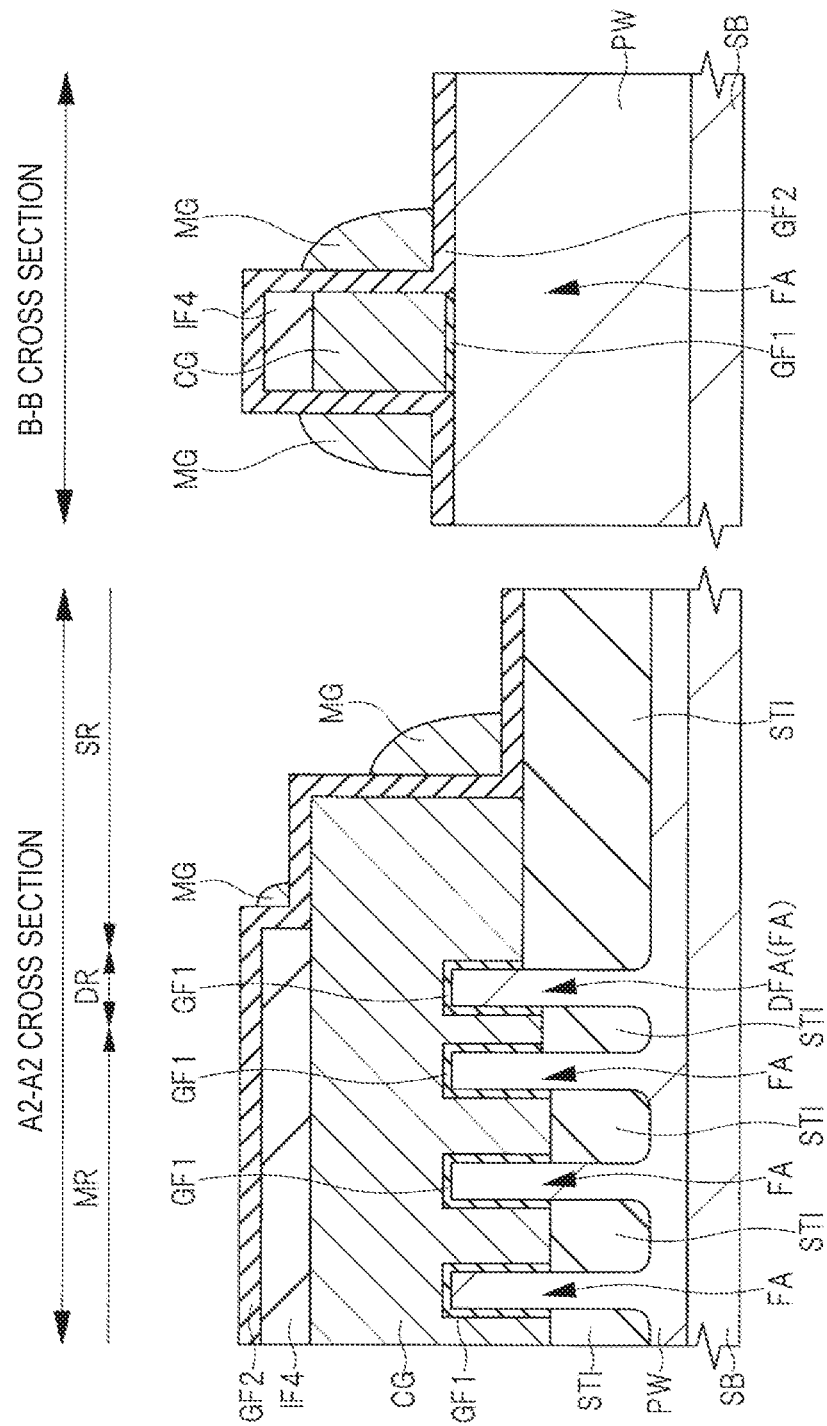
FIG. 22 is a cross-sectional view for explaining the manufacturing step of the semiconductor device following FIG. 21.

FIG. 22 shows a step of forming memory gate electrodes MG.

First, an n-type polycrystalline silicon film, for example, is deposited as a conductor film for the memory gate electrodes MG on the gate dielectric film GF2 by, for example, CVD method. Thereafter, the conductor film is subjected to anisotropic etching to form the sidewall-shaped memory gate electrodes MG on both side surfaces of the control gate electrode CG via the gate dielectric film GF2. The memory gate electrodes MG are also formed on the side surfaces of the control gate electrode CG in the shunt region SR.

Figure 23:
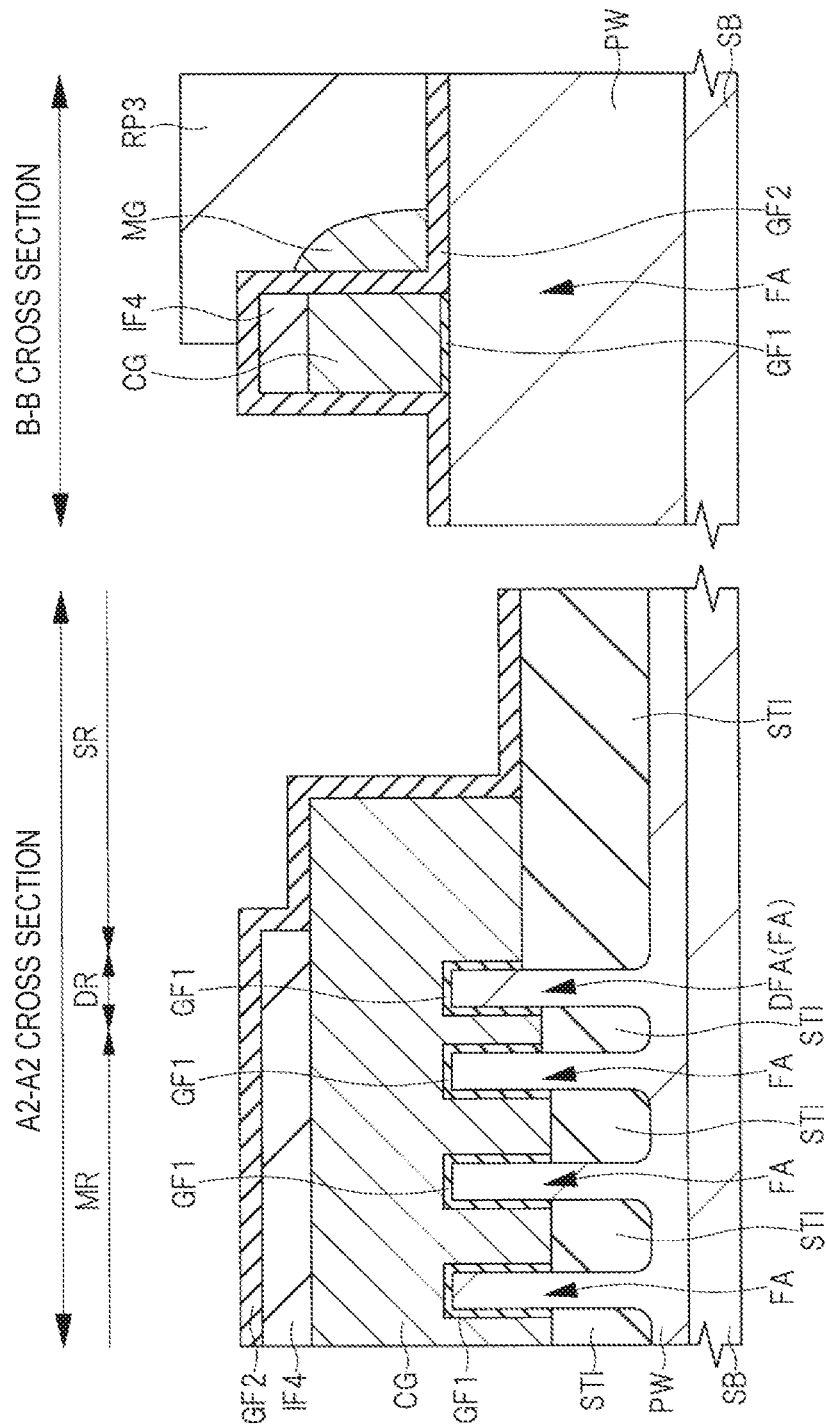
FIG. 23 is a cross-sectional view for explaining the manufacturing step of the semiconductor device following FIG. 22.

FIG. 23 shows a step of removing one of the memory gate electrodes MG formed on both side surfaces of the control gate electrode CG.

First, a resist pattern RP3 is formed to cover the memory gate electrode MG formed on one side surface of the control gate electrode CG. Then, anisotropic etching and wet etching are performed using the resist pattern RP3 as a mask to remove the memory gate electrode MG not covered with the resist pattern RP3. As a result, the memory gate electrode MG is left only on the source region side of the memory cell MC. Like the control gate electrode CG, the memory gate electrode MG extends in the Y direction so as to straddle the plurality of fins FA. In addition, the memory gate electrode MG which is not needed in the shunt region SR is removed, and the planar shape of the memory gate electrode MG is as shown in FIG. 3. Thereafter, the resist pattern RP3 is removed by asking or the like.

Figure 24:
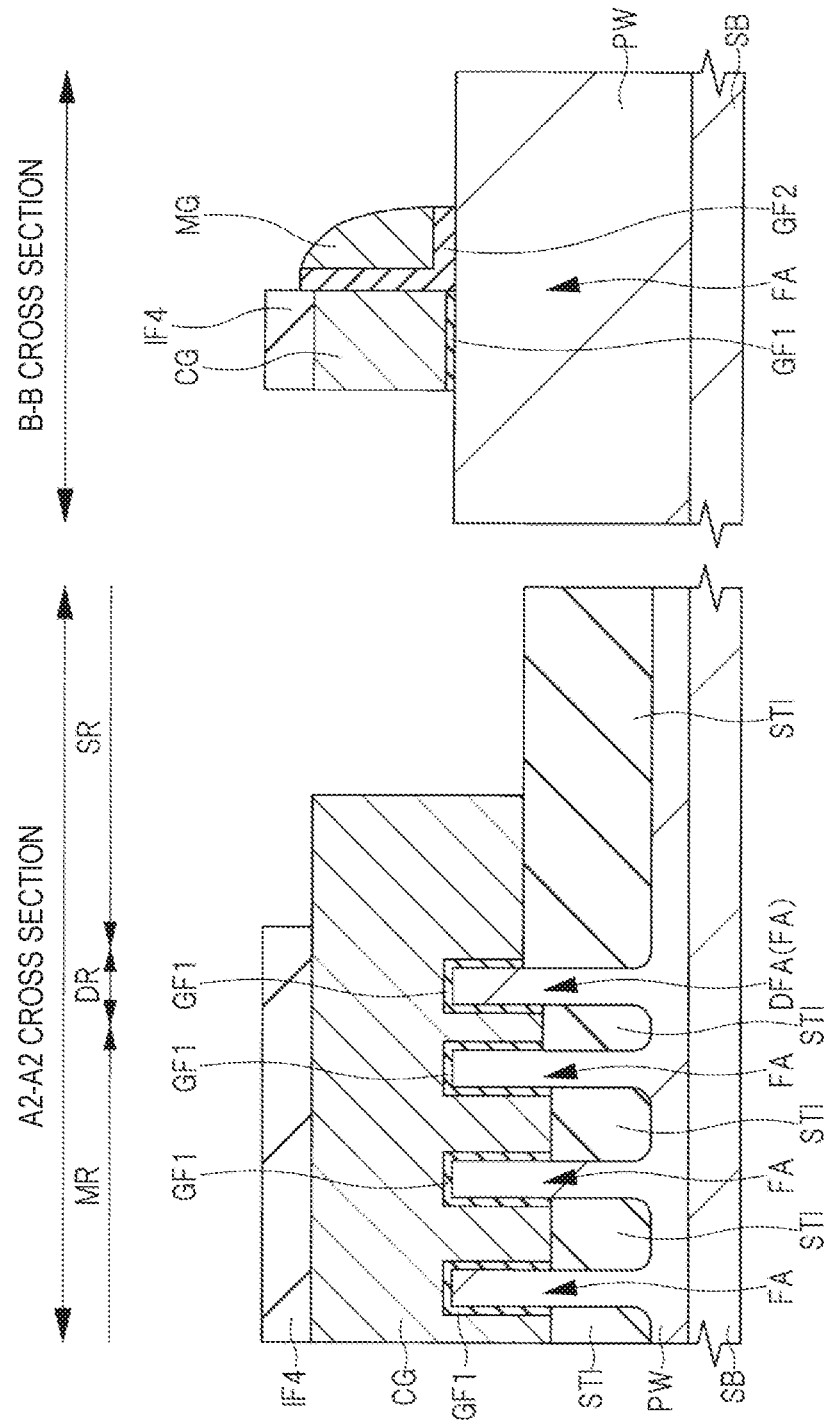
FIG. 24 is a cross-sectional view for explaining the manufacturing step of the semiconductor device following FIG. 23.

FIG. 24 shows a step of removing a part of gate dielectric films GF2.

The gate dielectric film GF2 exposed from the memory gate electrodes MG is removed by anisotropic etching and wet etching. Specifically, the gate dielectric film GF2 formed on the upper surfaces and the side surfaces of the fins FA, on the upper surfaces and the side surfaces of the control gate electrodes CG, and on the upper surfaces and the side surfaces of the insulating films IF4 are removed. As a result, the gate dielectric film GF2 is left only between the memory gate electrodes MG and the control gate electrodes CG, and between the memory gate electrodes MG and the fins FA.

Figure 25:
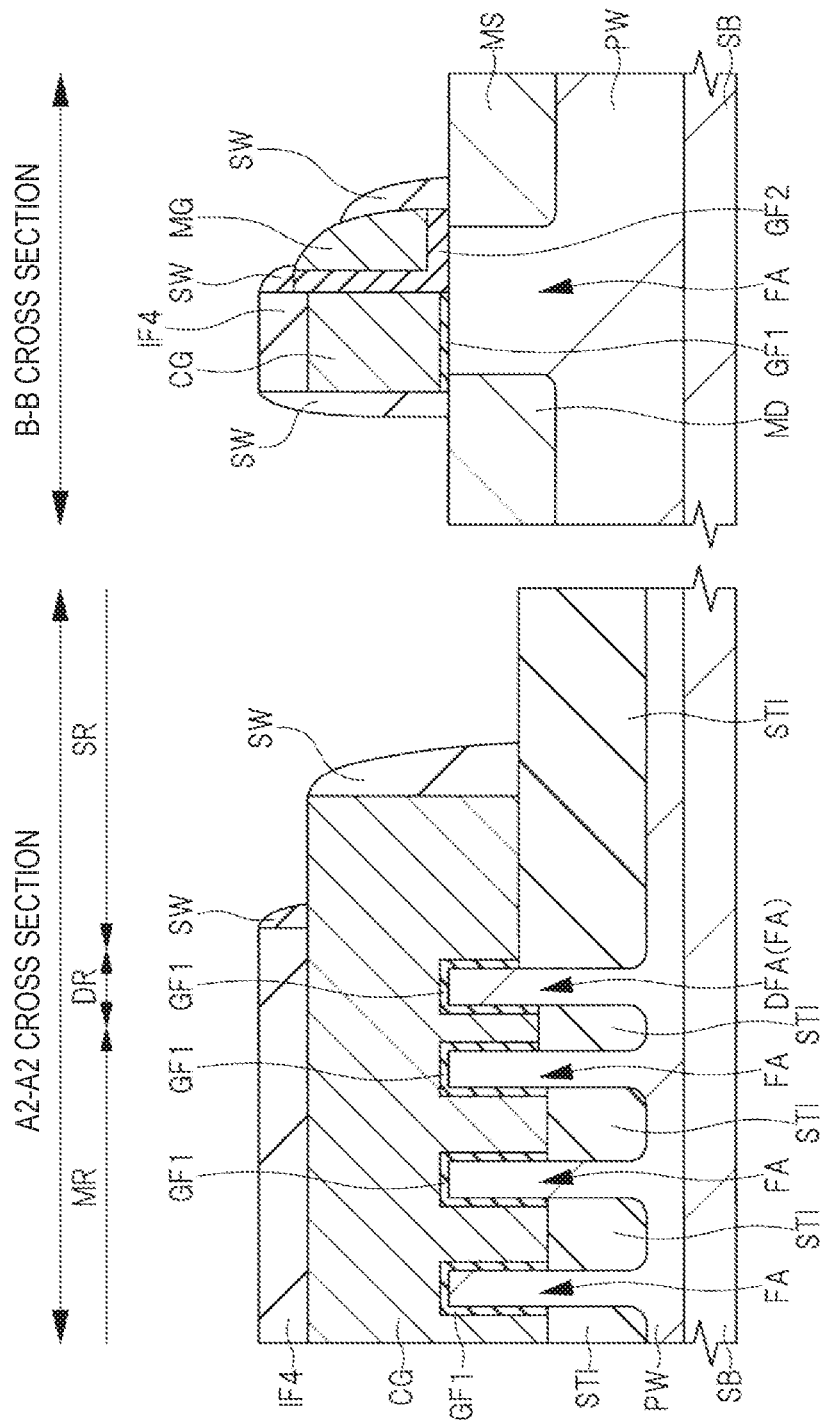
FIG. 25 is a cross-sectional view for explaining the manufacturing step of the semiconductor device following FIG. 24.

FIG. 25 shows steps of forming sidewall spacers SW, diffusion regions MS, and diffusion regions MD.

First, an insulating film made of, for example, silicon nitride is formed by, for example, CVD method so as to cover the memory cell MC. Next, anisotropic etching is performed on the insulating film to form sidewall spacers SW on the side surface of the control gate electrode CG and the side surface of the memory gate electrode MG. The sidewall spacers SW may be a stacked film of a silicon oxide film and a silicon nitride film. That is, a silicon oxide film may be formed, a silicon nitride film may be formed on the silicon oxide film, and then anisotropic etching may be performed to form the sidewall spacers SW formed of the stacked film thereof.

Next, arsenic (As) or phosphorus (P), for example, is introduced into the fin FA by photolithography and ion implantation to form an n-type diffusion region MS and an n-type diffusion region MD in the fin FA. Thereafter, heat treatment is performed on the semiconductor substrate SB to activate the impurities contained in the diffusion region MS and the diffusion region MD, to diffuse the diffusion region MS to under the memory gate electrode MG, and to diffuse the diffusion region MD to under the control gate electrode CG.

Figure 26:
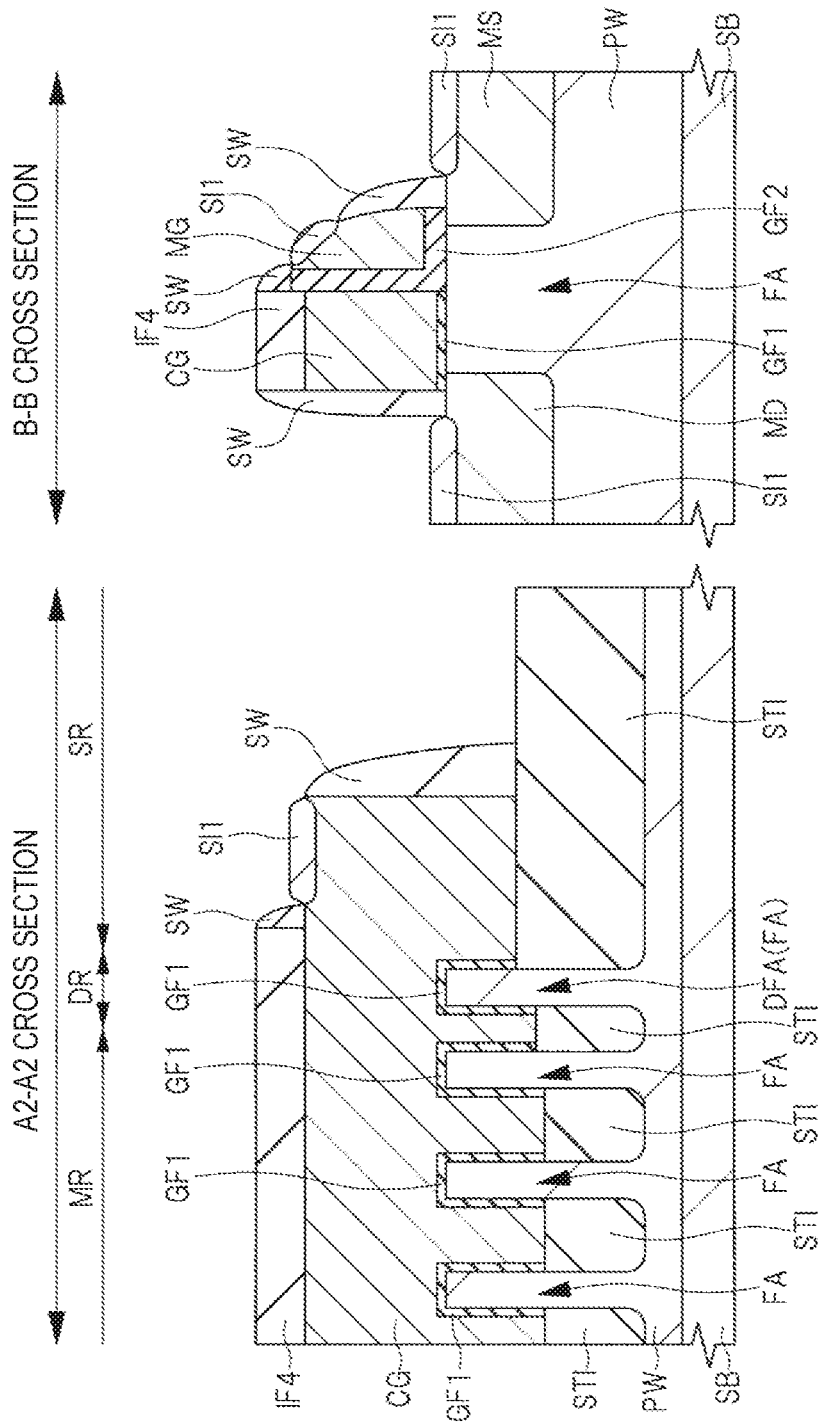
FIG. 26 is a cross-sectional view for explaining the manufacturing step of the semiconductor device following FIG. 25.

FIG. 26 shows a step of forming silicide layers SI1.

By Salicide (Self Aligned Silicide) technique, the low-resistance silicide layers SI1 can be formed on the memory gate electrodes MG, the diffusion regions MD, the diffusion regions MS, and the control gate electrodes CG in the shunt regions SR.

Specifically, the silicide layers SI1 can be formed as follows. First, a silicon oxide film, for example, is formed as an insulating film for preventing the silicide layer SI1 from being formed on the entire main surface of the semiconductor substrate SB by CVD method. Next, the insulating film is selectively patterned to open only regions where the silicide layers SI1 are to be formed. Next, a metal film for forming silicide layers SI1 is formed so as to cover the entire main surface of the semiconductor substrate SB. The metal film is made of, for example, cobalt, nickel, or nickel platinum alloy. Next, the semiconductor substrate SB is subjected to a first heat treatment at about 300° C. to 400° C., and then subjected to a second heat treatment at about 600° C. to 700° C., whereby the metal film is reacted with materials included in each of the control gate electrode CG, the memory gate electrode MG, the diffusion region MD, and the diffusion region MS. Silicide layers SI1 made of cobalt silicide ($CoSi_2$), nickel silicide (NiSi) or nickel platinum silicide (NiPtSi) are formed on the control gate electrode CG, on the memory gate electrode MG, on the diffusion region MD, and on the diffusion region MS. Thereafter, the unreacted metal film is removed, and subsequently, the insulating film for preventing the silicide layers SI1 from being formed is removed.

Figure 27:
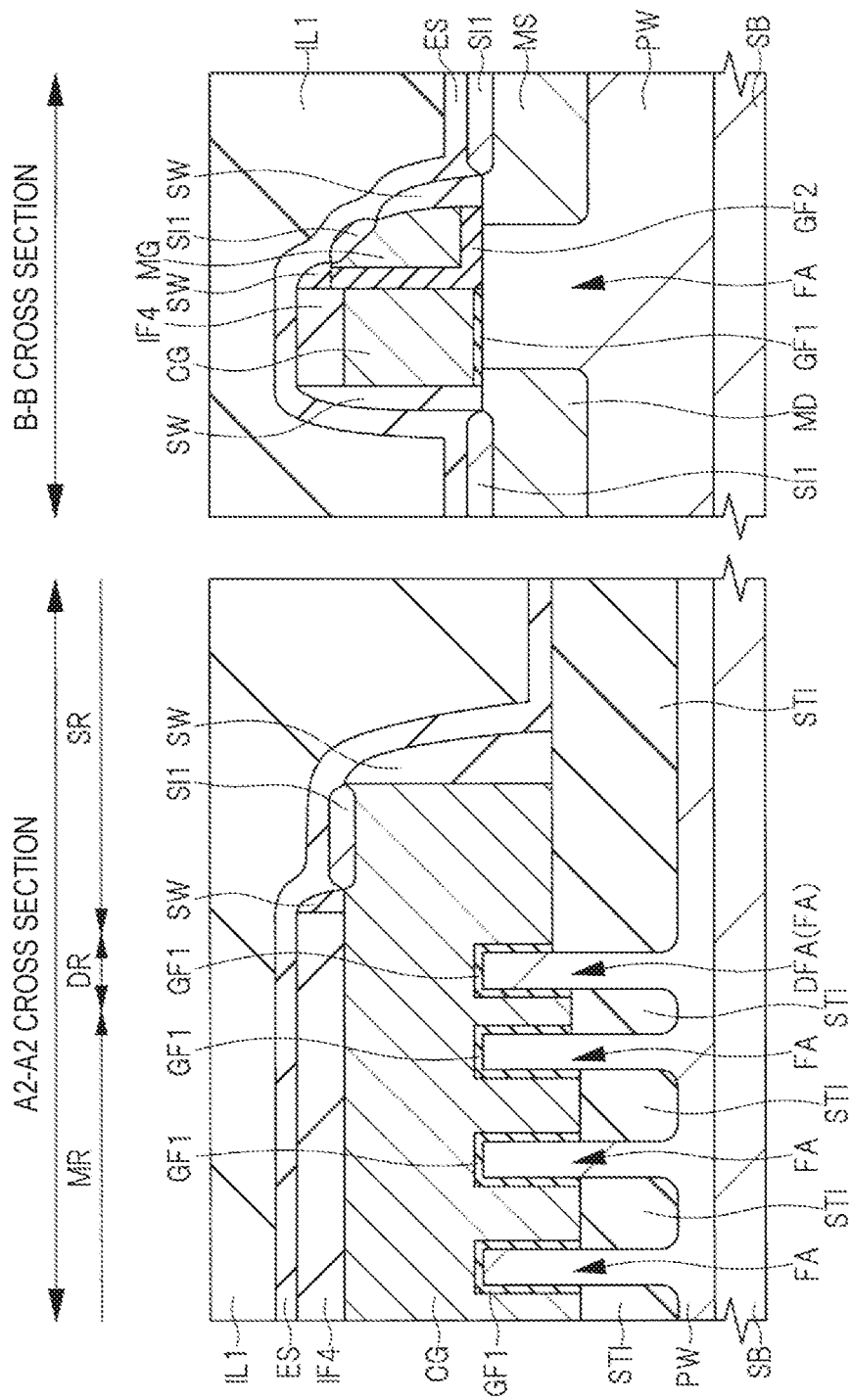
FIG. 27 is a cross-sectional view for explaining the manufacturing step of the semiconductor device following FIG. 26.

FIG. 27 shows steps of forming an etching stopper film ES and an interlayer insulating film IL1.

First, the etching stopper film ES formed of an insulating film such as a silicon nitride film is formed by, for example, CVD method so as to cover the memory cell MC. Next, an interlayer insulating film IL1 formed of, for example, a silicon oxide film is formed on the etching stopper film ES by, for example, CVD method. Next, the interlayer insulating film IL1 is polished by CMP method or the like to planarize the upper surface of the interlayer insulating film IL1.

Following the manufacturing step of FIG. 27, plugs PG are formed in the interlayer insulating film IL1 to obtain the structure shown in FIG. 5.

First, contact holes are formed in the interlayer insulating film IL1 and the etching stopper film ES, and the plugs PG are embedded in the contact holes. The plugs PG are made of, for example, a barrier metal film formed of a titanium film, a titanium nitride film, or a stacked film thereof, and a conductor film such as tungsten. Thereafter, first-layer wirings to be connected to the plugs PG are formed, and second-layer wirings are formed on the plugs PG by Dual Damascene method or the like, but the explanation and illustration thereof are omitted here.

As described above, the semiconductor device of the present embodiment is manufactured.

First Modification

Hereinafter, a method for manufacturing a semiconductor device according to first modification will be described with reference to FIGS. 28 to 31. In the following explanation, differences from the first embodiment will be mainly explained.

In the first embodiment, one of the plurality of mask patterns MP is set to be a mask pattern MP having a short length, so that the distance between the hard masks HM formed on both side surfaces of the mask pattern MP having a short length is set to be a short distance L2. That is, the distance L2 is adjusted according to the length of the mask pattern MP. On the other hand, in the first modification, the distance L2 is adjusted by the distance between two mask patterns MP adjacent to each other.

Figure 28:
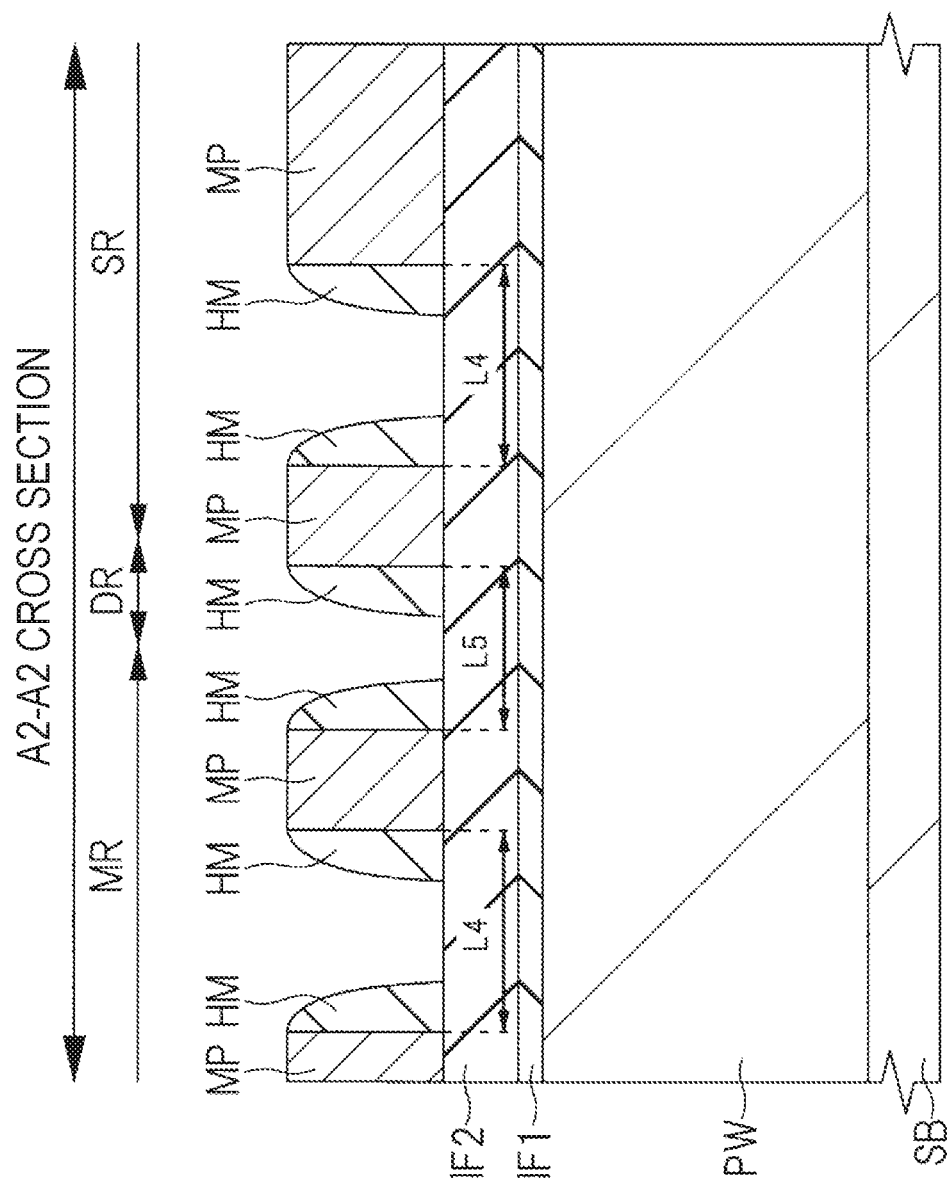
FIG. 28 is a cross-sectional view showing the manufacturing step of a semiconductor device according to a first modification.

As shown in FIG. 28, first, a plurality of mask patterns MP are formed so that a distance L5 between two mask patterns MP in the vicinity of the dummy cell region DR is shorter than a distance L4 at which the other plurality of mask patterns MP are adjacent to each other. Next, a plurality of hard masks HM are formed on the side surfaces of the plurality of mask patterns MP by a method similar to the step of FIG. 10 of the first embodiment.

Here, in the region indicated by the distance L5, a hard mask HM for forming the dummy fin DFA and a hard mask HM for forming the fin FA closest to the dummy fin DFA are formed.

Figure 29:
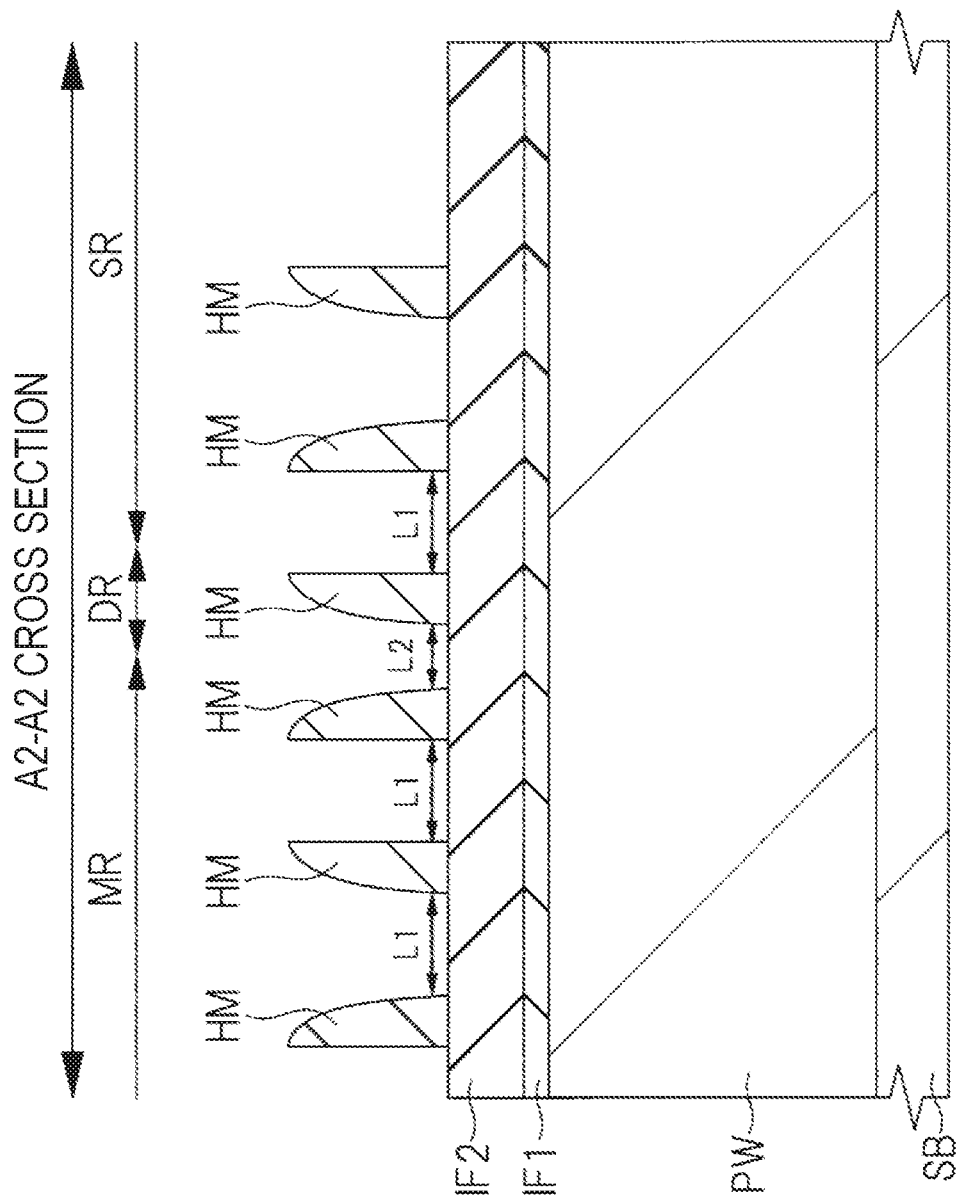
FIG. 29 is a cross-sectional view for explaining the manufacturing step of the semiconductor device following FIG. 28.

Next, as shown in FIG. 29, the plurality of mask patterns MP are removed by the same technique as in FIG. 11 of first embodiment. Thereby, the distance between the hard mask HM for forming the dummy fin DFA and the hard mask HM for forming the fin FA closest to the dummy fin DFA can be set to the distance L2, and the distance L2 can be made shorter than the distance L1 at which the other plurality of hard masks HM are adjacent to each other.

Figure 30:
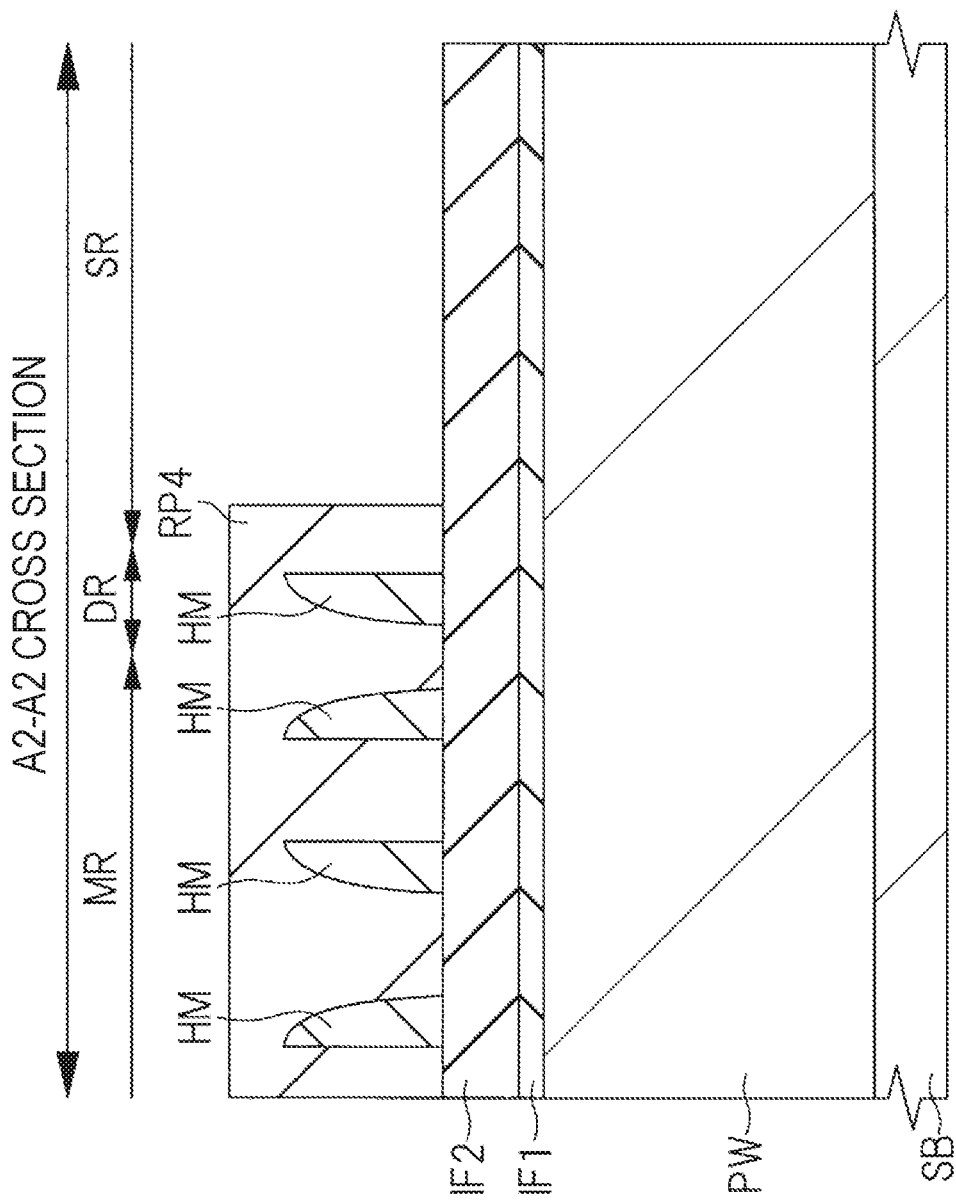
FIG. 30 is a cross-sectional view for explaining the manufacturing step of the semiconductor device following FIG. 29.

Thereafter, as shown in FIG. 30, a resist pattern RP4 covering the hard masks HM formed in the memory cell forming region MR and the dummy cell region DR and opening the hard masks HM formed in the shunt region SR is formed. Next, dry etching is performed using the resist pattern RP4 as a mask to remove the hard masks HM in the shunt region SR. Thereafter, the resist pattern RP4 is removed by asking or the like.

Figure 31:
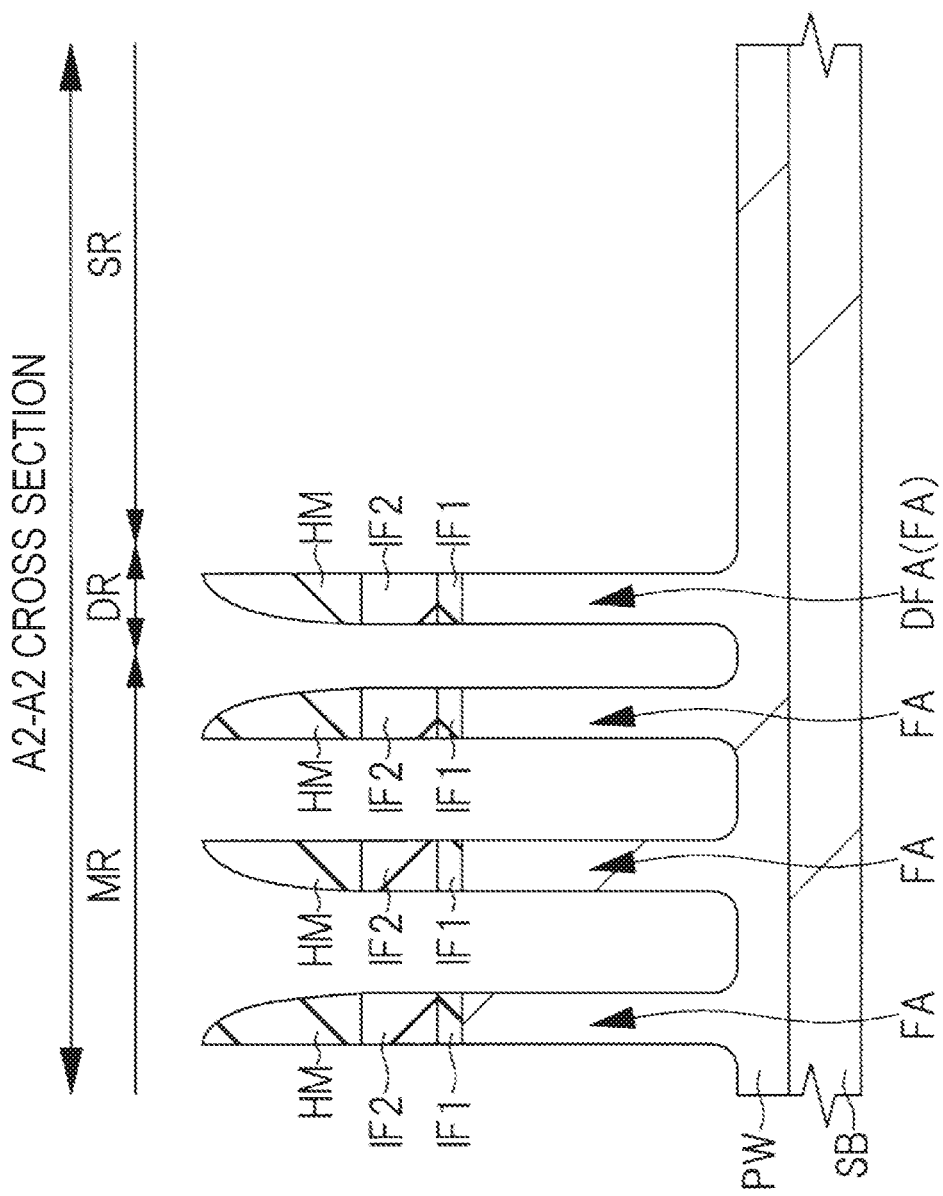
FIG. 31 is a cross-sectional view for explaining the manufacturing step of the semiconductor device following FIG. 30.

Next, as shown in FIG. 31, anisotropic etching is performed using the hard masks HM as a mask, whereby the insulating film IF2 and the insulating film IF1 which are not covered with the hard masks HM are sequentially removed, and a part of the upper surface of the semiconductor substrate SB is etched. A plurality of fins FA which are parts of the semiconductor substrate SB and protrude from the upper surface of the retracted semiconductor substrate SB are formed.

The subsequent manufacturing steps are the same as the manufacturing steps of the first embodiment from FIG. 16 onward.

Second Modification

Hereinafter, a semiconductor device and a method for manufacturing the same according to the second modification will be described with reference to FIGS. 32 to 34. In the following explanation, differences from the first embodiment will be mainly explained.

In the first embodiment, the insulating film IF4 is formed on the control gate electrode CG, and the silicide layer SI1 is formed in a portion where a part of the insulating film IF4 is opened and the control gate electrode CG is exposed in the shunt region SR. That is, the low-resistance silicide layer SI1 is formed only at the portion where the control gate electrode CG and the plug PG are connected to each other. On the other hand, in second modification, low-resistance silicide layers SI2 are formed on the entire upper surfaces of the control gate electrodes CG.

Figure 32:
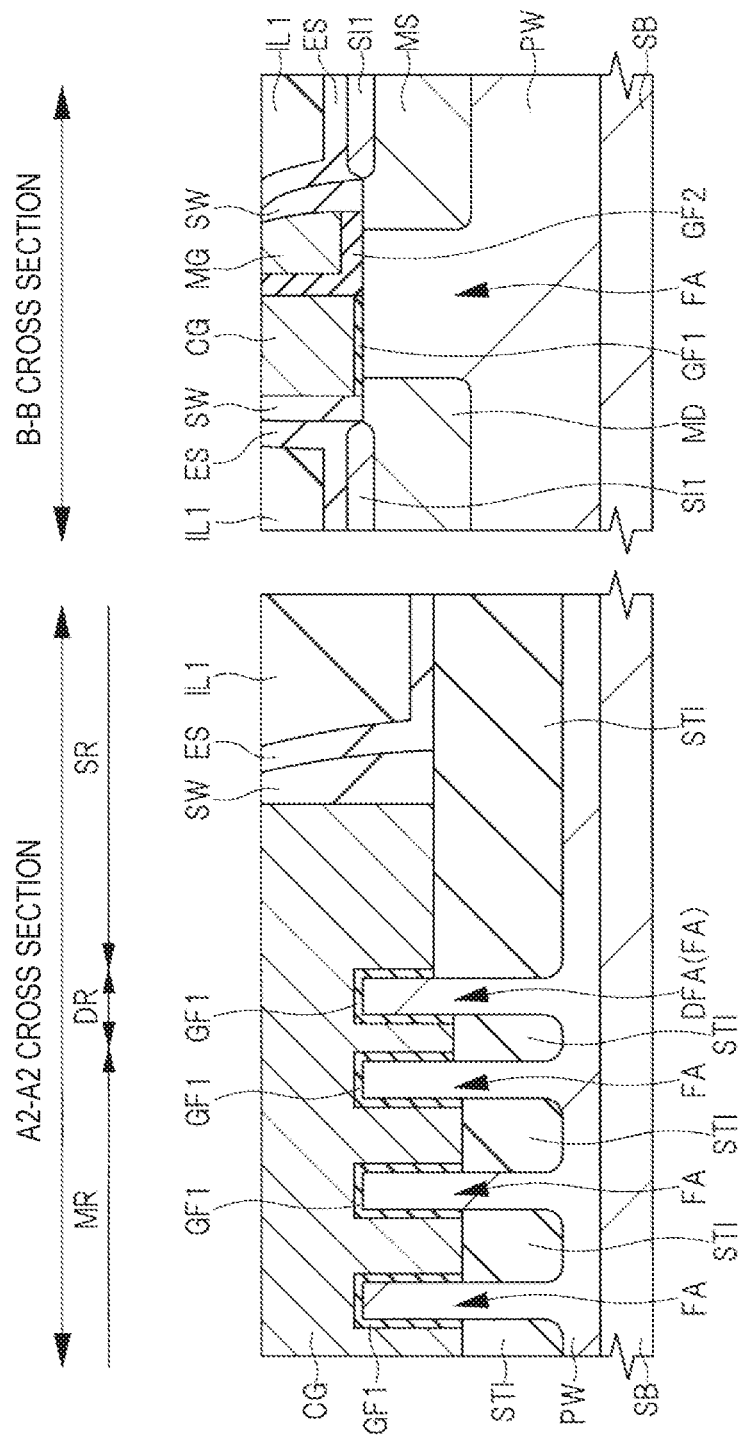
FIG. 32 is a cross-sectional view showing the manufacturing step of a semiconductor device according to a second modification.

FIG. 32 shows the manufacturing step following FIG. 27 of the first embodiment. As shown in FIG. 32, the interlayer insulating film IL1, the etching stopper film ES, the insulating film IF4 and the sidewall spacers SW formed on the control gate electrode CG and the memory gate electrode MG are polished by CMP method. At this time, a part of the control gate electrode CG and a part of the memory gate electrode MG are also polished to expose the upper surface of the control gate electrode CG and the upper surface of the memory gate electrode MG.

Figure 33:
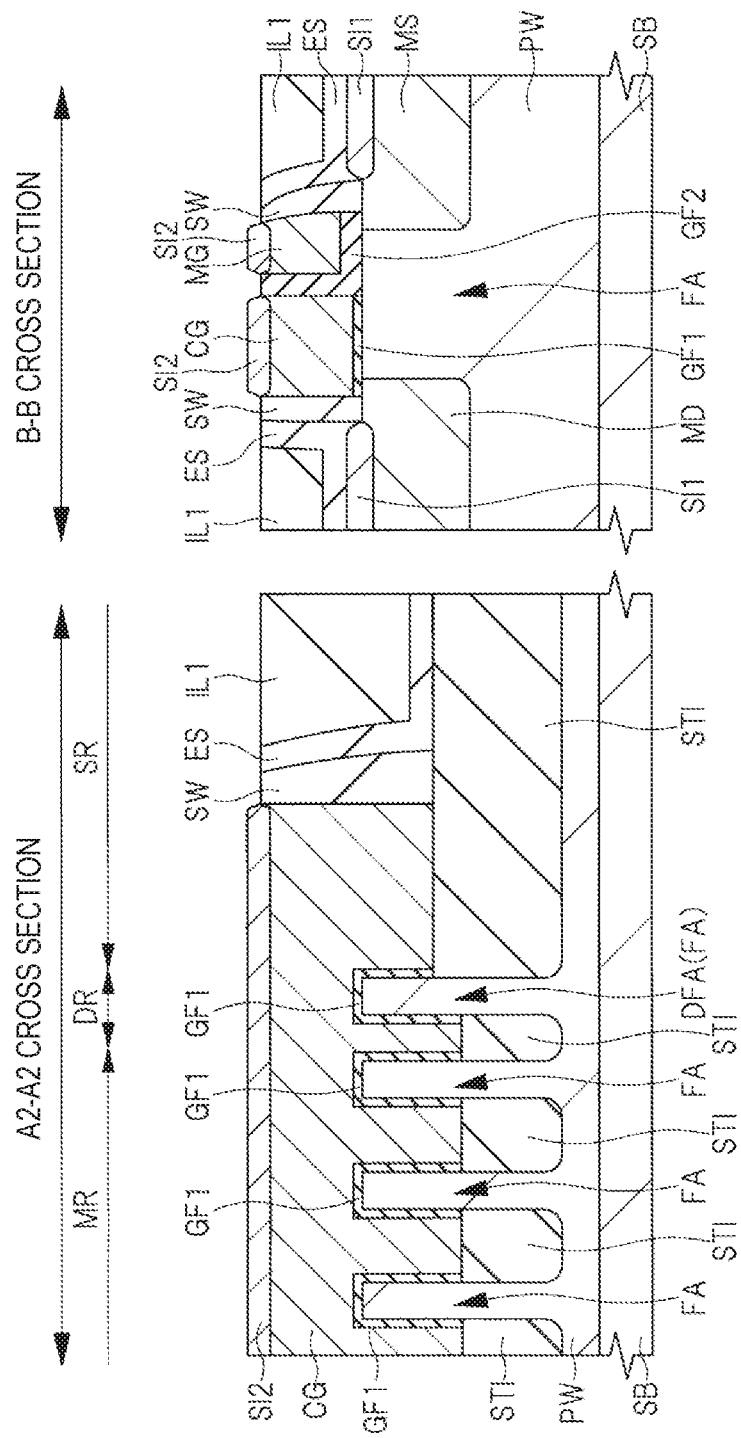
FIG. 33 is a cross-sectional view for explaining the manufacturing step of the semiconductor device following FIG. 32.

Next, as shown in FIG. 33, silicide layers SI2 are formed on the upper surface of each of the control gate electrodes CG and the memory gate electrodes MG. As a material constituting the silicide layers SI2, a material similar to that of the silicide layer SI1 can be used, and is made of, for example, cobalt silicide (CoSi$_2$), nickel silicide (NiSi) or nickel platinum silicide (NiPtSi). In the step of forming the silicide layers SI2, the same technique as the silicide layer SI1 can be used.

Figure 34:
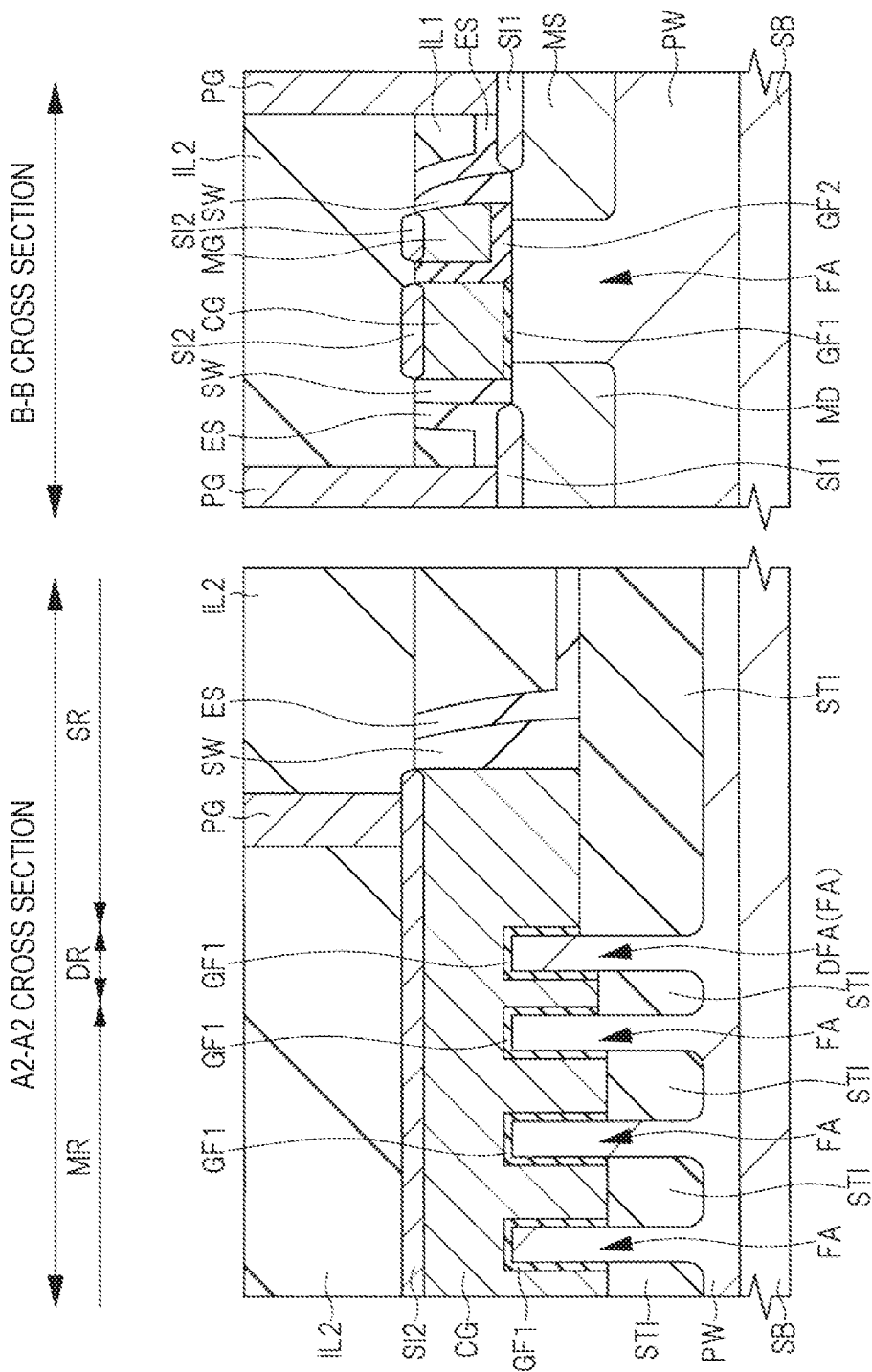
FIG. 34 is a cross-sectional view for explaining the manufacturing step of the semiconductor device following FIG. 33.

Next, as shown in FIG. 34, an interlayer insulating film IL2 formed of, for example, a silicon oxide film is formed on the silicide layers SI2 and the interlayer insulating film IL1 by, for example, CVD method. Next, the interlayer insulating film IL2 is polished by CMP method or the like to planarize the upper surface of the interlayer insulating film IL2. Next, contact holes are formed in the interlayer insulating film IL2, the interlayer insulating film IL1, and the etching stopper film ES, and the plugs PG are embedded in the contact holes.

Thus, second modification has more manufacturing steps and more manufacturing costs than the first embodiment. However, according to the second modification, since the low-resistance silicide layers SI2 can be formed on the entire upper surfaces of the control gate electrodes CG, the resistance of the control gate electrodes CG can be reduced.

Although the silicide layers SI2 are used in the second modification, the conductor films constituting the control gate electrodes CG and the memory gate electrodes MG may be replaced with metal films. For example, after the step of FIG. 32, the polycrystalline silicon films constituting the control gate electrodes CG and the memory gate electrodes MG are selectively removed, and the metal films are embedded in a region from which the control gate electrodes CG and the memory gate electrodes MG are removed, whereby the metal films can be used as the gate electrodes. As such a material, for example, a tantalum nitride film, a titanium aluminum film, a titanium nitride film, a tungsten film, or a single-layer metal film formed of an aluminum film, or a stacked-layer metal film formed by stacking these films as appropriate may be used.

The technique described in the second modification may be applied to the semiconductor device of the first modification.

Second Embodiment

Hereinafter, a semiconductor device and a method for manufacturing the same according to second embodiment will be described with reference to FIGS. 35 to 42. In the following explanation, differences from the first embodiment will be mainly explained.

In the first embodiment, the distance L2 between the fin FA and the dummy fin DFA is smaller than the distance L1 between the other fins FA. On the other hand, in the second embodiment, the distance between the plurality of fins FA including the dummy fin DFA is made equal to the distance L1, and the element isolation portions STI are formed between the fins FA in a manner differing from that of the first embodiment.

Figure 35:
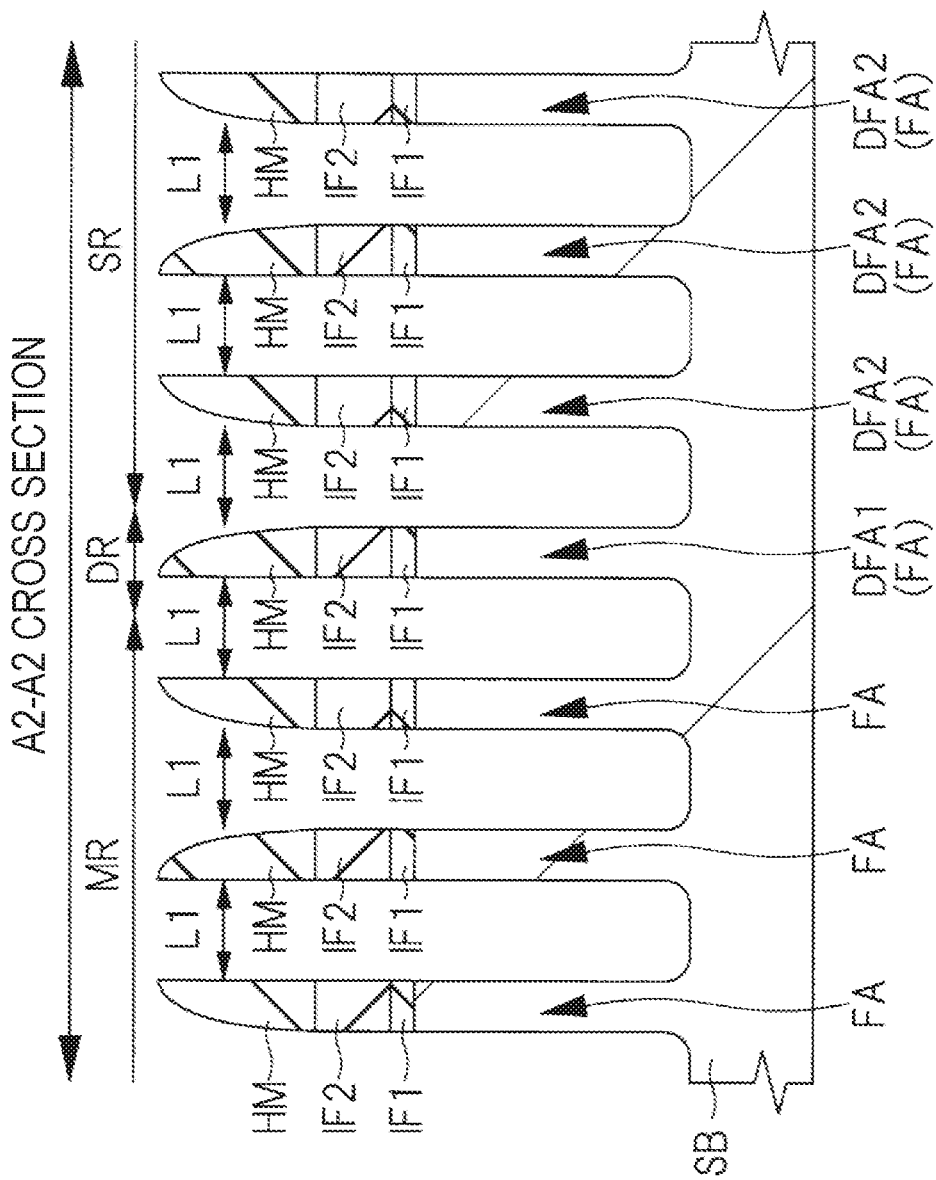
FIG. 35 is a cross-sectional view showing the manufacturing step of a semiconductor device according to a second embodiment.

FIG. 35 shows a state in which a plurality of hard masks HM are formed at equal distances L1 from each other, and a plurality of fins FA are formed using these hard masks HM as masks. In the second embodiment, unlike the first embodiment, a plurality of hard masks HM are formed not only in the memory cell forming region MR and the dummy cell region DR, but also in the shunt region SR. Therefore, a dummy fin DFA1 is formed in the dummy cell region DR, and a plurality of dummy fins DFA2 are formed in the shunt region SR.

Figure 36:
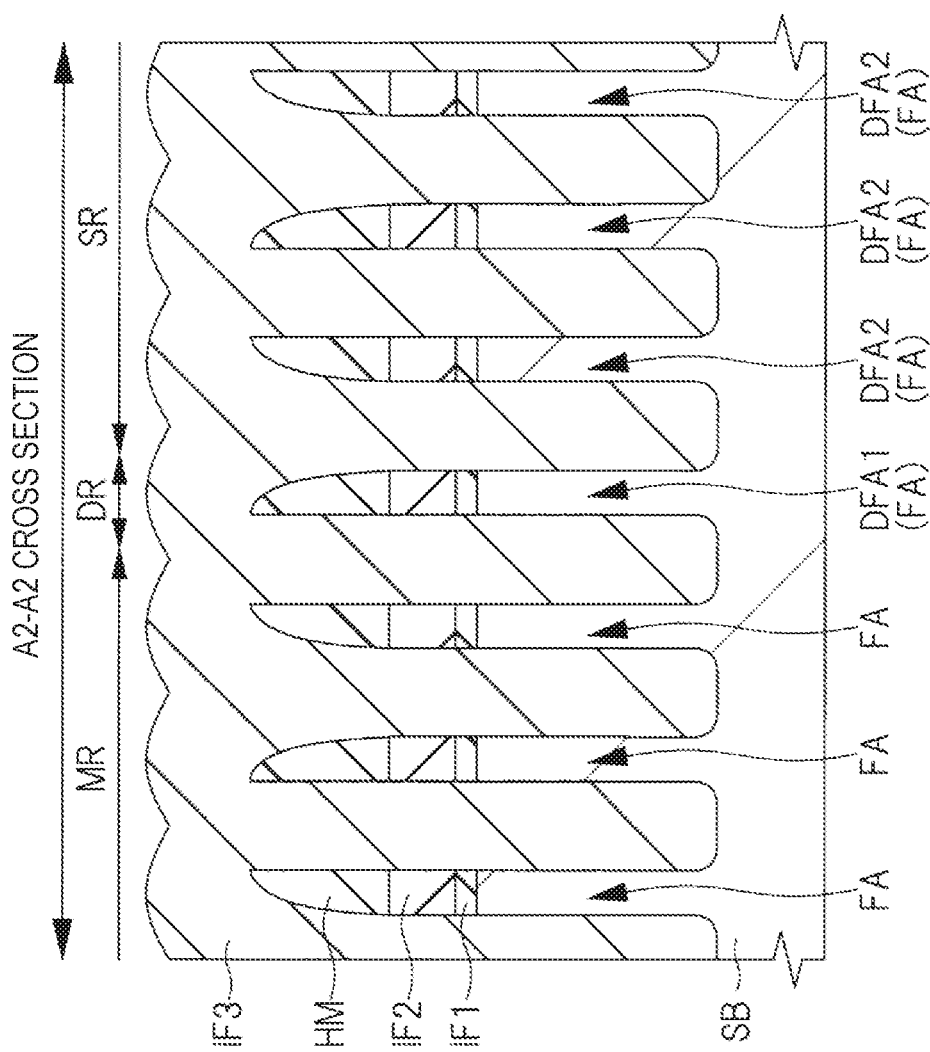
FIG. 36 is a cross-sectional view for explaining the manufacturing step of the semiconductor device following FIG. 35.

FIG. 36 shows a step of forming an insulating film IF3.

First, an insulating film IF3 such as a silicon oxide film is formed on the semiconductor substrate SB by, for example, CVD method so as to embed spaces between a plurality of fins FA including the dummy fin DFA1 and the dummy fins DFA2 and cover the hard masks HM formed on the upper surfaces of the fins FA. Next, the insulating film IF3 is subjected to densifying annealing similar to that of the first embodiment to cure the film quality of the insulating film IF3. In the second embodiment, since the fins FA are formed at equal intervals from each other, the film quality of the insulating film IF3 is substantially the same at any point after the densifying annealing. However, similarly to the first embodiment, although the vicinity of the upper surface of the insulating film IF3 is cured, heat is difficult to be sufficiently transferred to the insulating film IF3 between the fins FA, and therefore the film quality of the insulating film IF3 embedded between the fins FA is relatively soft.

Figure 37:
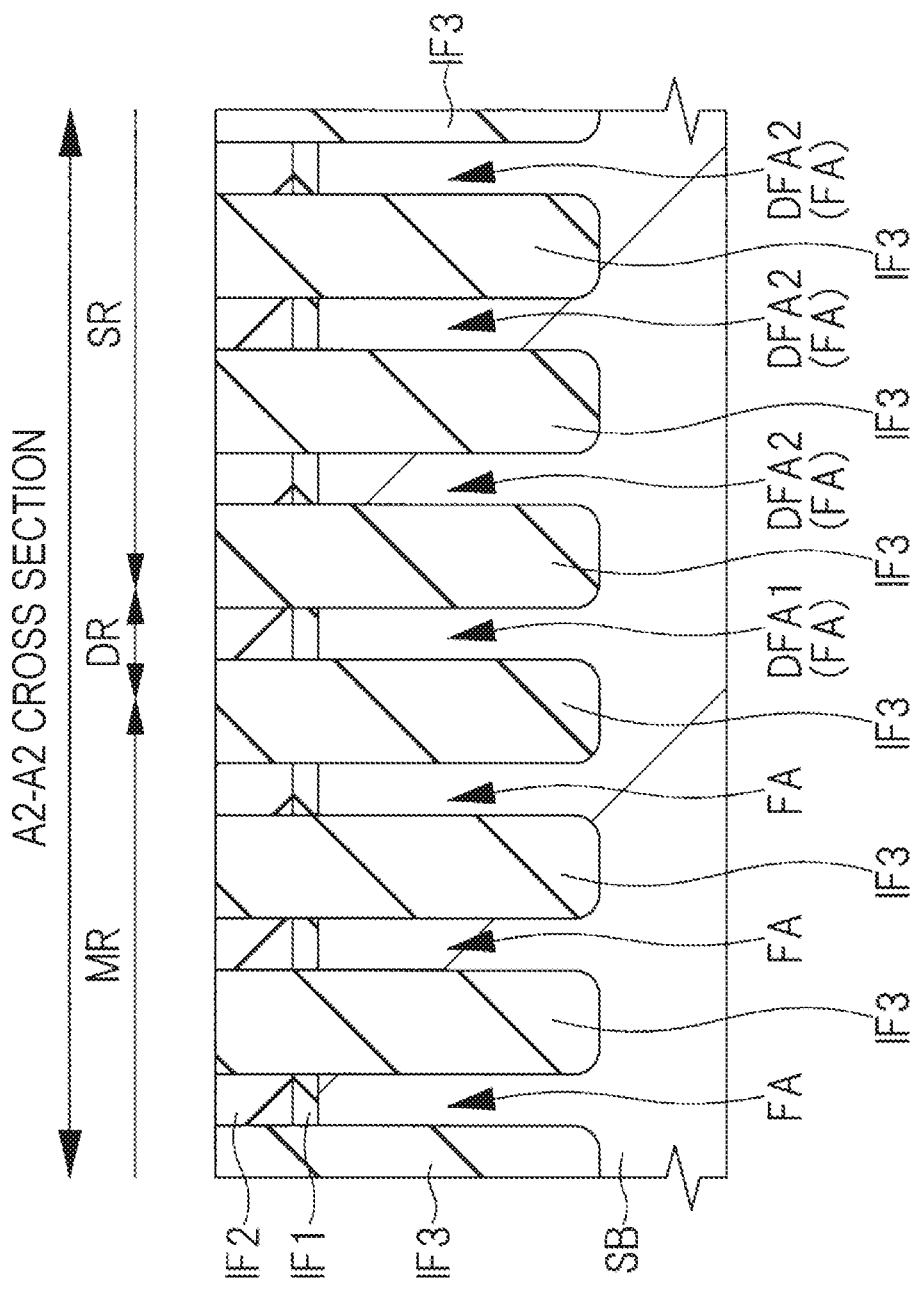
FIG. 37 is a cross-sectional view for explaining the manufacturing step of the semiconductor device following FIG. 36.

FIG. 37 shows a step of polishing the insulating film IF3 and the hard masks HM.

The insulating film IF3 is polished by CMP method to planarize the upper surface of the insulating film IF3. At this time, the insulating film IF2 serves as a stopper film for the polishing process, and the hard masks HM are removed.

Figure 38:
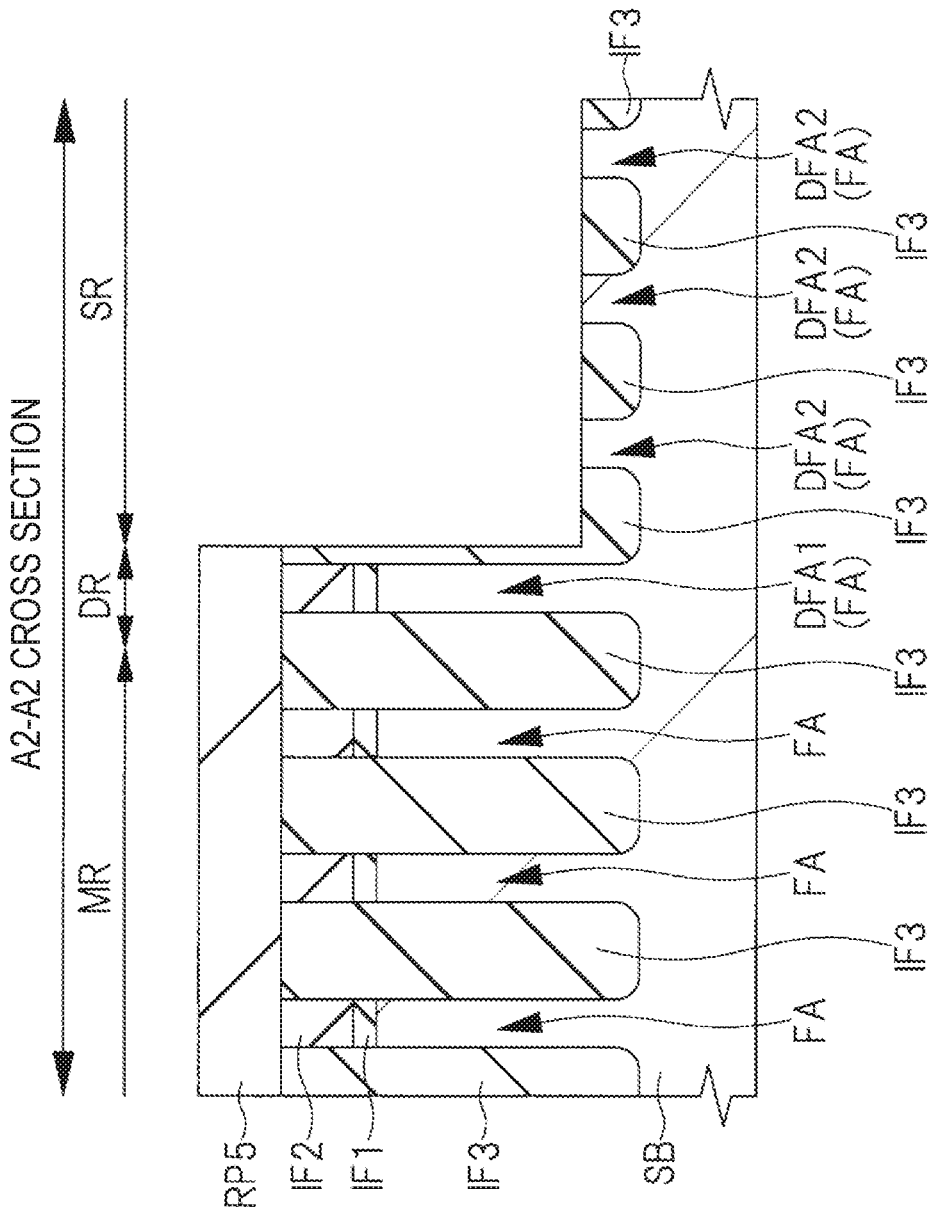
FIG. 38 is a cross-sectional view for explaining the manufacturing step of the semiconductor device following FIG. 37.

FIG. 38 shows a step of removing the insulating film IF3 and the dummy fins DFA2 in the shunt region SR.

First, a resist pattern RP5 covering the memory cell forming region MR and the dummy cell region DR and opening the shunt region SR is formed. Next, anisotropic etching is performed using the resist pattern RP5 as a mask to etch the insulating film IF3 and the dummy fins DFA2 exposed from the resist pattern RP5. At this time, the insulating film IF3 and the dummy fins DFA2 are not completely removed, and a part of them remains in the shunt region SR. That is, in the shunt region SR, a plurality of dummy fins DFA2 having a height lower than that of the plurality of fins FA formed in the memory cell forming region MR and that of the dummy fins DFA1 formed in the dummy cell region DR are formed. Thereafter, the resist pattern RP5 is removed by asking or the like.

Figure 39:
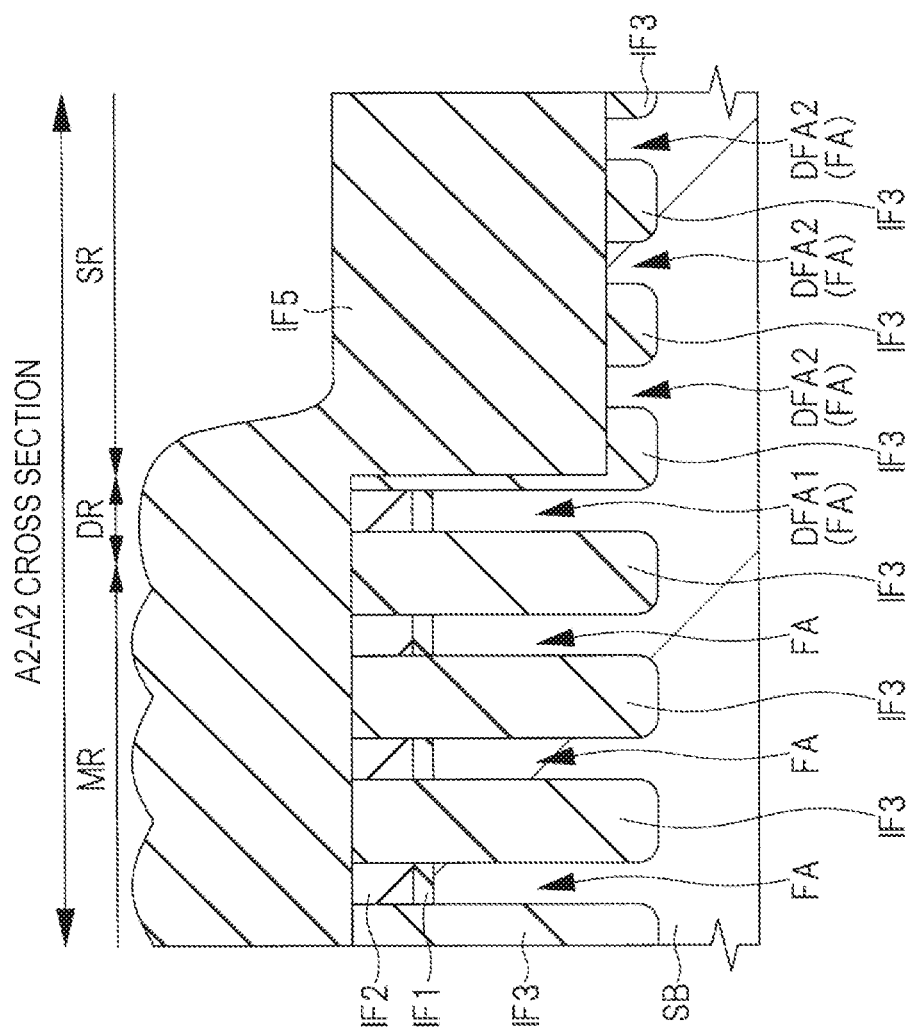
FIG. 39 is a cross-sectional view for explaining the manufacturing step of the semiconductor device following FIG. 38.

FIG. 39 shows a step of forming an insulating film IF5.

First, an insulating film IF5 such as, for example, a silicon oxide film is formed on the insulating film IF3 in the memory cell forming region MR by, for example, CVD method so as to embed a region where the insulating film IF3 and the dummy fins DFA2 in the shunt region SR are etched. Next, the insulating film IF5 is subjected to densifying annealing to cure the film quality of the insulating film IF5.

Here, in the memory cell forming region MR, although the insulating film IF5 on the upper surfaces of the fins FA is cured, heat is not sufficiently transferred to the insulating film IF3 between the fins FA, and the insulating film IF3 between the fins FA includes a portion where the insulating film IF3 is not sufficiently cured. Therefore, the insulating film IF3 in the memory cell forming region MR and the insulating film IF3 in the shunt region SR are softer than the insulating film IF5 in the shunt region SR, and are easily etched by dry etching.

Figure 40:
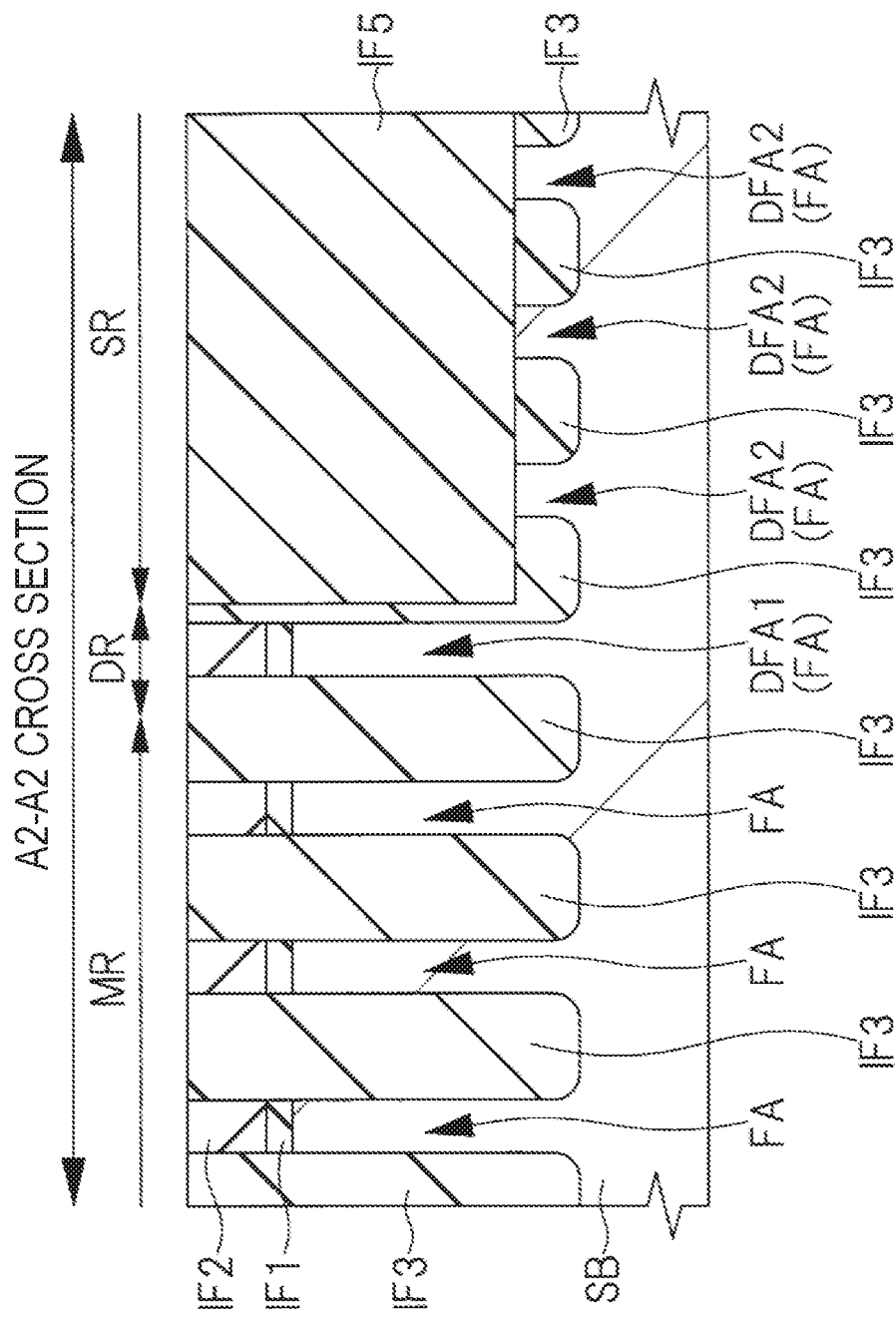
FIG. 40 is a cross-sectional view for explaining the manufacturing step of the semiconductor device following FIG. 39.

FIG. 40 shows a step of polishing the insulating film IF5.

The insulating film IF5 is polished by CMP method to planarize the upper surface of the insulating film IF5. At this time, the insulating film IF2 serves as a stopper film for the polishing process. As a result, in the memory cell forming region MR and the dummy cell region DR, the upper surface of the insulating film IF3 and the upper surfaces of the hard masks HM are exposed, and in the shunt region SR, the insulating film IF5 is formed so as to cover the upper surface of each of the remaining insulating film IF3 and the dummy fins DFA2.

Figure 41:
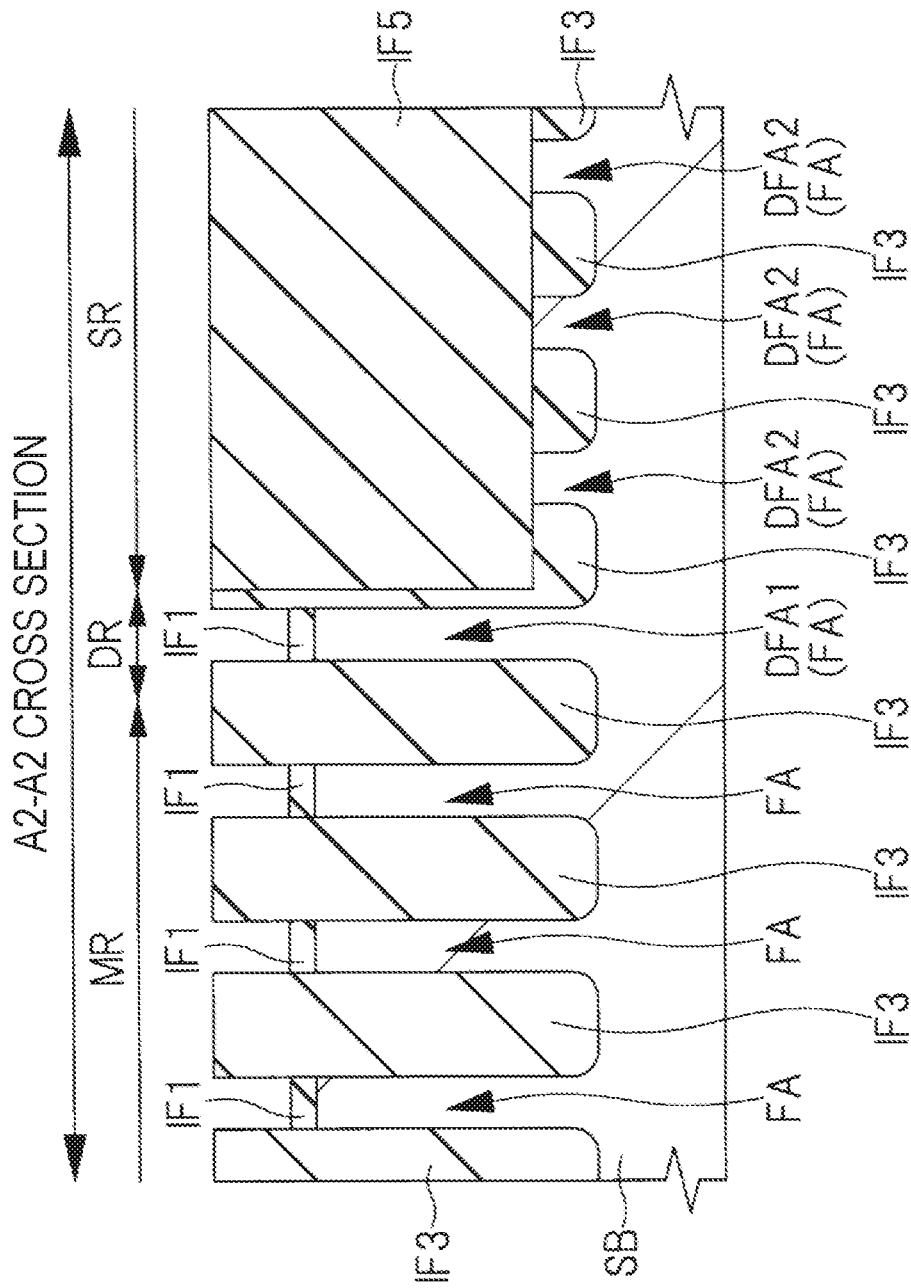
FIG. 41 is a cross-sectional view illustrating the manufacturing step of the semiconductor device following FIG. 40.

FIG. 41 shows a step of removing the hard masks HM.

The exposed hard masks HM in the memory cell forming region MR and the dummy cell region DR are removed by wet etching.

Figure 42:
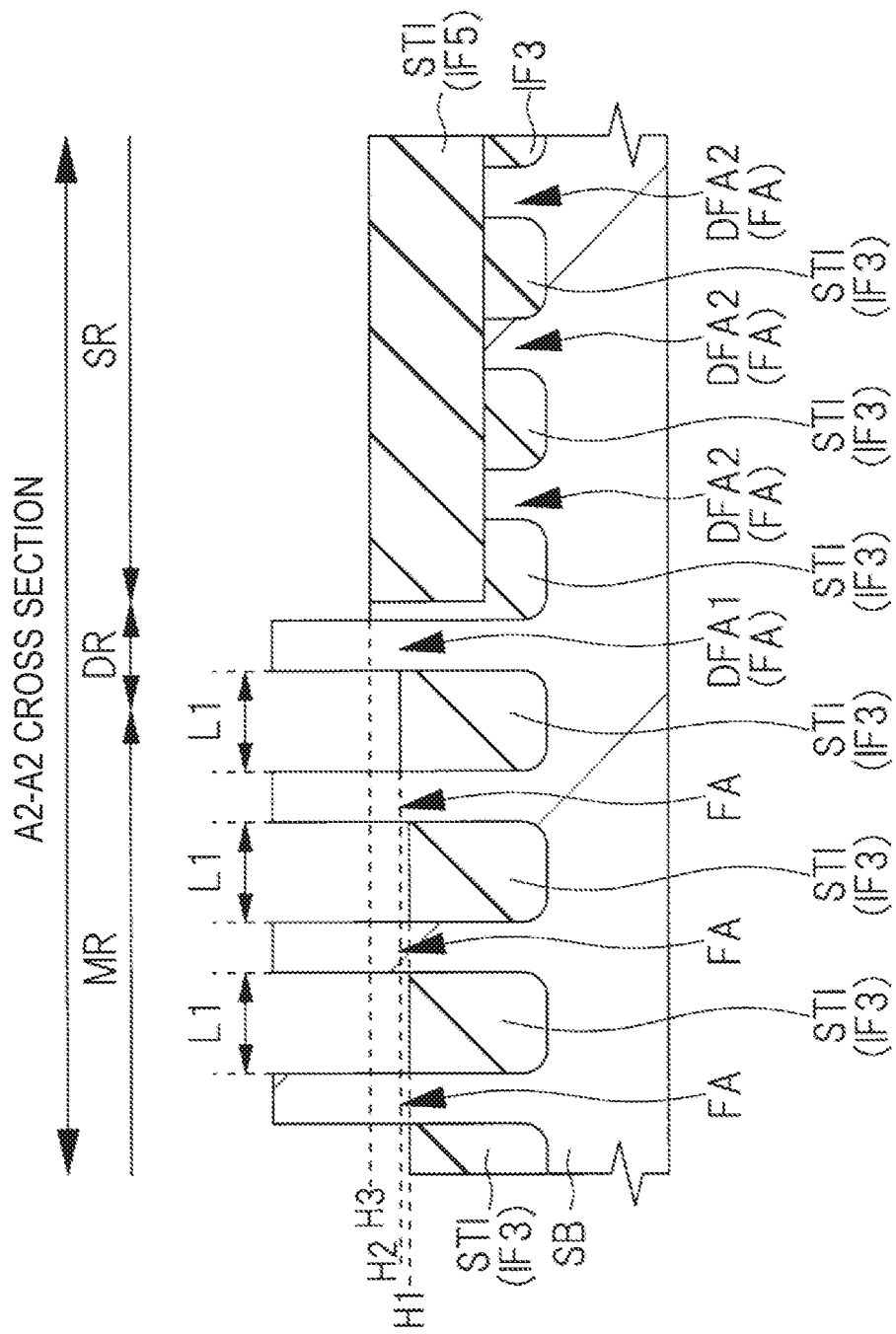
FIG. 42 is a cross-sectional view for explaining the manufacturing step of the semiconductor device following FIG. 41.

FIG. 42 shows a step of forming element isolation portions STI.

The insulating film IF3 and the insulating film IF5 are etched by anisotropic etching so that the position of the upper surface of each of the insulating film IF3 and the insulating film IF5 is lower than the position of the upper surface of each of the plurality of fins FA. As a result, the upper portions of the plurality of fins FA protrude from the upper surface of each of the insulating film IF3 and the insulating film IF5 that have been removed. In this manner, the element isolation portions STI embedded between the plurality of fins FA are formed. The insulating films IF1 formed on the upper surfaces of the fins FA are also removed by the anisotropic etching.

The subsequent manufacturing steps are the same as the manufacturing steps of the first embodiment from FIG. 18 onward.

As described above, in the region where the fins FA are not formed as in the shunt region SR, since the area of the insulating film IF5 is large, the dry etching tends to proceed slower than in the region where the area of the insulating film IF3 is small as between the fins FA. That is, in the dry etching, the progress of the dry etching tends to be different depending on the interval between the plurality of adjacent fins FA. In a region adjacent to a region having a large area, such as between the dummy fin DFA and the fin FA, the progress of the dry etching tends to slow down due to the influence of the dry etching of the region having a large area.

In the second embodiment, since the insulating films IF3 are formed between the fins FA arranged at equal intervals in the step of FIG. 37, the film quality of each of the insulating films IF3 is substantially the same. The film quality of each of the insulating films IF3 is softer than the film quality of the insulating film IF5 formed in the shunt region SR. That is, in the insulating film IF3 formed between the fin FA and the dummy fin DFA1, dry etching proceeds faster as in the case of the insulating film IF3 formed between the other fins FA.

Therefore, when the insulating film IF3 and the insulating film IF5 are removed in the step of FIG. 42, the position of the upper surface of the element isolation portions STI formed between the plurality of fins FA adjacent to each other and the position of the upper surface of the element isolation portion STI formed between the fin FA and the dummy fin DFA1 can be made lower than the position of the upper surface of the element isolation portion STI formed in the shunt region SR. Therefore, it is possible to suppress a problem in which the drain current of each memory cell MC varies in the entire memory cell forming region MR.

Similarly to the first embodiment, when the position of the upper surface of the element isolation portion STI formed between the plurality of fins FA adjacent to each other is H1, the position of the upper surface of the element isolation portion STI formed between the fin FA and the dummy fin DFA1 is H2, and the position of the upper surface of the element isolation portion STI formed in the shunt region SR is H3, the absolute value of (H2−H1) is smaller than the absolute value of (H3−H2). The absolute value of (H2−H1) is preferably less than ½ of the absolute value of (H3−H1), and more preferably less than ¼ of the absolute value of (H3−H1). It is most preferable that the absolute value of (H2−H1) is zero.

Third Modification

Hereinafter, a method for manufacturing a semiconductor device according to third modification will be described with reference to FIG. 43. In the following explanation, differences from the second embodiment will be mainly explained.

In the second embodiment, parts of the dummy fins DFA2 to be etched in the step of FIG. 38 is left in the shunt region SR. On the other hand, in third modification, the dummy fins DFA2 to be etched are not left in the shunt region SR.

Figure 43:
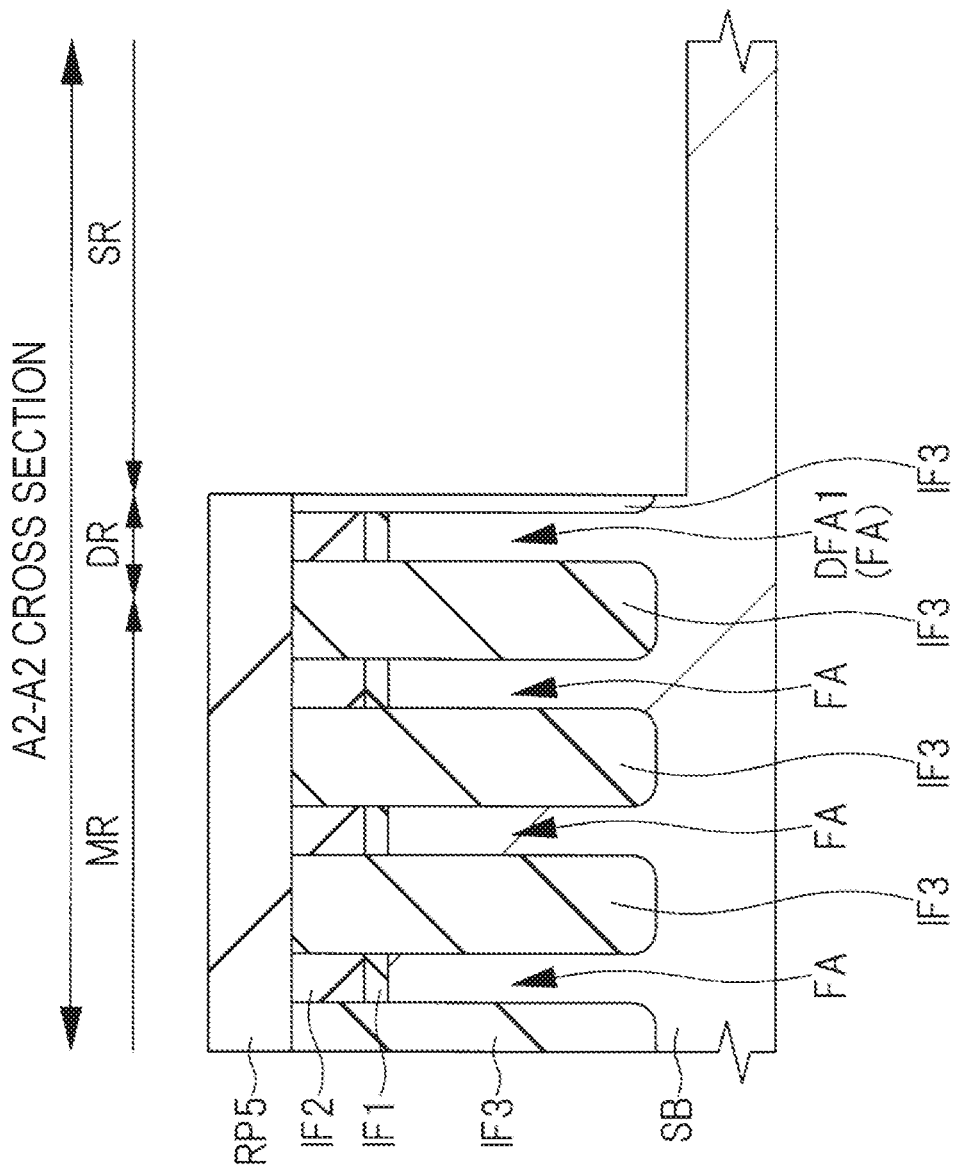
FIG. 43 is a cross-sectional view showing the manufacturing step of a semiconductor device according to a third modification.

FIG. 43 is a manufacturing step corresponding to FIG. 38 of the second embodiment. The insulating film IF3 and the dummy fins DFA2 formed in the shunt region SR are etched by anisotropic etching using the resist pattern RP5 as a mask. At this time, a part of the semiconductor substrate SB is also etched so that the dummy fins DFA2 are completely removed. Therefore, after the element isolation portions STI are formed, the position of the upper surface of the semiconductor substrate SB under the element isolation portion STI in the shunt region SR is lower than the position of the upper surface of the semiconductor substrate SB under the element isolation portion STI in the memory cell forming region MR.

The subsequent manufacturing steps are the same as the manufacturing steps of the second embodiment from FIG. 40 onward.

Even in the manufacturing method of such a third modification, substantially the same effects as those of second embodiment can be obtained.

Further, the second embodiment has an advantage that the manufacturing steps can be simplified because the etching is shorter than the etching of third modification. However, by completely removing the dummy fins DFA2 and increasing the depth of the element isolation portion STI as in the third modification, the breakdown voltage between the adjacent memory cells MC or between the flash memory circuit block C1 and other circuit blocks via the shunt region SR can be improved.

Although the invention made by the present inventor has been specifically described based on the embodiments, the present invention is not limited to the embodiments described above, and various modifications can be made without departing from the gist thereof.

For example, in the above embodiments, the shunt region SR is exemplified as a region in which the area of the element isolation portion STI is large, but the region in which the area of the element isolation portion STI is large may be, for example, the outer peripheral portion of the flash memory circuit block C1 or the EEPROM circuit block C2, that is, the end portion of the memory array formed of the plurality of memory cells MC. In other words, the region in which the area of the element isolation portion STI is large may be a region between the fin FA formed on the outermost periphery of the flash memory circuit block C1 or the EEPROM circuit block C2 and the fin FA formed on the outermost periphery of the other circuit blocks C3 to C6.

As a material of the gate dielectric film GF1, a high dielectric constant film (High-k film) may be used instead of a silicon oxide film. The high dielectric constant film is, for example, a metal oxide film, and is made of an insulating material having a dielectric constant higher than that of silicon oxide. As such a high dielectric constant film, for example, a hafnium oxide film, a zirconium oxide film, an aluminum oxide film, and a tantalum oxide film can be used.

Instead of the silicon nitride film, a metal oxide film such as a hafnium silicate film (HfSiO film) may be used as a material for forming the charge storage layer included in the gate dielectric film GF2.

In addition, some of the contents described in the above embodiments will be described below.

APPENDIX 1

A semiconductor device having a memory cell forming region, a shunt region and a dummy cell region located between the memory cell forming region and the shunt region includes:
an element isolation portion formed on an upper surface of a semiconductor substrate, and
a plurality of fins being a part of the semiconductor substrate, protruding from an upper surface of the element isolation portion, extending in a first direction in plan view and formed so as to be adjacent to each other in a second direction intersecting with the first direction,
the plurality of fins include a plurality of first fins formed in the memory cell forming region and a second fin formed in the dummy cell region,
the plurality of fins are formed so as to be at equal intervals to each other in the second direction, and
in a case that a position of the upper surface of the element isolation portion formed between the plurality of first fins adjacent to each other is H1, a position of the upper surface of the element isolation portion formed between the first fin closest to the second fin and the second fin is H2, and a position of the upper surface of the element isolation portion formed in the shunt region is H3, an absolute value of (H2−H1) is smaller than an absolute value of (H3−H2).

APPENDIX 2

The semiconductor device described in Appendix 1 further includes:
a first gate electrode straddling the plurality of fins via a first gate dielectric film including a charge storage layer and extending in the second direction so as to be located on the element isolation portion in the shunt region.

APPENDIX 3

In the semiconductor device described in Appendix 2,
a nonvolatile memory cell is formed on each of the plurality of first fins, and
a dummy element not serving as the nonvolatile memory cell is formed on the second fin.

APPENDIX 4

In the semiconductor device described in Appendix 3,
the plurality of fins protruding from the element isolation portion are not formed in the shunt region.

APPENDIX 5

The semiconductor device described in Appendix 4 further includes a plug formed on the first gate electrode in the shunt region, and
the plug is not formed on the first gate electrode in the memory cell forming region and the dummy cell region.

APPENDIX 6

In the semiconductor device described in Appendix 1,
a plurality of third fins lower in height than the plurality of fins formed in the memory cell forming region are formed in the shunt region, and
an upper surface of each of the plurality of third fins is covered with the element isolation portion.

APPENDIX 7

In the semiconductor device described in Appendix 1,
a position of the upper surface of the semiconductor substrate under the element isolation portion in the shunt region is lower than a position of the upper surface of the semiconductor substrate under the element isolation portion in the memory cell forming region.

APPENDIX 8

In the semiconductor device described in Appendix 1,
the element isolation portion includes a silicon oxide film.

What is claimed is:
1. A method for manufacturing a semiconductor device comprising:
(a) forming a first fin, a second fin, a third fin and a fourth fin extending in a first direction in plan view and arranged in order and in a second direction intersecting with the first direction on a semiconductor substrate, the first and second fins being used as a channel forming region and source and drain regions of an active transistor, the third and fourth fins being used as a dummy fin of a dummy element;
(b) forming a first insulating film on the first to fourth fins to embed each space between the first to fourth fins; and
(c) after the (b), performing an etching to the first insulating film such that a position an upper surface of the first insulating film is lower than positions of upper surfaces of the first to fourth fin,
wherein the (c) is performed in a state that a distance between the second fin and the third fin in the second direction is shorter than a distance between the first fin and the second fin in the second direction, and a distance between the third fin and the fourth fin in the second direction is longer than the distance between the first fin and the second fin in the second direction.

2. The method according to claim 1, wherein in a case that a position of the upper surface of the first insulating film formed between the first fin and the second fin is H1, a position of the upper surface of the first insulating film formed between the second fin and the third fin is H2, and a position of the upper surface of the first insulating film formed between the third fin and the fourth fin is H3, an absolute value of (H2−H1) is smaller than an absolute value of (H3−H2).

3. The method according to claim 1, wherein the (a) includes:
(a1) forming a plurality of mask patterns on an upper surface of the semiconductor substrate;
(a2) forming a hard mask material made of a material different from the plurality of mask patterns on the semiconductor substrate so as to cover the plurality of mask patterns;
(a3) by performing an anisotropic etching treatment to the hard mask material, forming a plurality of hard masks made of the hard mask material on side surfaces of each of the plurality of mask patterns;
(a4) after the (a3), removing the plurality of mask patterns; and
(a5) after the (a4), forming the first fin, the second fin, the third fin and the fourth fin by etching a part of the upper surface of the semiconductor substrate using the plurality of hard masks as a mask.

4. The method according to claim 3,
wherein the plurality of mask patterns have a first mask pattern and a second mask pattern whose length in the second direction is shorter than the first mask pattern, and
wherein in the second direction, the hard mask for forming the second fin is formed on one side surface of the second mask pattern, and the hard mask for forming the third fin is formed on the other side surface of the second mask pattern.

5. The method according to claim 3,
wherein the plurality of mask patterns have a first mask pattern and a second mask pattern adjacent to each other,
wherein in the second direction, a distance between the first mask pattern and the second mask pattern is shorter than a distance between the plurality of other mask patterns adjacent to each other,
wherein the hard mask for forming the second fin is formed on a side surface of two side surfaces of the first mask pattern in the second direction closer to the second mask pattern, and wherein the hard mask for forming the third fin is formed on a side surface of two side surfaces of the second mask pattern in the second direction closer to the first mask pattern.

6. The method according to claim 1, wherein the (c) includes:
(c1) polishing the first insulating film; and
(c2) after the (c1), exposing upper portions of the first fin, the second fin, the third fin and the fourth fin from the first insulating film by performing an anisotropic etching treatment to the first insulating film.

7. The method according to claim 6, further comprising:
(d) between the (b) and the (c), performing a heat treatment to the first insulating film,
wherein in the (c2), film quality of the first insulating film formed between the first fin and the second fin is softer than film quality of the first insulating film formed between the second fin and the third fin, and the film quality of the first insulating film formed between the second fin and the third fin is softer than film quality of the first insulating film formed between the third fin and the fourth fin.

8. A semiconductor device comprising:
a first fin, a second fin, a third fin and a fourth fin formed on a semiconductor substrate, extending in a first direction in plan view and arranged in a second direction intersecting with the first direction;
a first element isolation portion formed between the first fin and the second fin;
a second element isolation portion formed between the second fin and the third fin;
a third element isolation portion formed between the third fin and the fourth fin; and
a first gate electrode extending in the second direction and straddling the first fin, the second fin and the third fin via a first gate dielectric film including a charge storage layer so as to be located on an upper surface of the element isolation portion formed between the third fin and the fourth fin,
wherein a distance between the first fin and the second fin is shorter than a distance between the third fin and the fourth fin and longer than a distance between the second fin and the third fin,
wherein a position of an upper surface of the first element isolation portion and a position of an upper surface of the second element isolation portion are lower than a position of an upper surface of the third element isolation portion,
wherein a plug is formed on the first gate electrode in a region between the third fin and the fourth fin
wherein a nonvolatile memory cell is formed on each of the first fin and the second fin, and
wherein a dummy element not serving as the nonvolatile memory cell is formed on the third fin.

9. The semiconductor device according to claim 8, wherein in a case that the position of the upper surface of the first element isolation portion is H1, the position of the upper surface of the second element isolation portion is H2, and the position of the upper surface of the third element isolation portion is H3, an absolute value of (H2−H1) is smaller than an absolute value of (H3−H2).

10. The semiconductor device according to claim 8,
wherein the first fin, the second fin and the third fin are provided in a first circuit block, and
wherein the fourth fin is provided in a second circuit block used for application different from the first circuit block.

11. The semiconductor device according to claim 8, wherein the first element isolation portion, the second element isolation portion and the third element isolation portion include silicon oxide films.

\* \* \* \* \*